(12) United States Patent
Maejima et al.

(10) Patent No.: US 12,159,684 B2
(45) Date of Patent: Dec. 3, 2024

(54) MEMORY DEVICE WITH MEMORY PILLAR INSIDE CONDUCTOR

(71) Applicant: Kioxia Corporation, Tokyo (JP)

(72) Inventors: Hiroshi Maejima, Tokyo (JP); Toshifumi Hashimoto, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 172 days.

(21) Appl. No.: 17/807,802

(22) Filed: Jun. 20, 2022

(65) Prior Publication Data

US 2023/0307016 A1    Sep. 28, 2023

(30) Foreign Application Priority Data

Mar. 23, 2022    (JP) .................... 2022-047429

(51) Int. Cl.
| | | |
|---|---|---|
| *G11C 7/10* | (2006.01) | |
| *G11C 7/08* | (2006.01) | |
| *G11C 16/16* | (2006.01) | |

(52) U.S. Cl.
CPC .............. *G11C 7/1039* (2013.01); *G11C 7/08* (2013.01); *G11C 7/1063* (2013.01); *G11C 7/109* (2013.01); *G11C 16/16* (2013.01)

(58) Field of Classification Search
CPC ....... G11C 7/1039; G11C 7/08; G11C 7/1063; G11C 7/109; G11C 16/16; G11C 16/0483; G11C 16/26; G11C 5/025; H10B 43/27; H10B 43/50
See application file for complete search history.

(56) References Cited

U.S. PATENT DOCUMENTS

| | | | | |
|---|---|---|---|---|
| 11,682,443 B2 * | 6/2023 | Sakui | ................. | G11C 14/0018 |
| | | | | 365/184 |
| 2004/0015643 A1 * | 1/2004 | Torrisi | .................... | G11C 11/22 |
| | | | | 711/2 |
| 2021/0118862 A1 | 4/2021 | Maejima et al. | | |

FOREIGN PATENT DOCUMENTS

JP    2021-64731 A    4/2021

* cited by examiner

*Primary Examiner* — Sultana Begum
(74) *Attorney, Agent, or Firm* — Oblon, McClelland, Maier & Neustadt, L.L.P.

(57) ABSTRACT

A first conductor extends along first and second axes. A first memory pillar is provided in the first conductor and includes a first semiconductor and a charge accumulation layer. A second conductor extends along the second axis and is in contact with the first memory pillar. A third conductor extends along the first and second axes and is arranged with a distance from the first conductor along the second axis. A second memory pillar is provided in the third conductor and includes a second semiconductor and a charge accumulation layer. The fourth conductor extends along the second axis and is in contact with the second memory pillar. The fifth conductor extends along the second axis and is coupled to the first and second memory pillars.

18 Claims, 53 Drawing Sheets

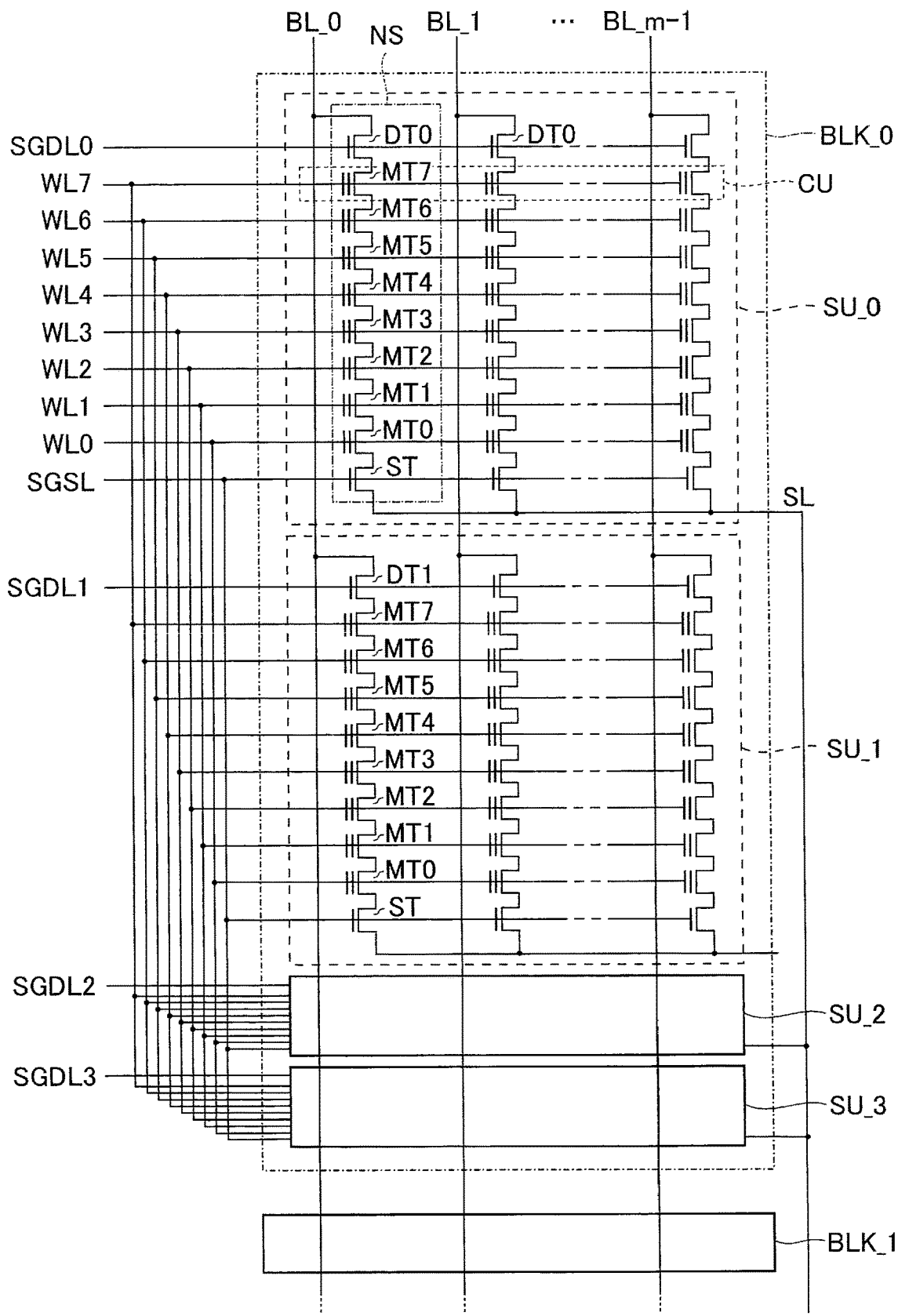
F I G. 2

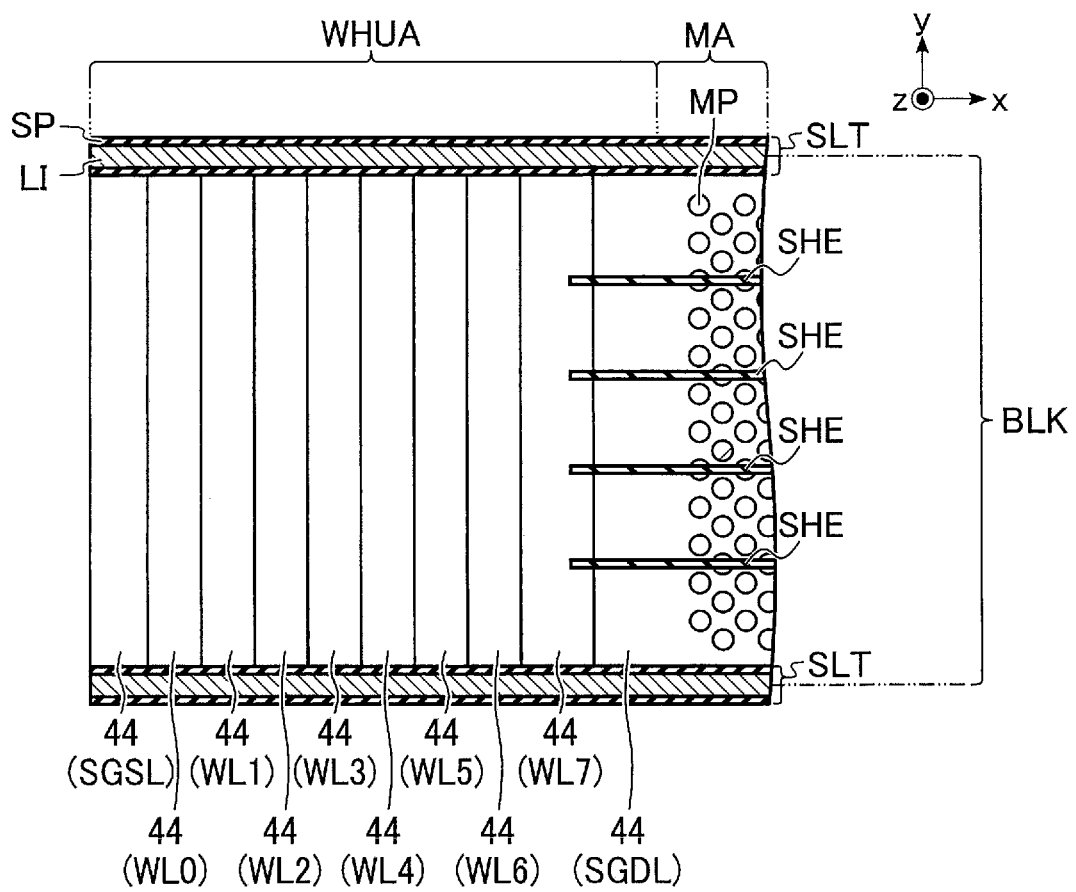
F I G. 11

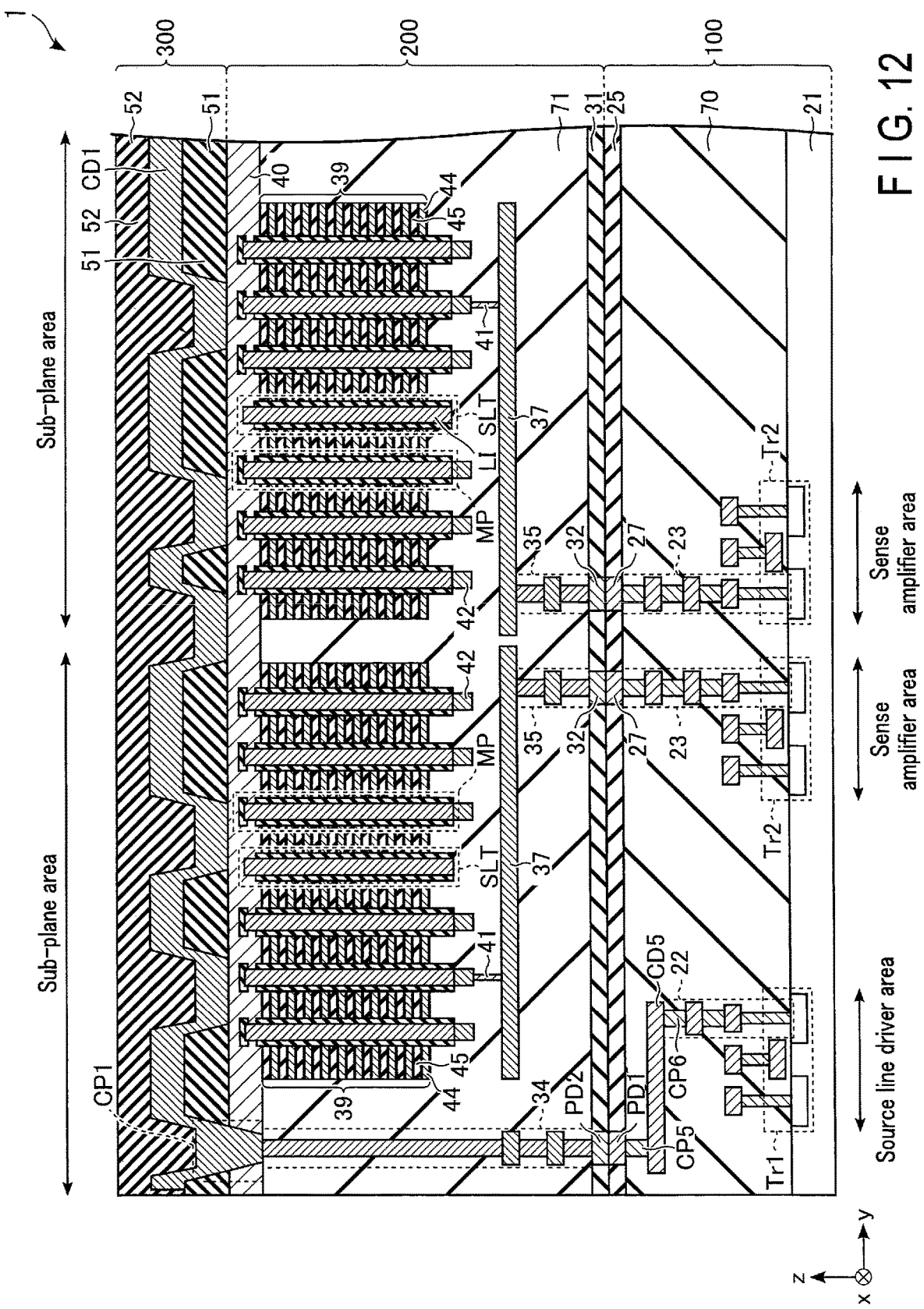
F I G. 12

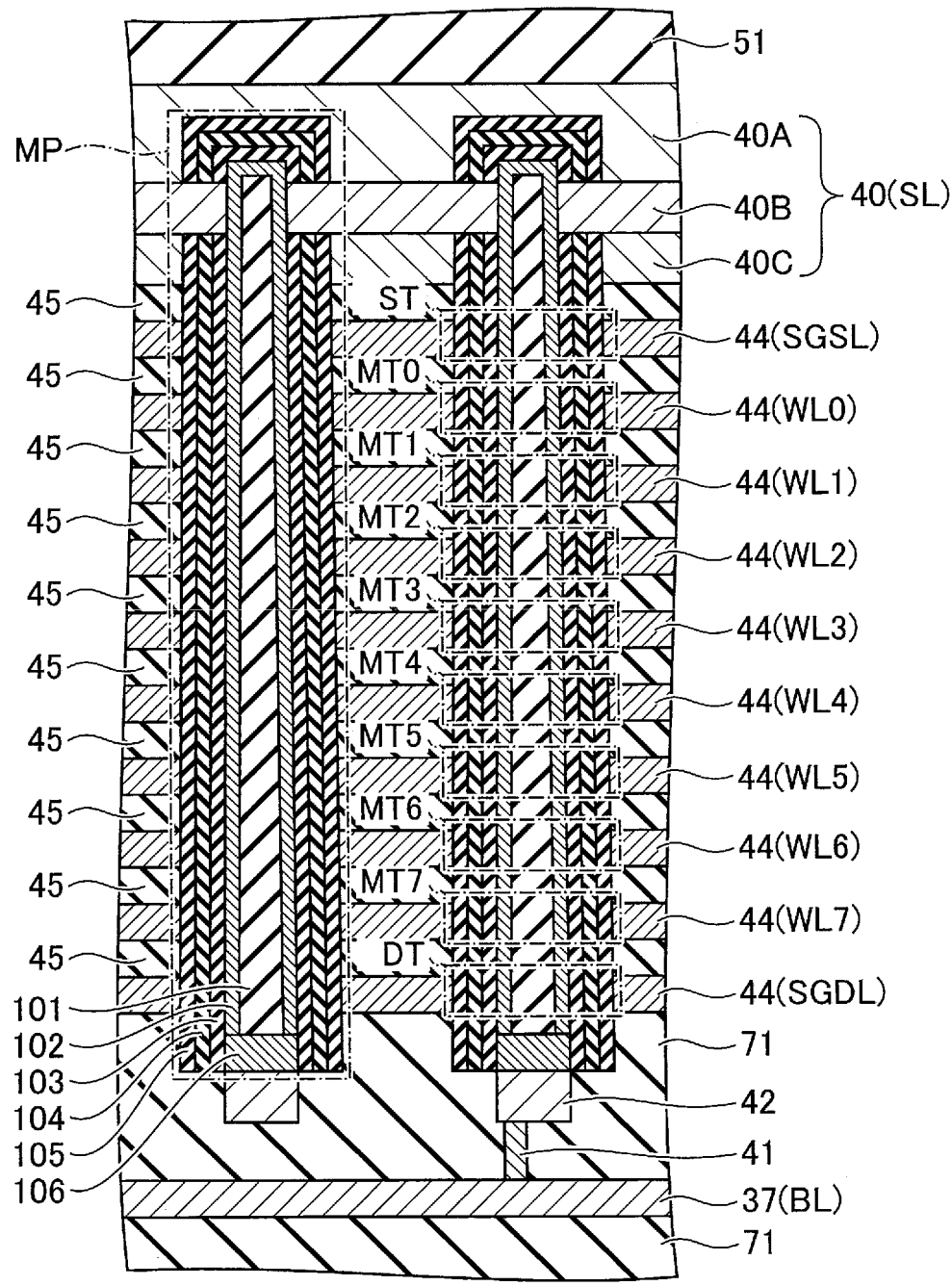
F I G. 16

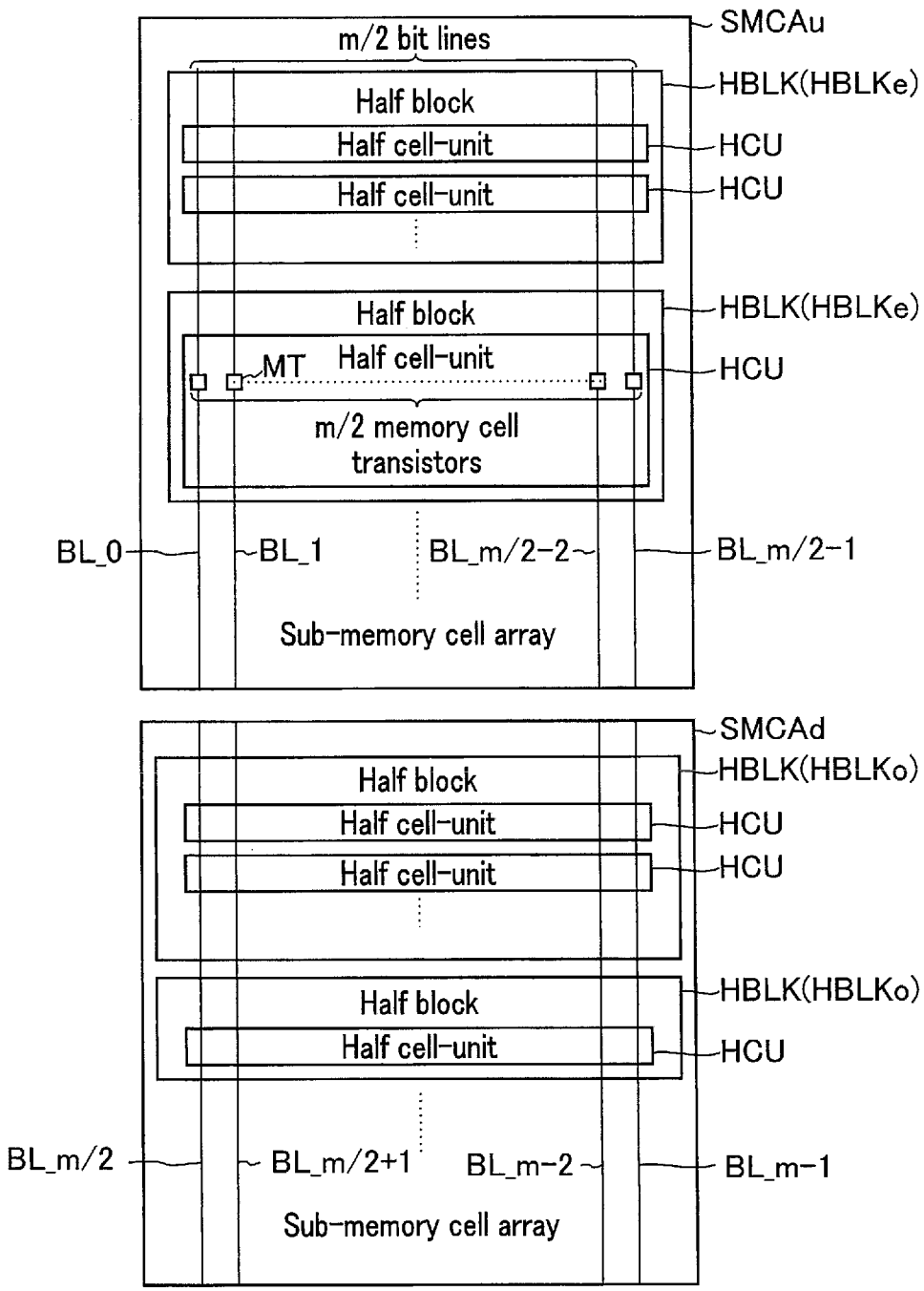
F I G. 18

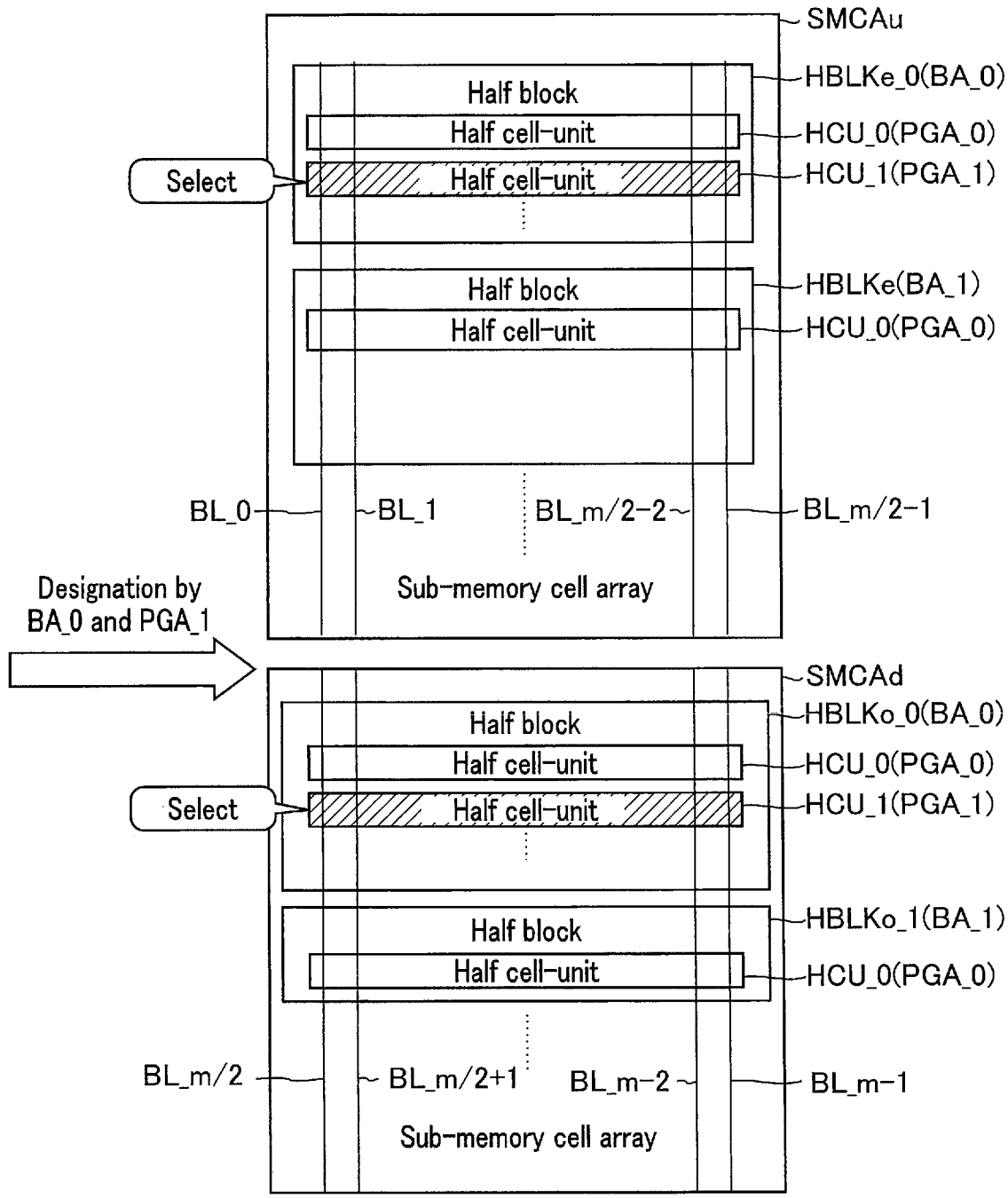
F I G. 19

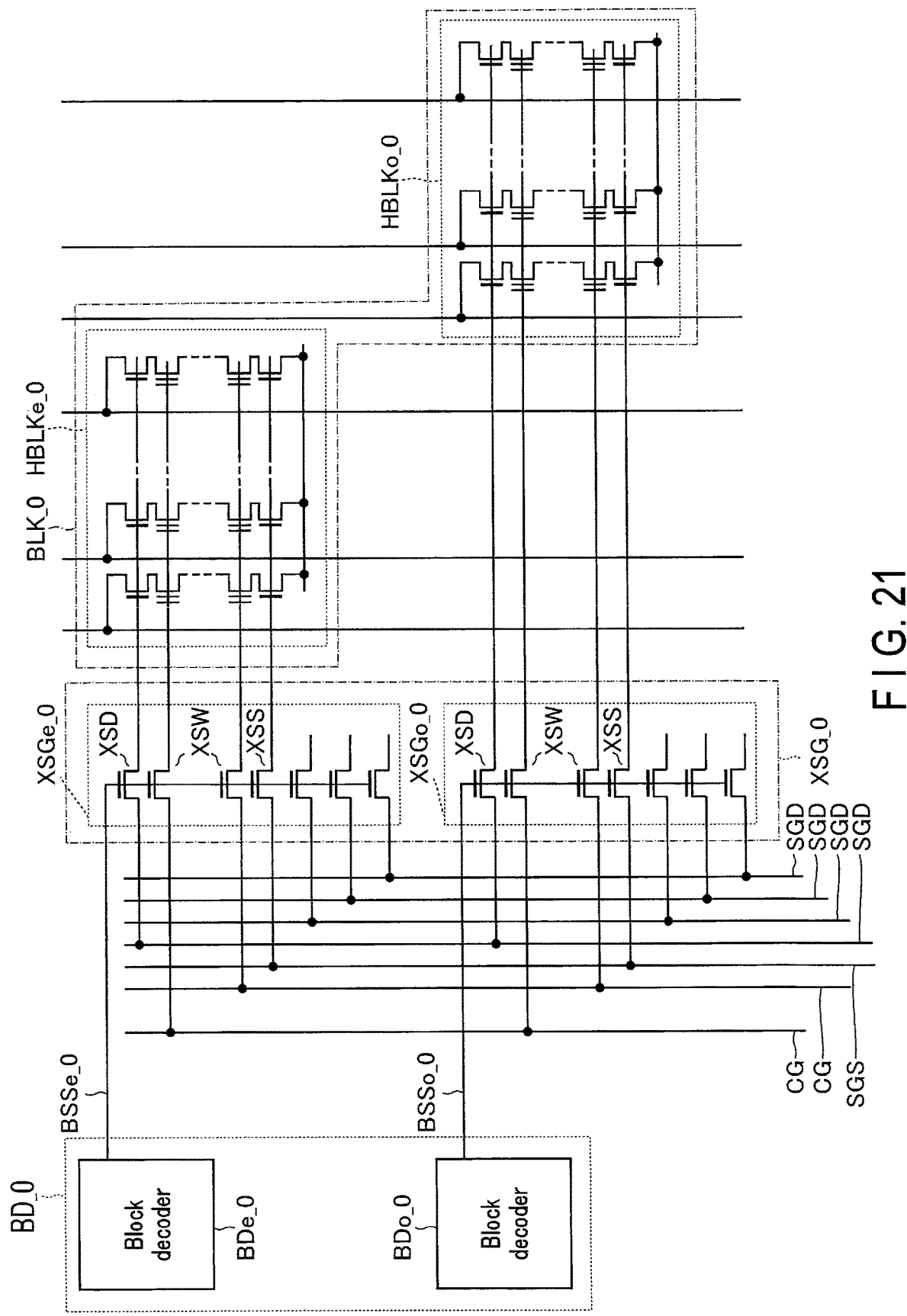
F I G. 21

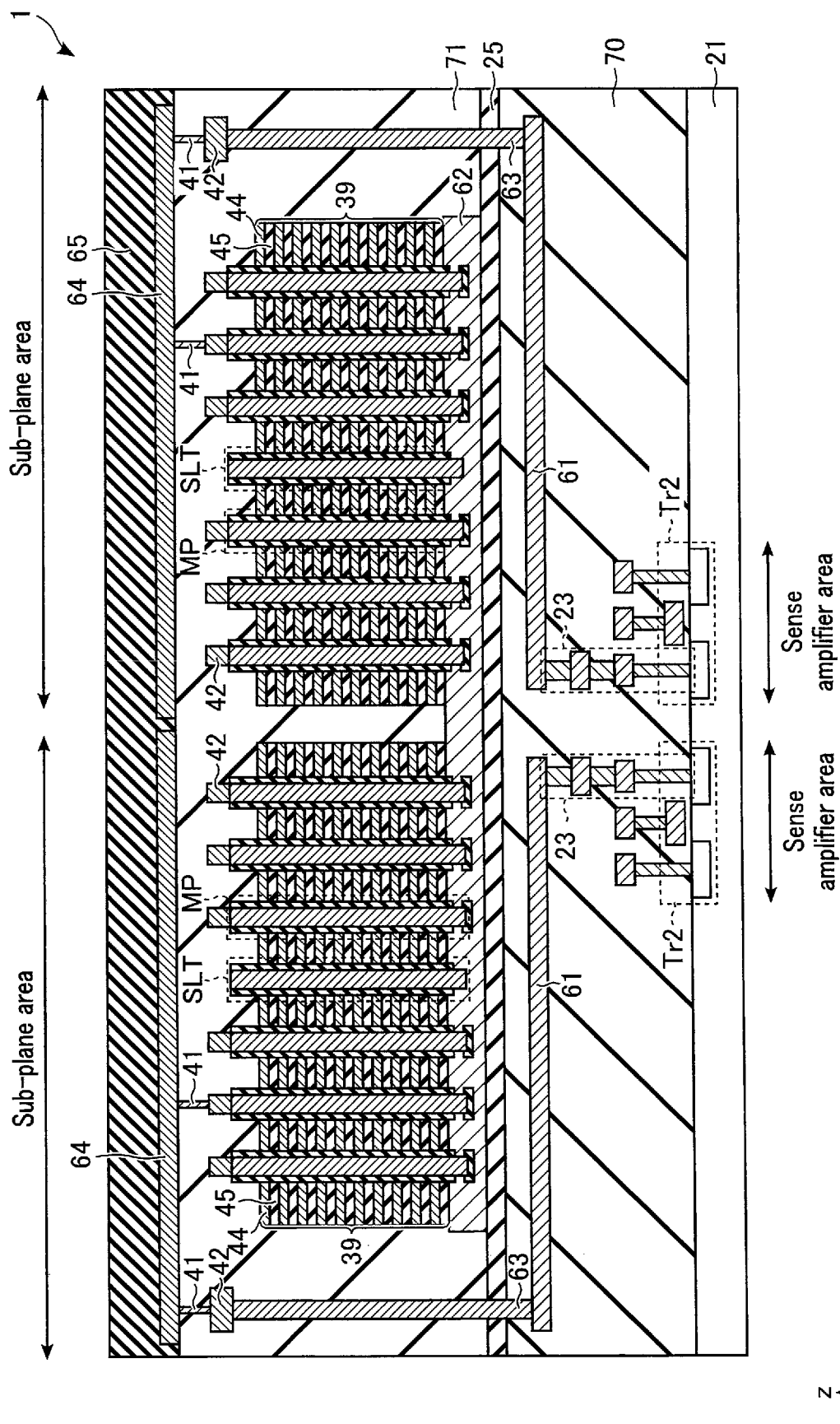
F I G. 26

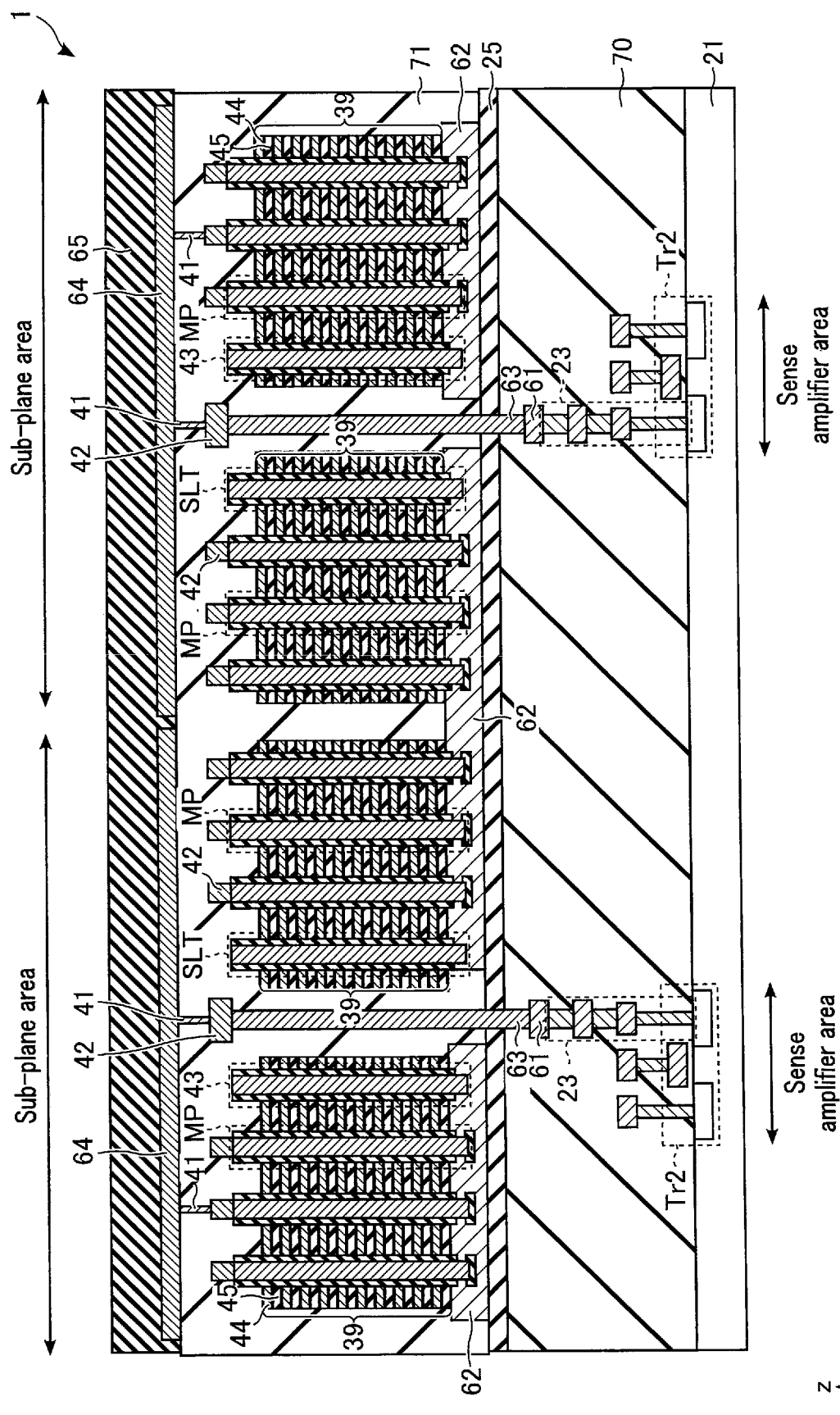
F I G. 33

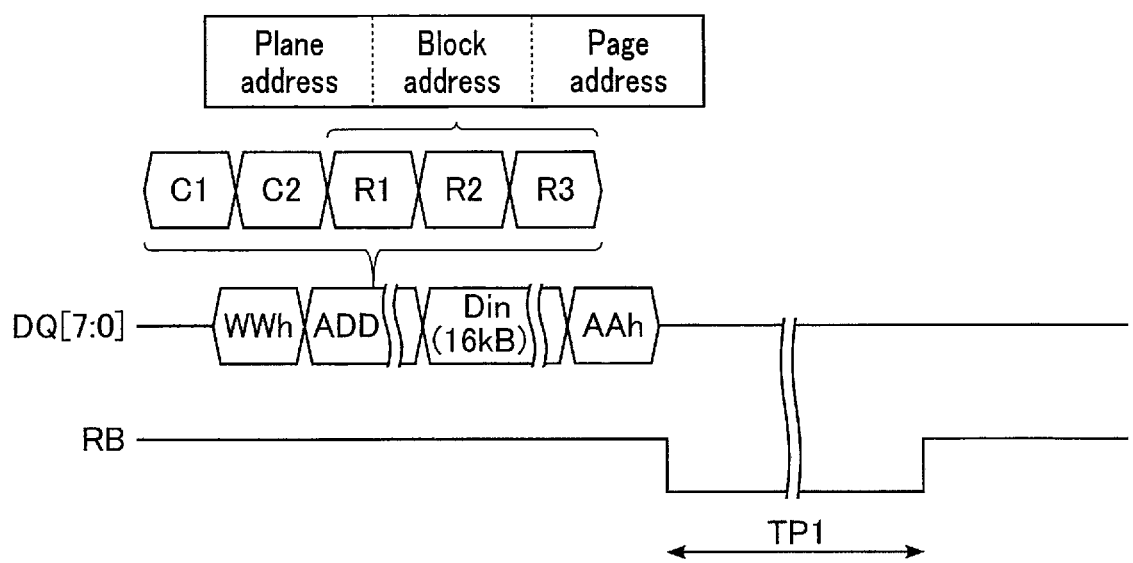
F I G. 34

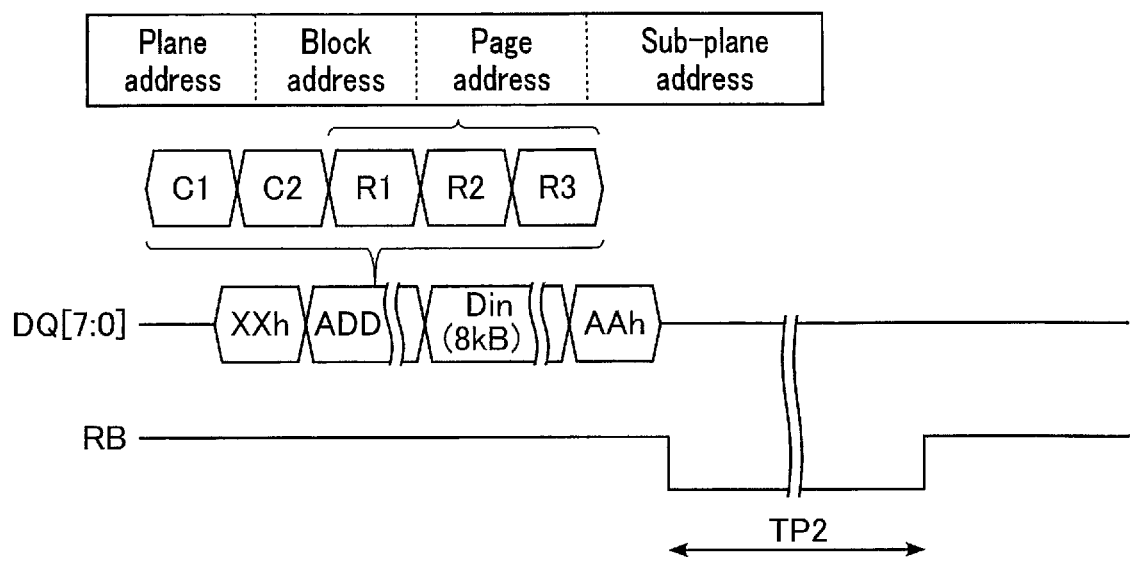
F I G. 35

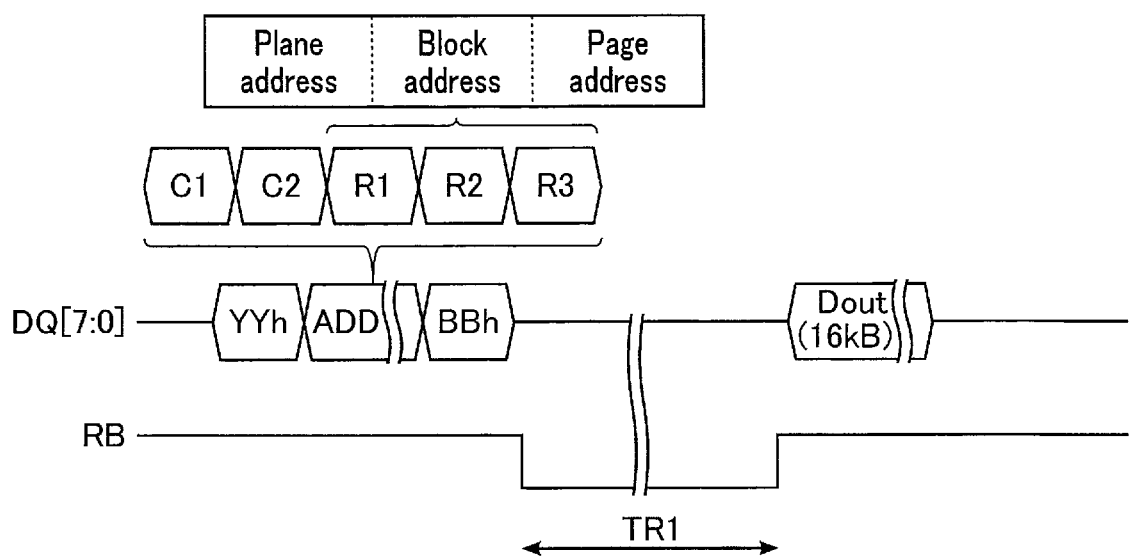
F I G. 36

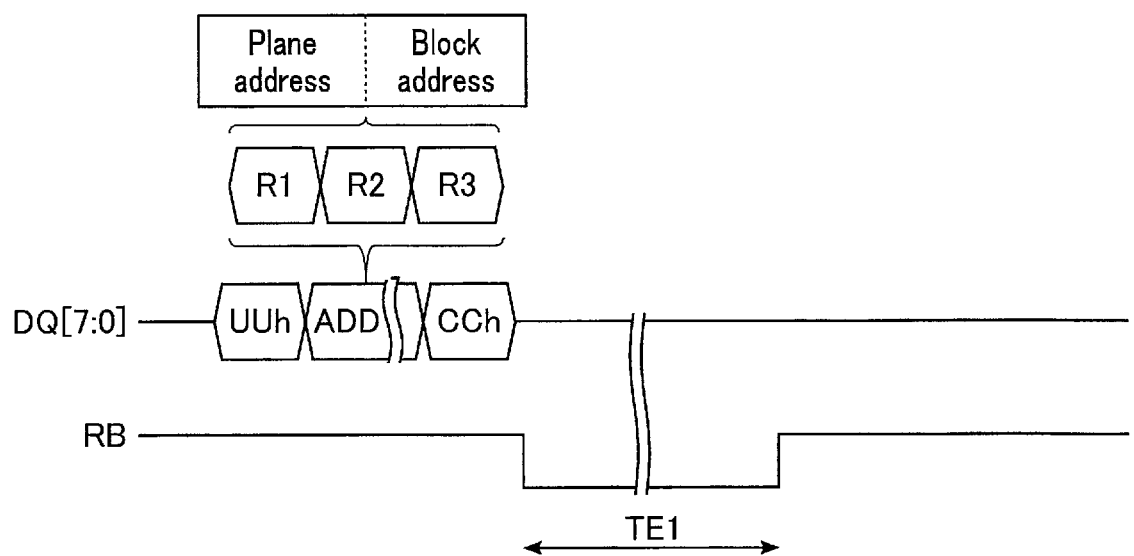
F I G. 38

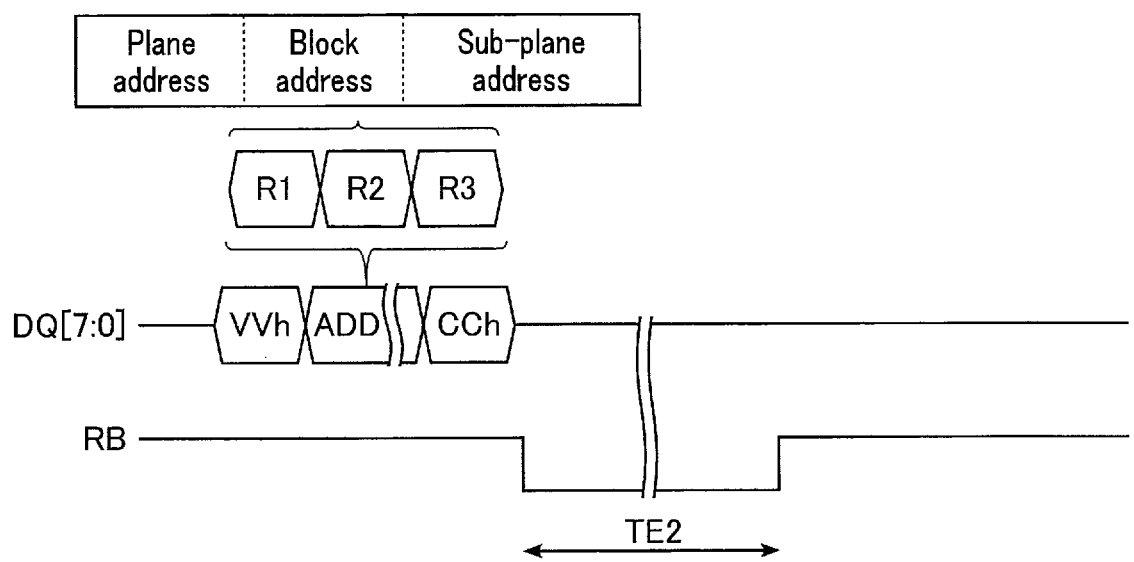
F I G. 39

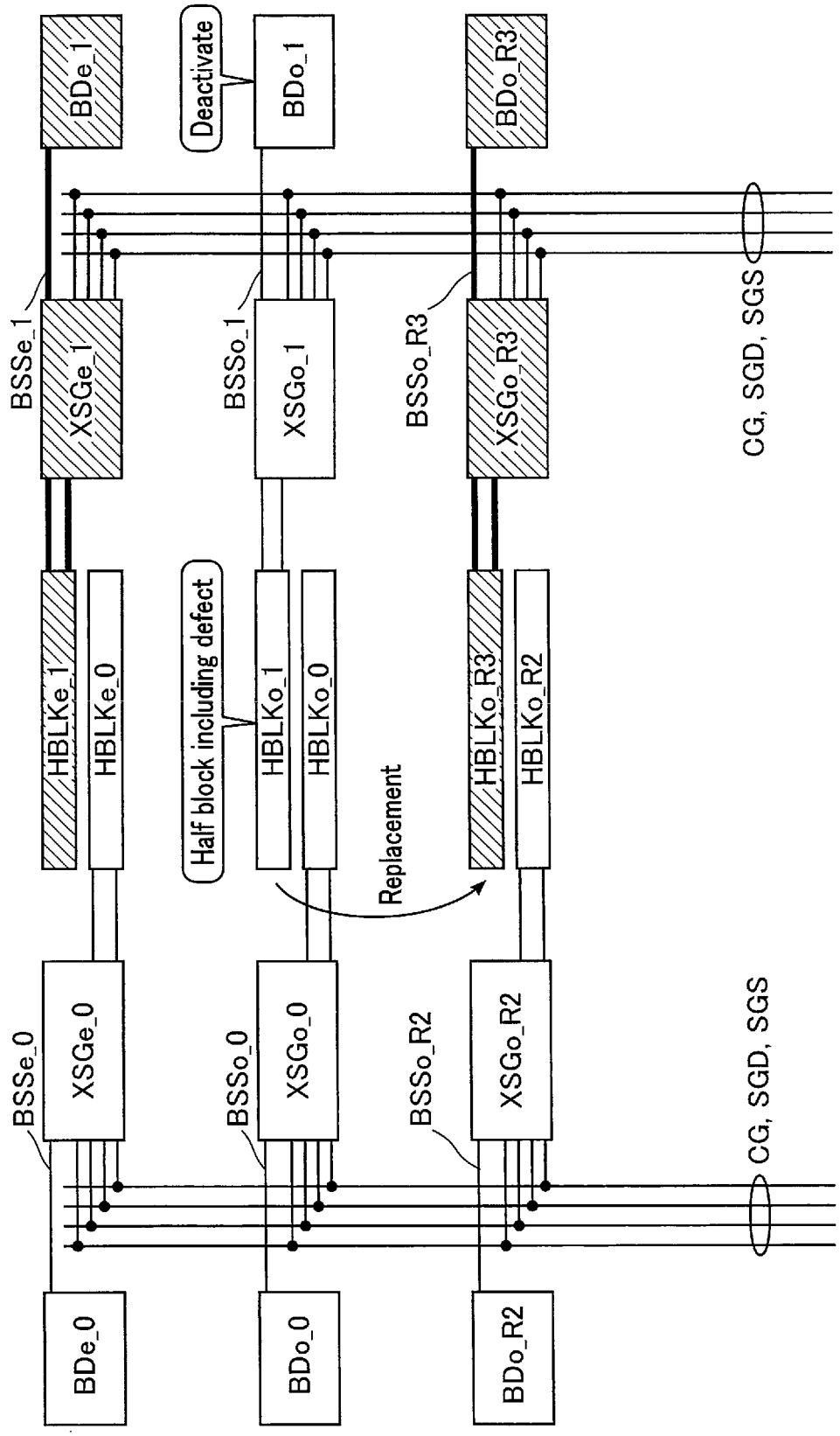
F I G. 41

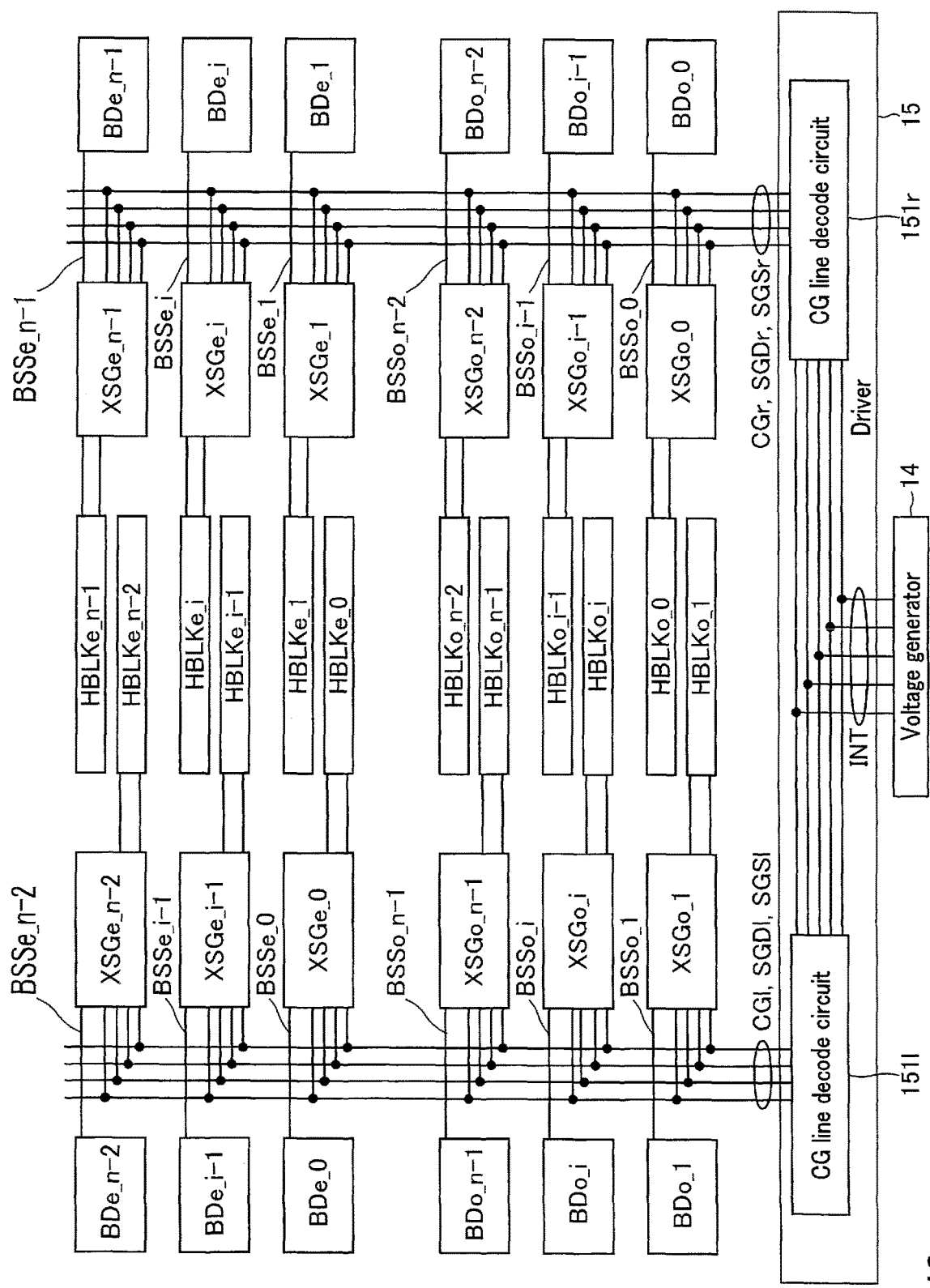
F I G. 43

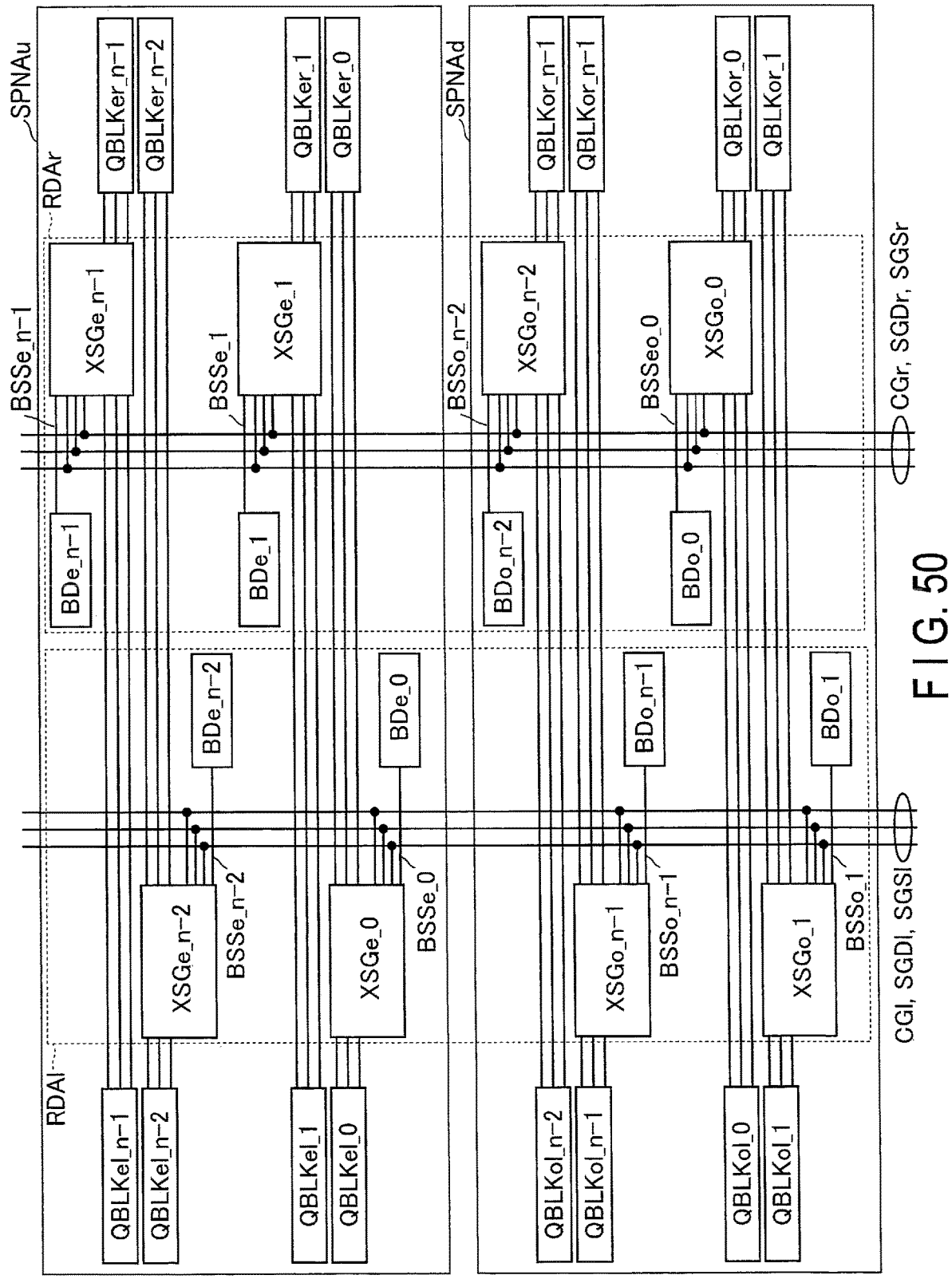
F I G. 50

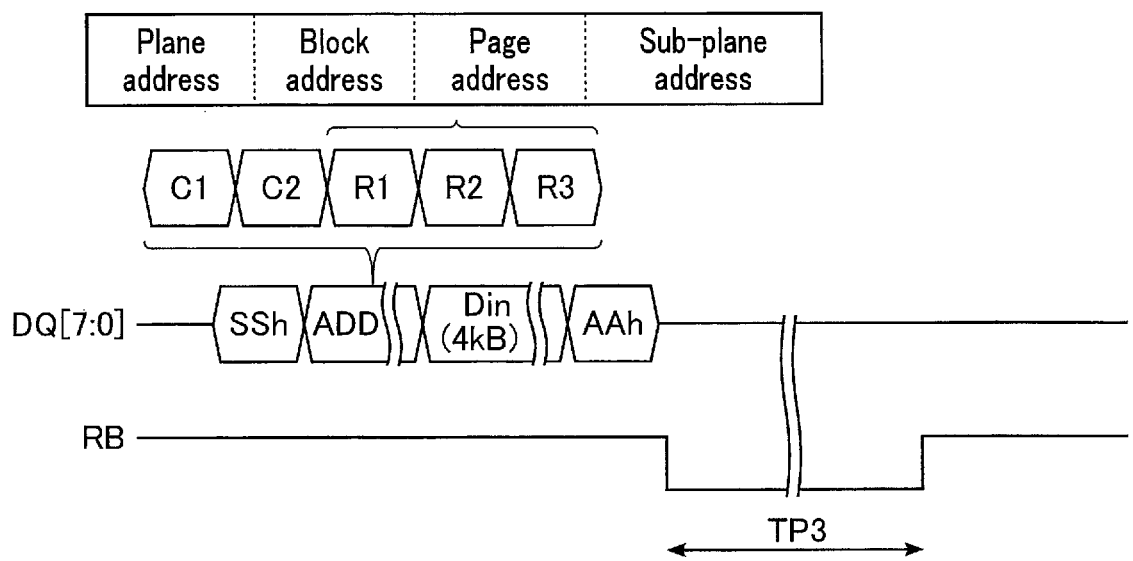
F I G. 51

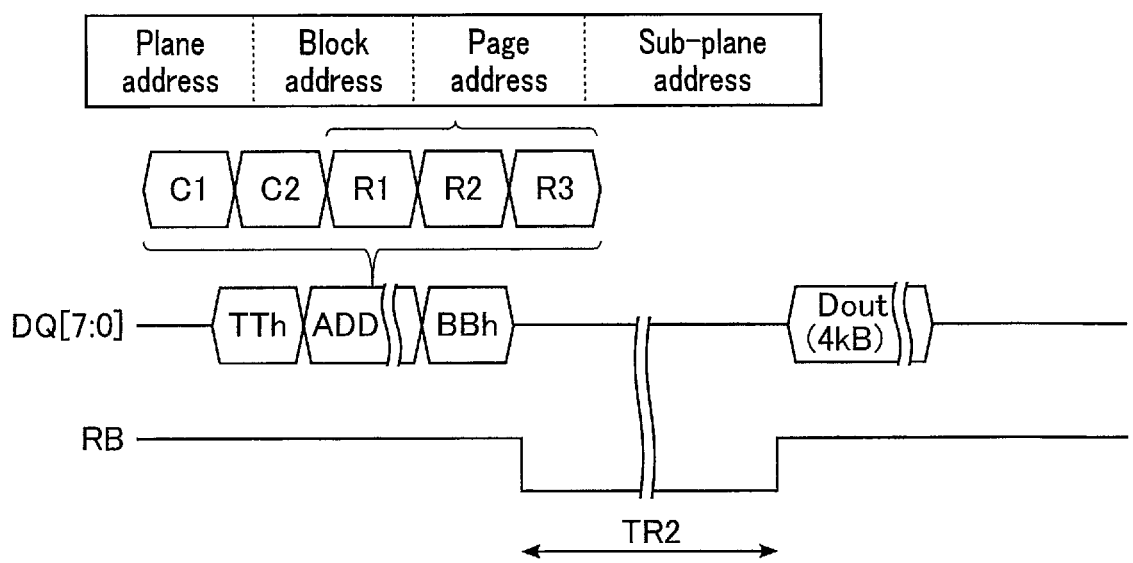
F I G. 52

MEMORY DEVICE WITH MEMORY PILLAR INSIDE CONDUCTOR

CROSS-REFERENCE TO RELATED APPLICATIONS

This application is based upon and claims the benefit of priority from Japanese Patent Application No. 2022-47429, filed Mar. 23, 2022, the entire contents of which are incorporated herein by reference.

FIELD

Embodiments described herein relate generally to a memory device.

BACKGROUND

A memory device including three-dimensionally arranged memory cells is known. The memory device is required to operate at high speed.

BRIEF DESCRIPTION OF THE DRAWINGS

FIG. 2 illustrates components of one block of the memory device of the first embodiment, and a coupling of the components.

Each of FIG. 6 to FIG. 10 illustrates a layout of a part of, and some components of, the memory device of the first embodiment.

FIG. 11 illustrates a planar layout of a part of a memory cell array of the memory device of the first embodiment.

Figure 13:
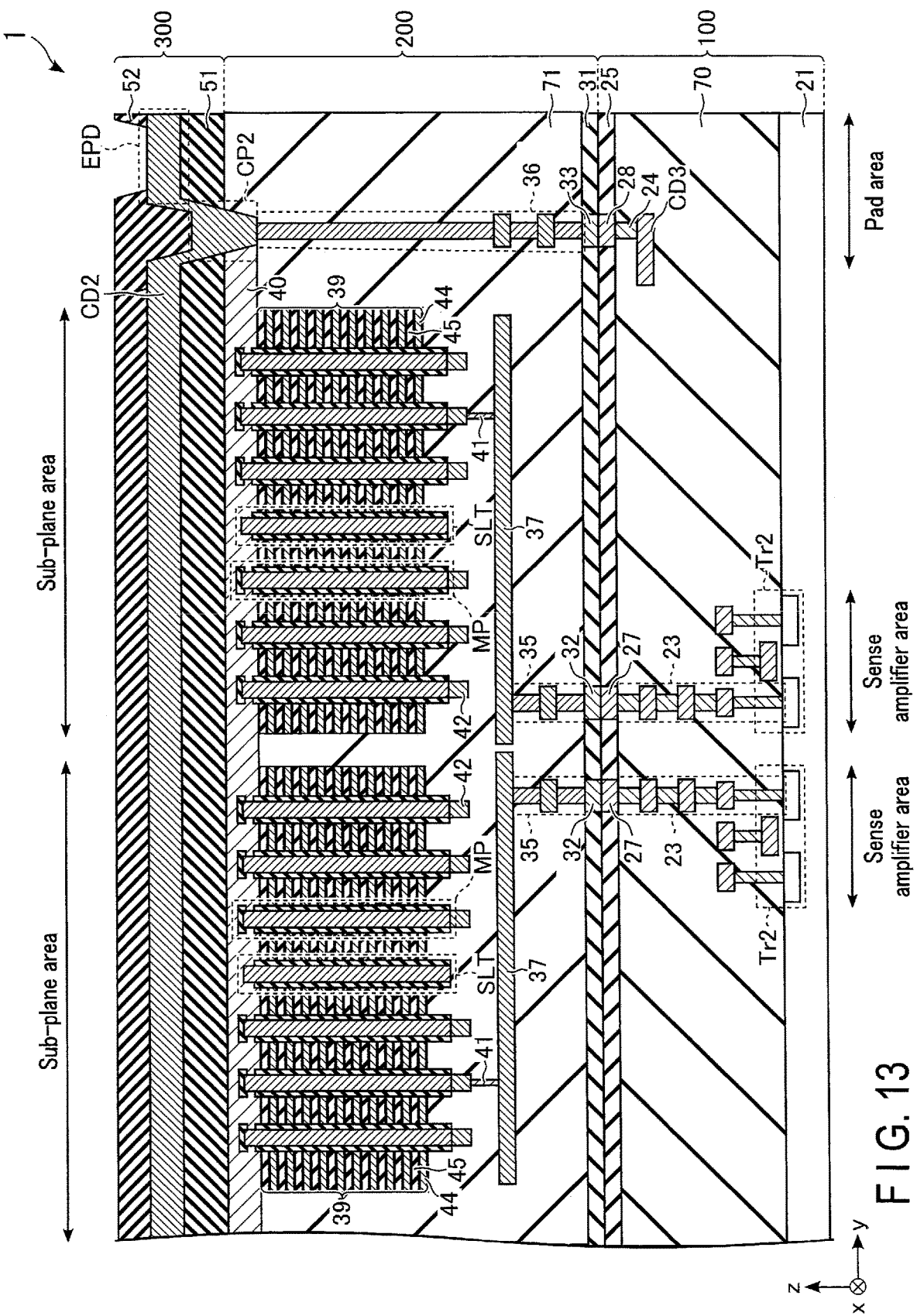
Figure 14:
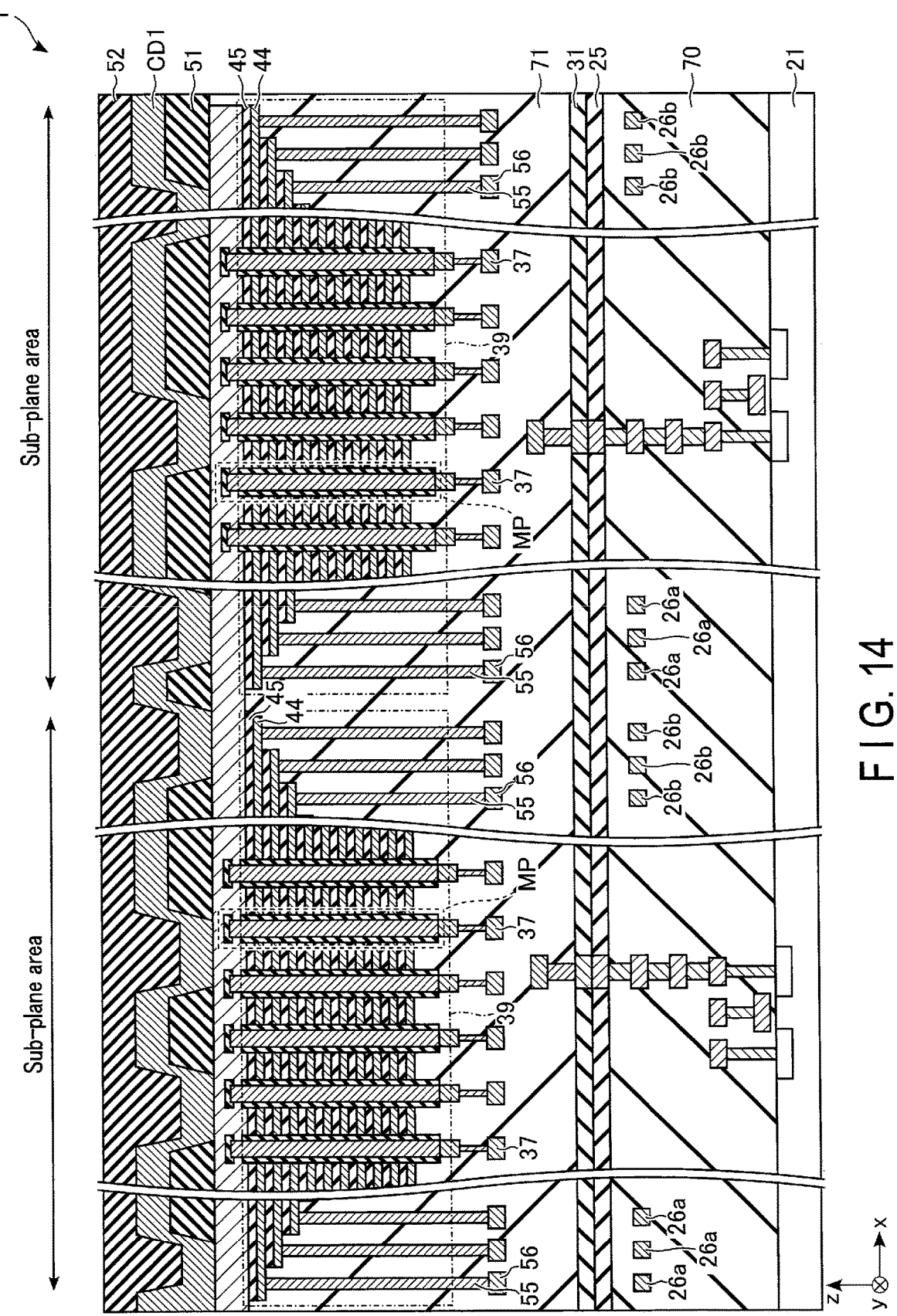

Each of FIG. 12 to FIG. 14 illustrates a cross-sectional structure of a part of the memory device of the first embodiment.

Figure 15:
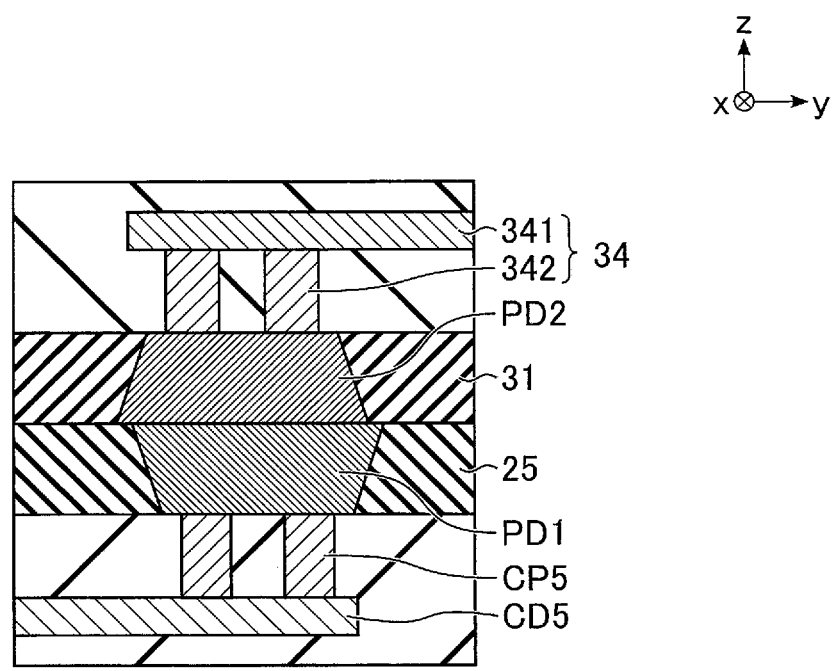

FIG. 15 illustrates an example of a detailed cross-sectional structure of a part of the memory device of the first embodiment.

FIG. 16 illustrates a cross-sectional structure of the memory cell array of the memory device of the first embodiment.

Figure 17:
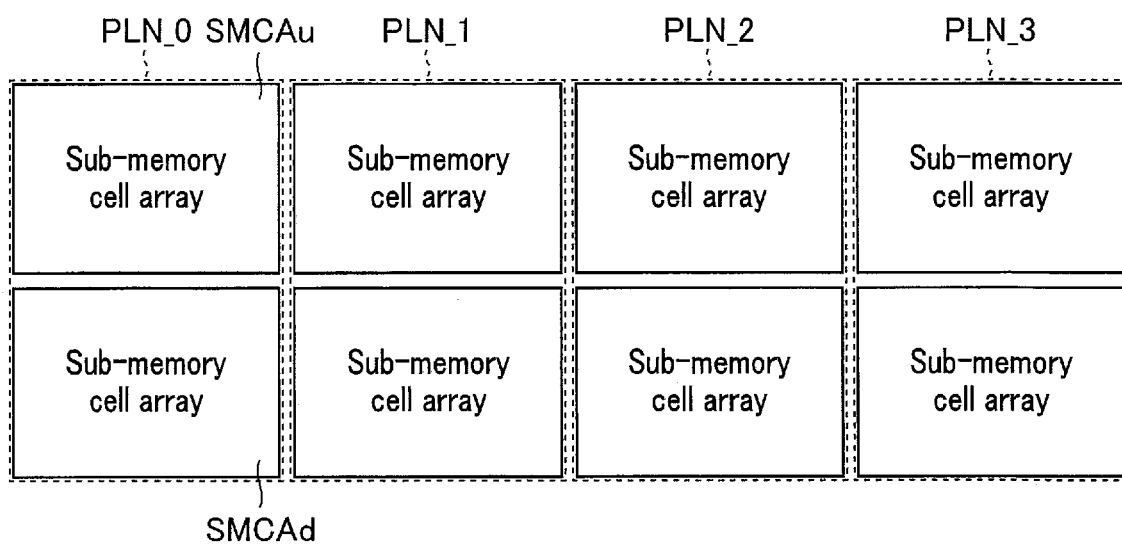

FIG. 17 illustrates an example of components of the memory device of the first embodiment, and allocation of addresses to the components.

FIG. 18 illustrates an example of components in the memory cell array of the memory device of the first embodiment, and allocation of addresses to the components.

FIG. 19 illustrates an example of selection of components in the memory cell array of the memory device of the first embodiment.

Figure 20:
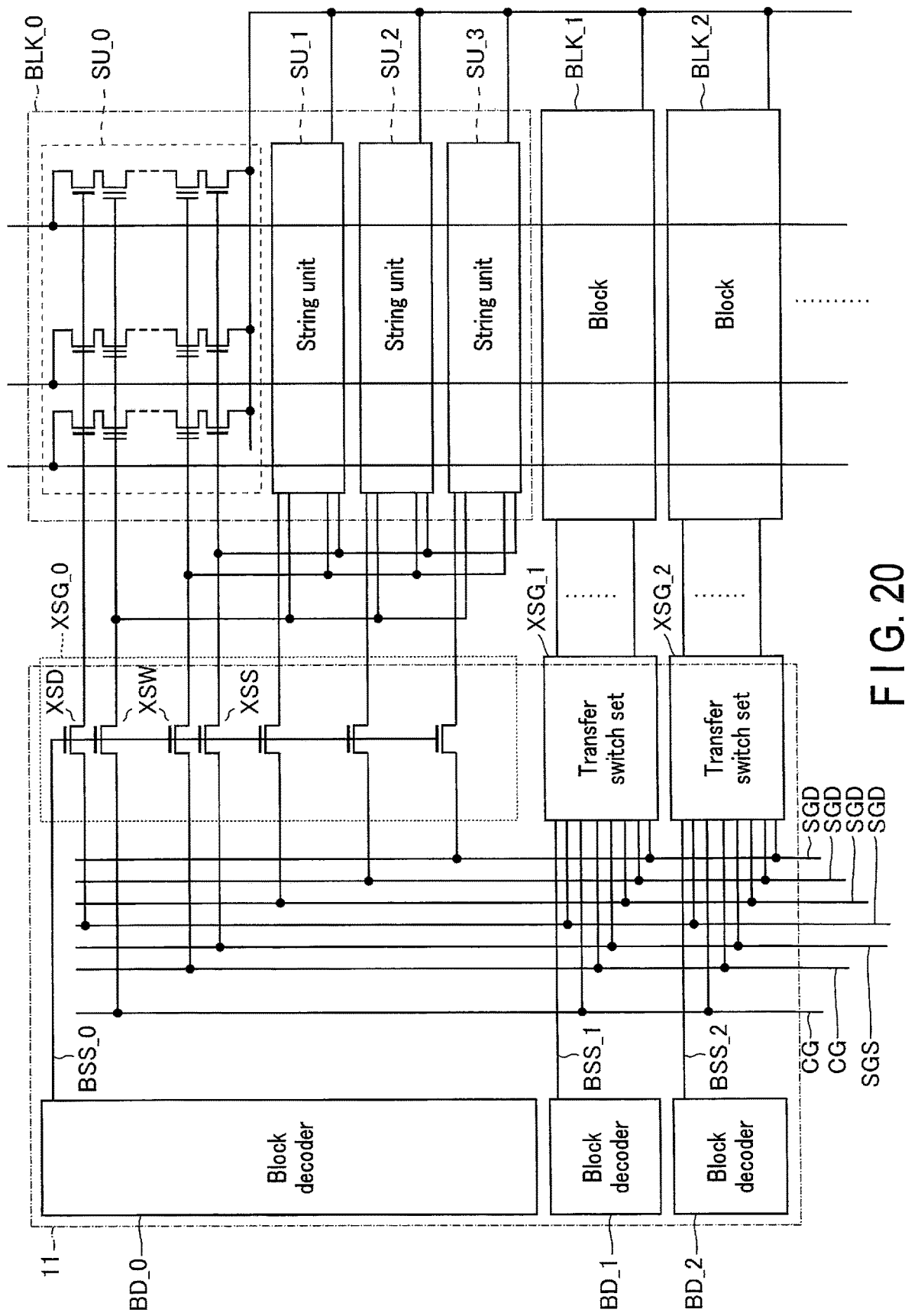

FIG. 20 illustrates components of a row decoder of the memory device of the first embodiment, and a coupling of the components.

FIG. 21 illustrates in greater detail the components of the row decoder of the memory device of the first embodiment, and the coupling of the components.

Figure 22:
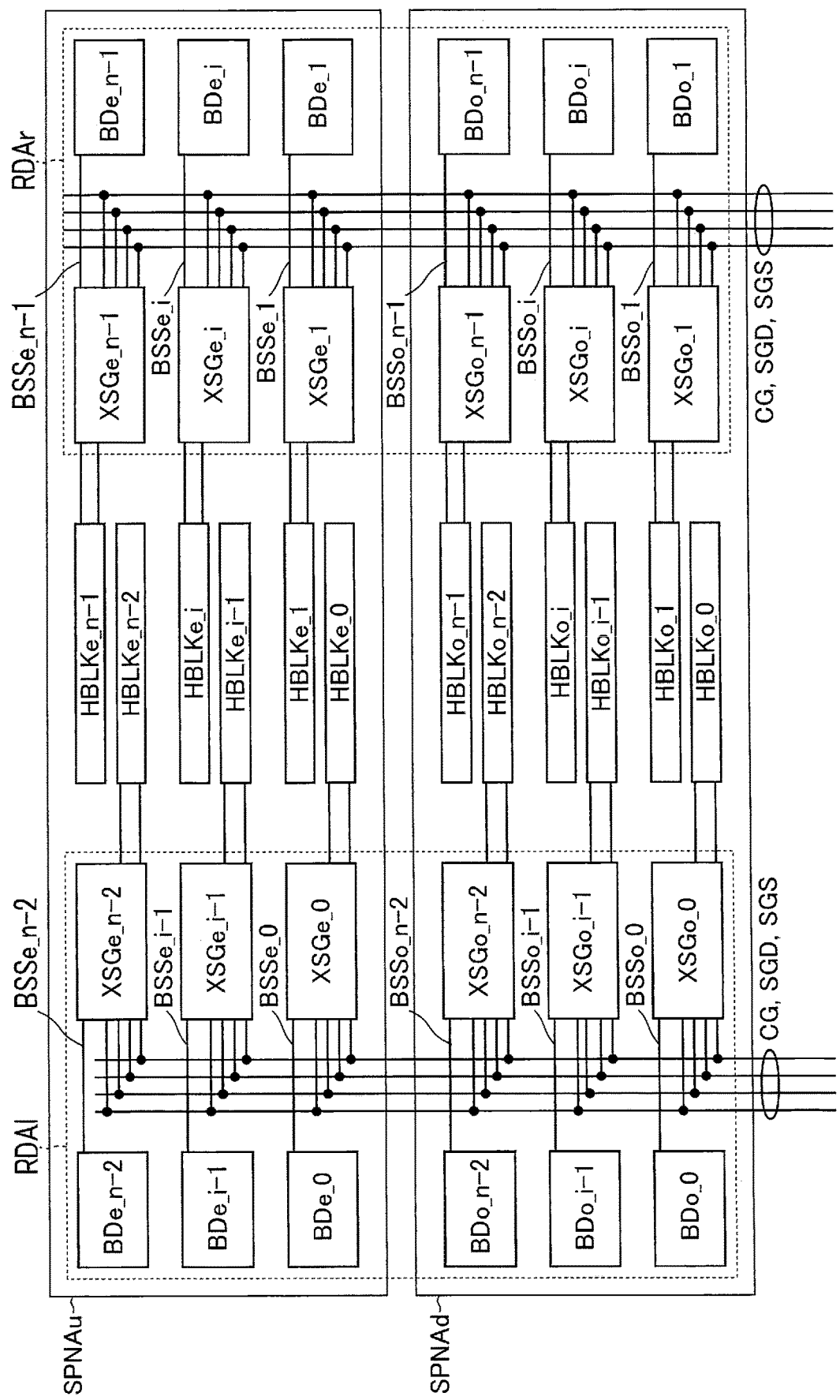

FIG. 22 illustrates the components of the row decoder of the memory device of the first embodiment, and the coupling of the components.

Figure 23:
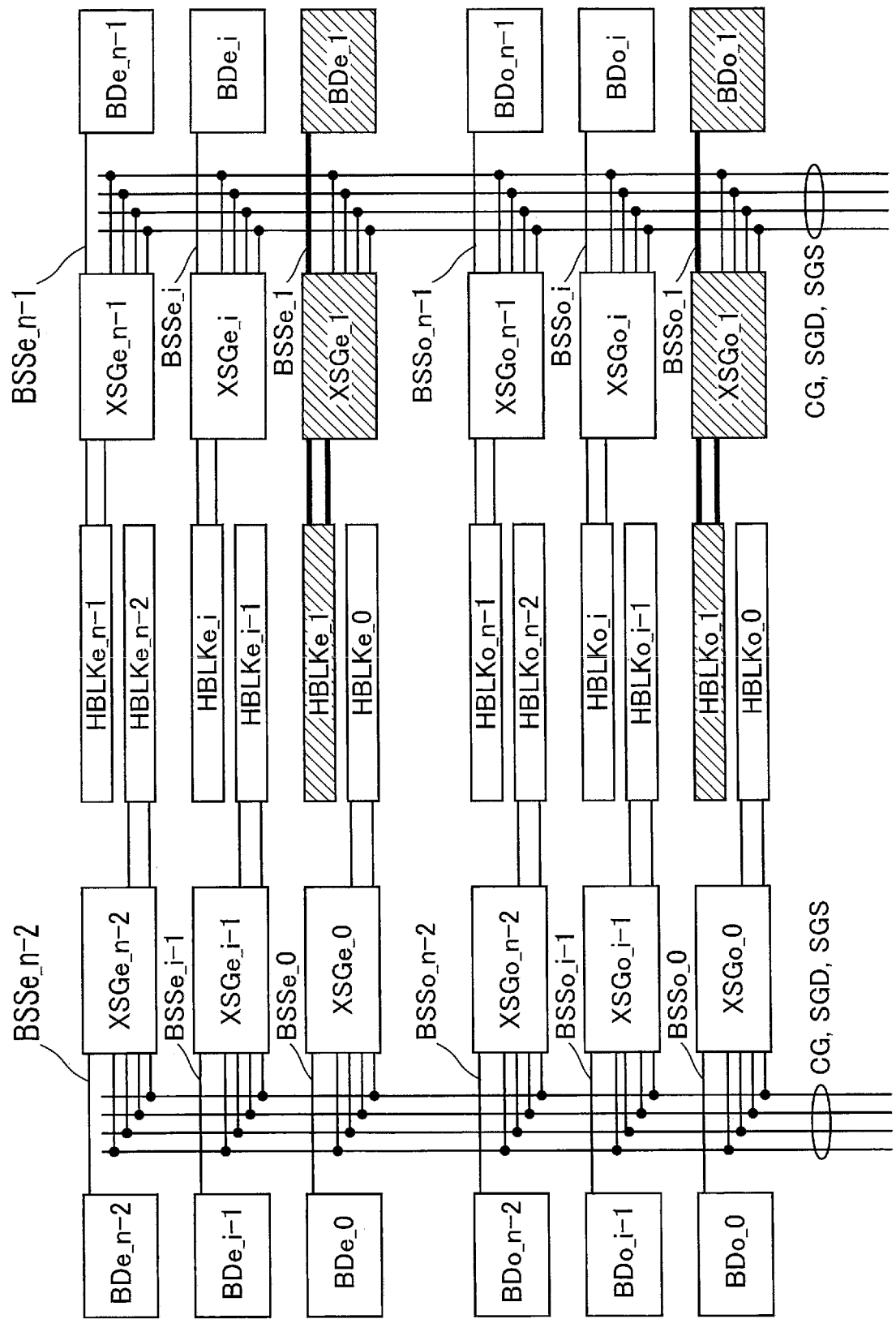

FIG. 23 illustrates one state during an operation in the memory device of the first embodiment.

Figure 24:
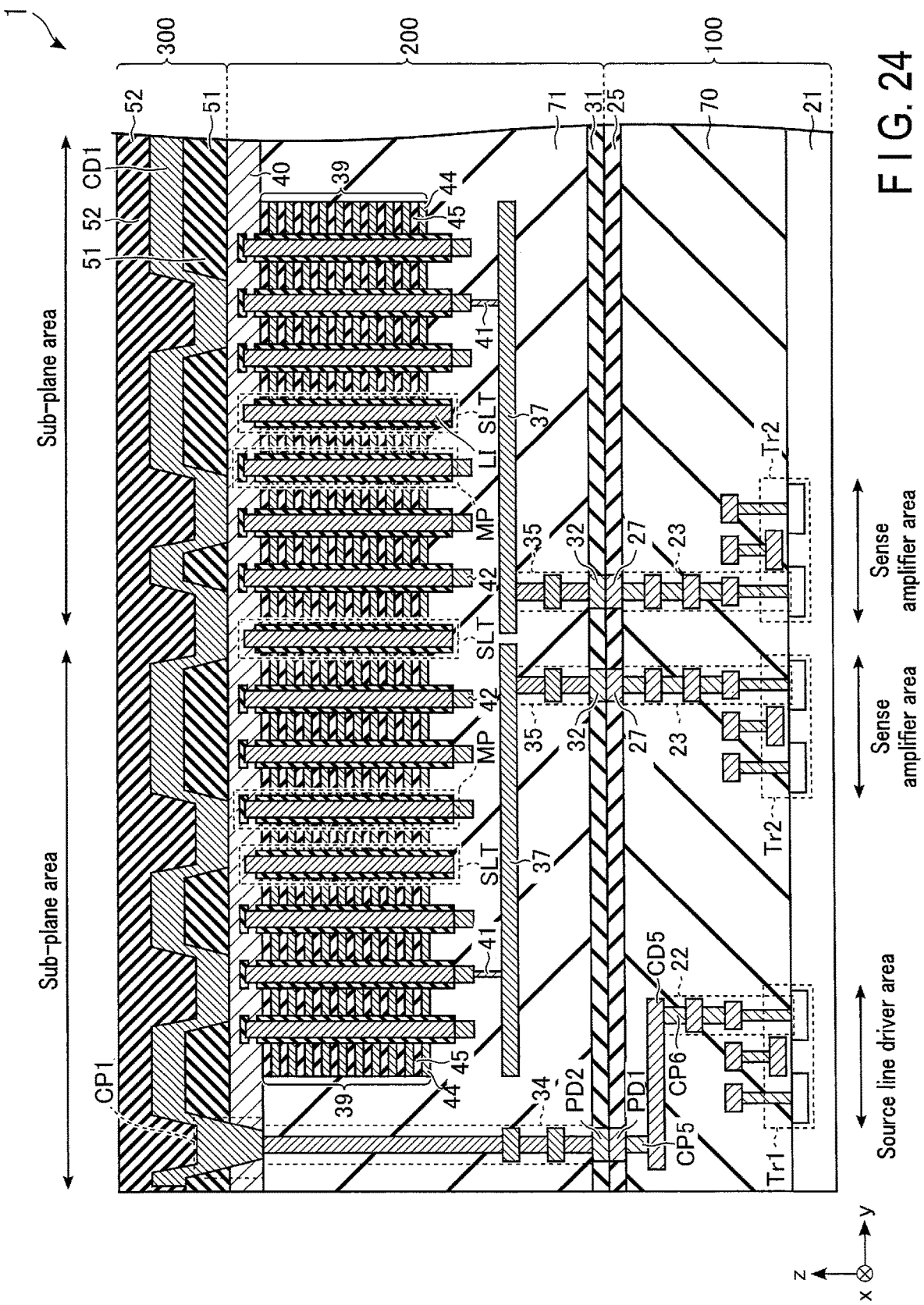

FIG. 24 illustrates a cross-sectional structure of a memory device of a first modification of the first embodiment.

Figure 25:
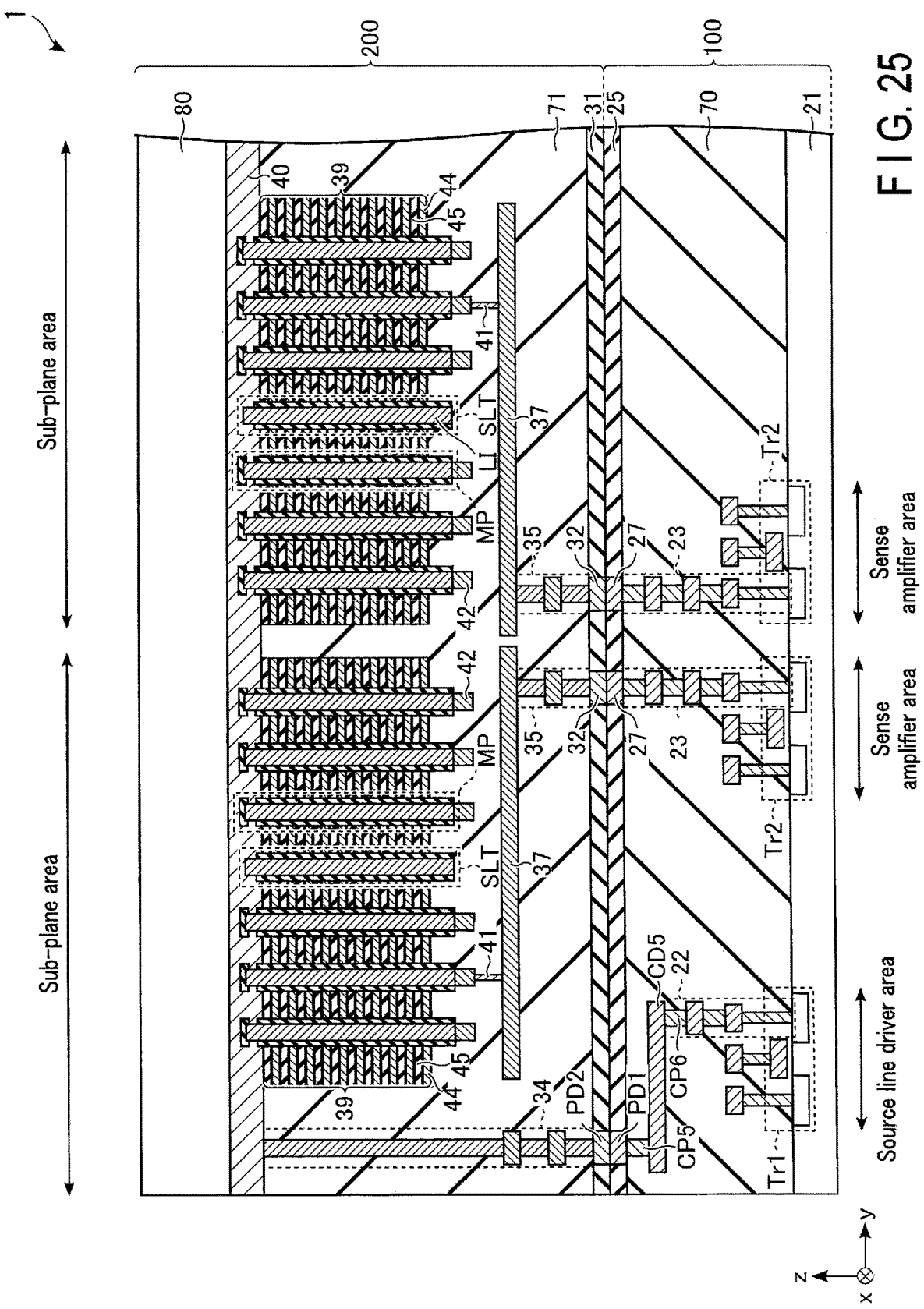

FIG. 25 illustrates a cross-sectional structure of a memory device of a second modification of the first embodiment.

FIG. 26 illustrates a cross-sectional structure of a memory device of a third modification of the first embodiment.

Figure 27:
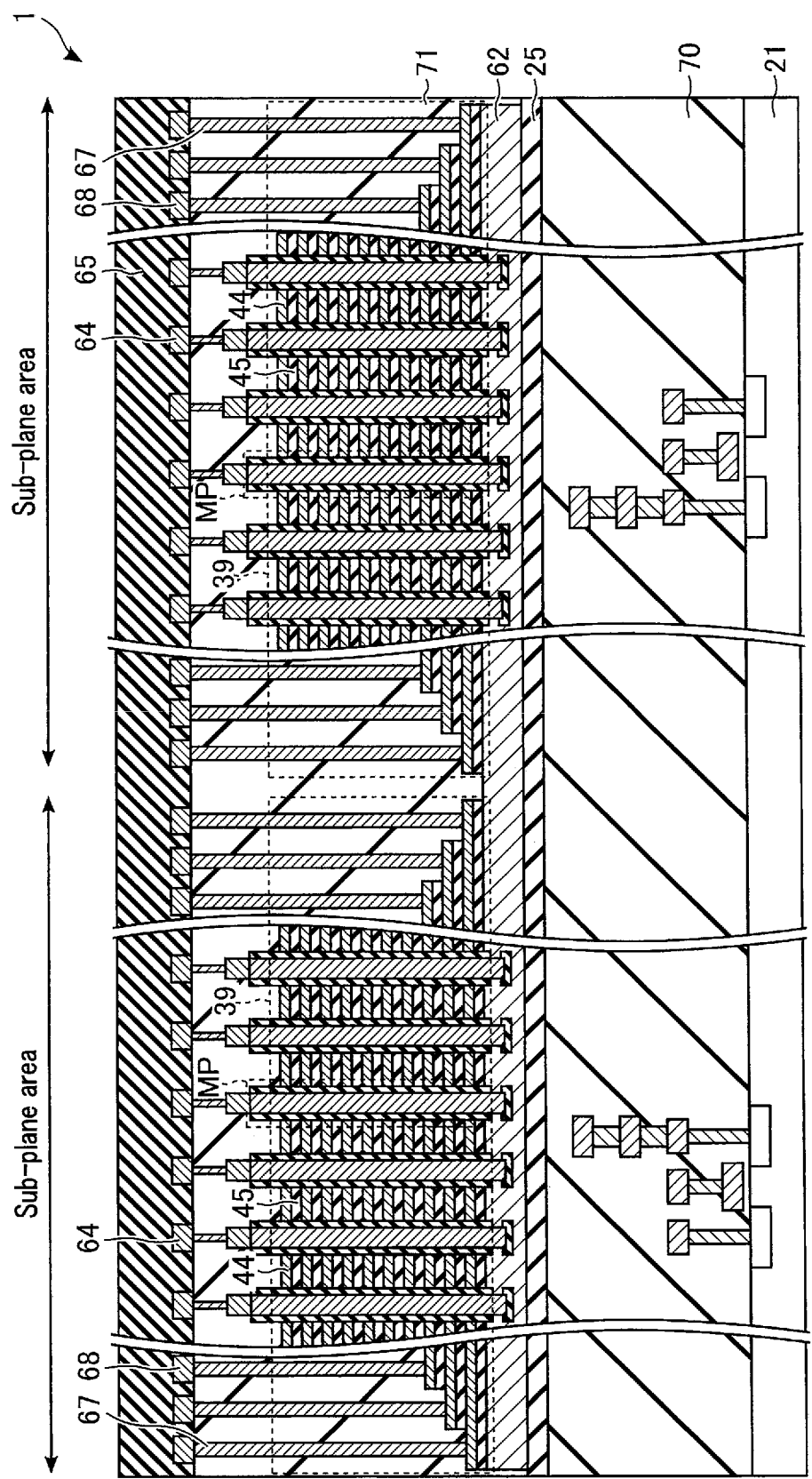

FIG. 27 illustrates a cross-sectional structure of the memory device of the third modification of the first embodiment.

Figure 28:
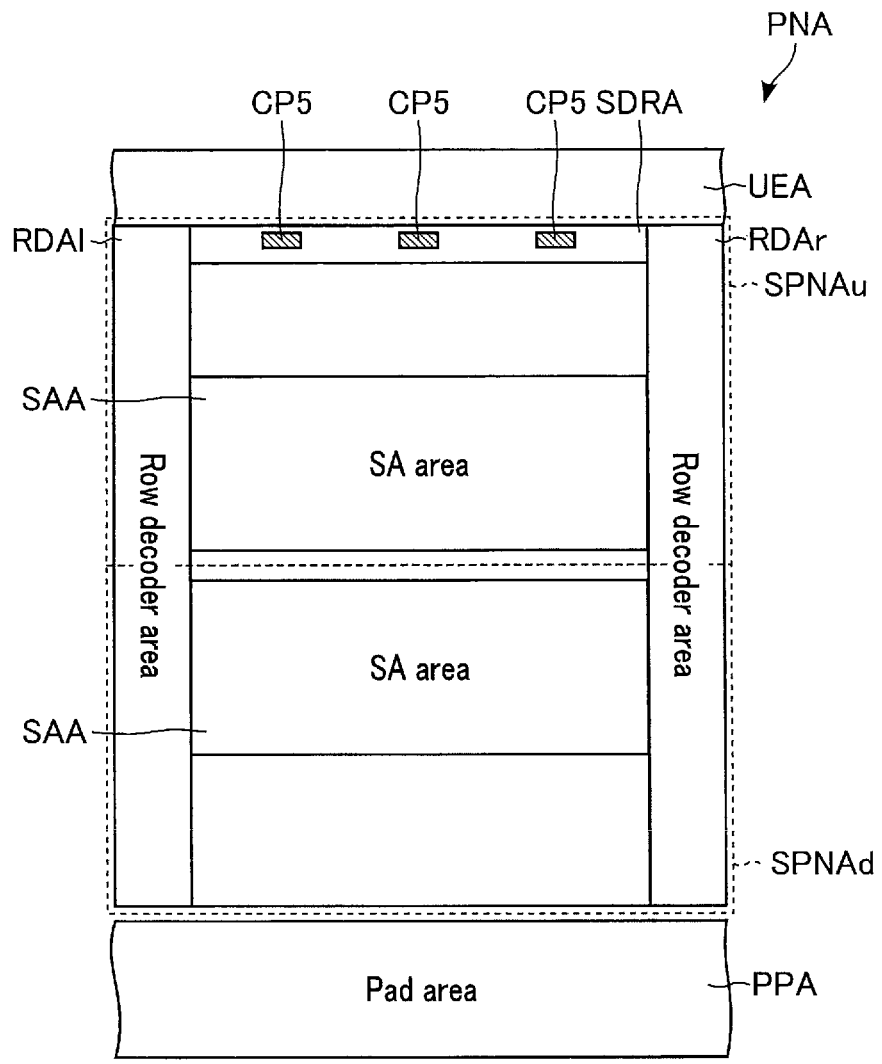

FIG. 28 illustrates a layout of a part of, and some components of, a memory device of a fourth modification of the first embodiment.

Figure 29:
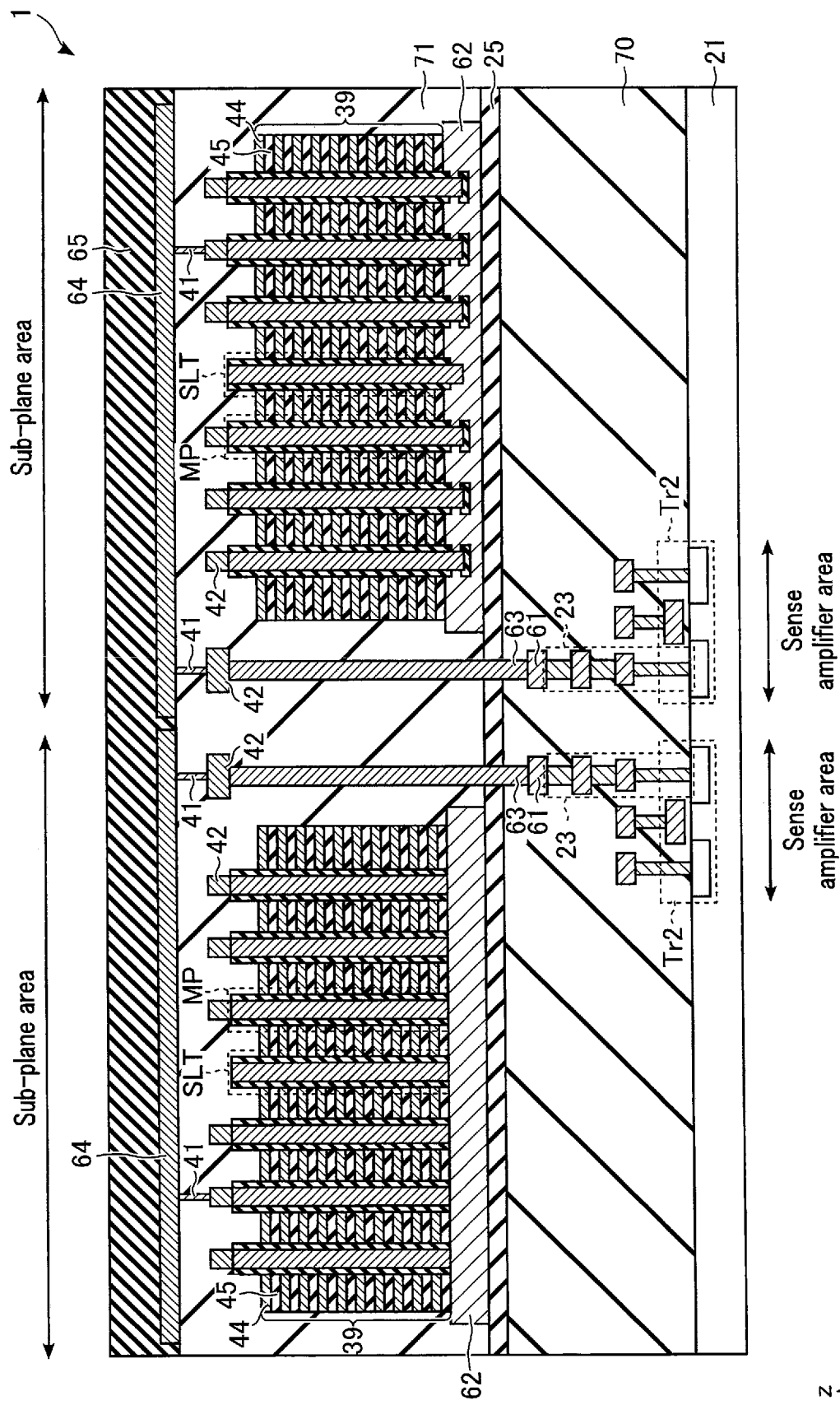

FIG. 29 illustrates a cross-sectional structure of the memory device of the fourth modification of the first embodiment.

Figure 30:
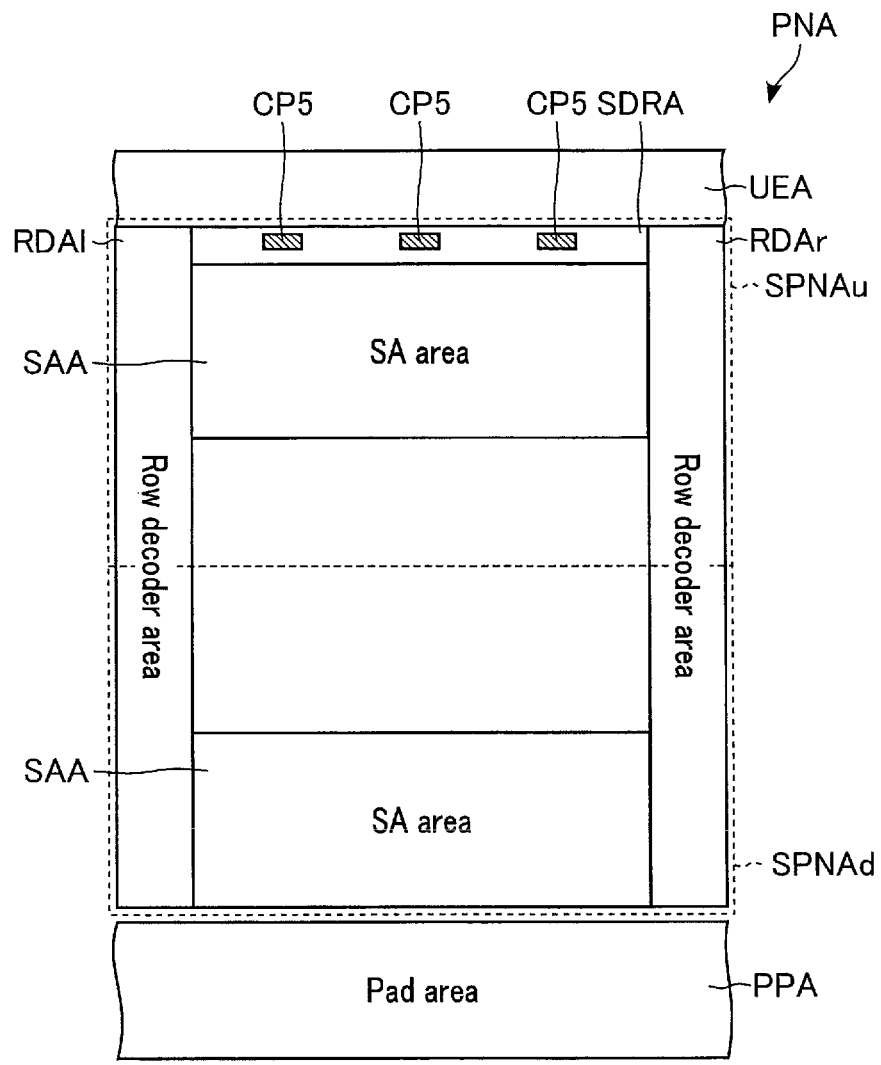

FIG. 30 illustrates a layout of a part of, and some components of, a memory device of a fifth modification of the first embodiment.

Figure 31:
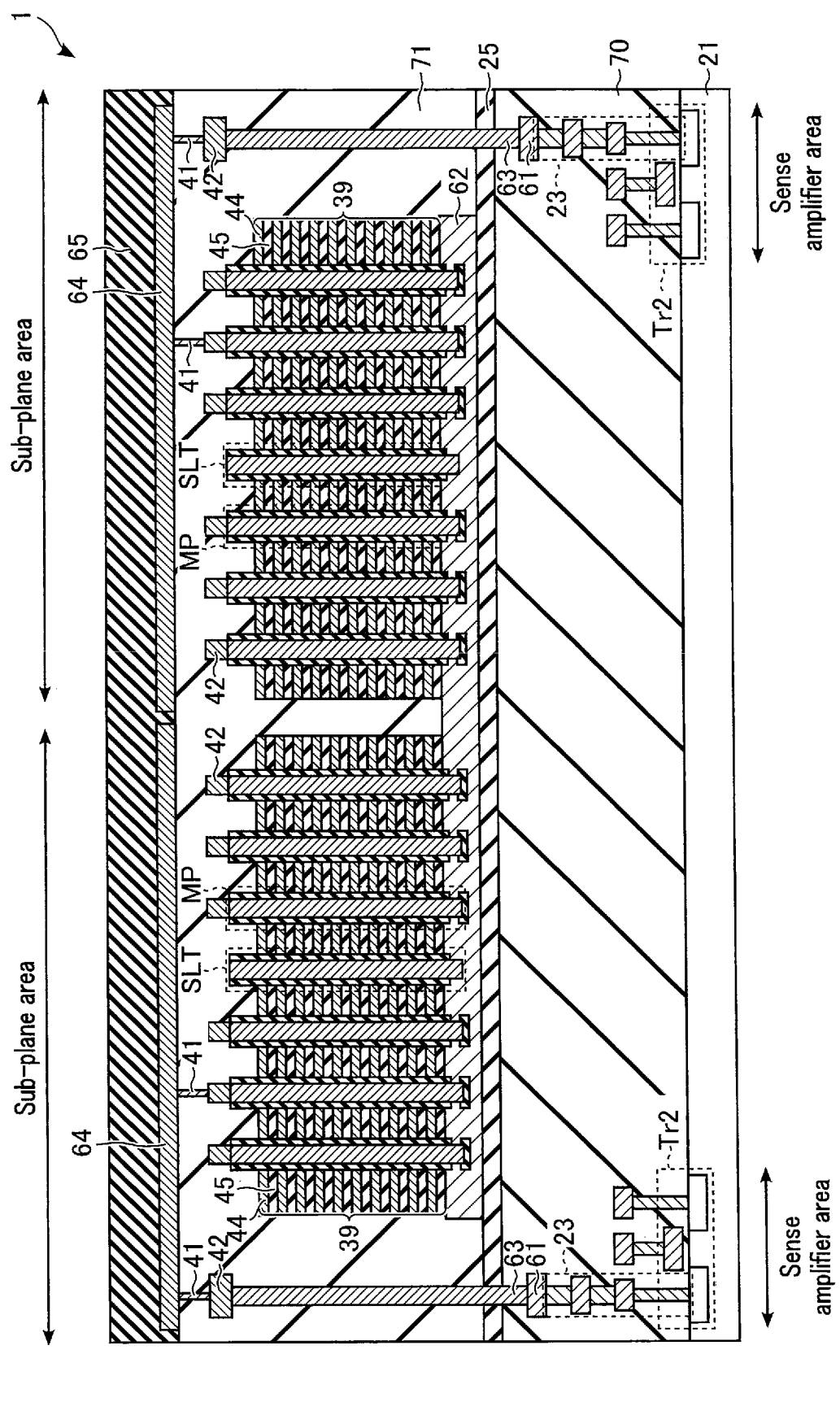

FIG. 31 illustrates a cross-sectional structure of the memory device of the fifth modification of the first embodiment.

Figure 32:
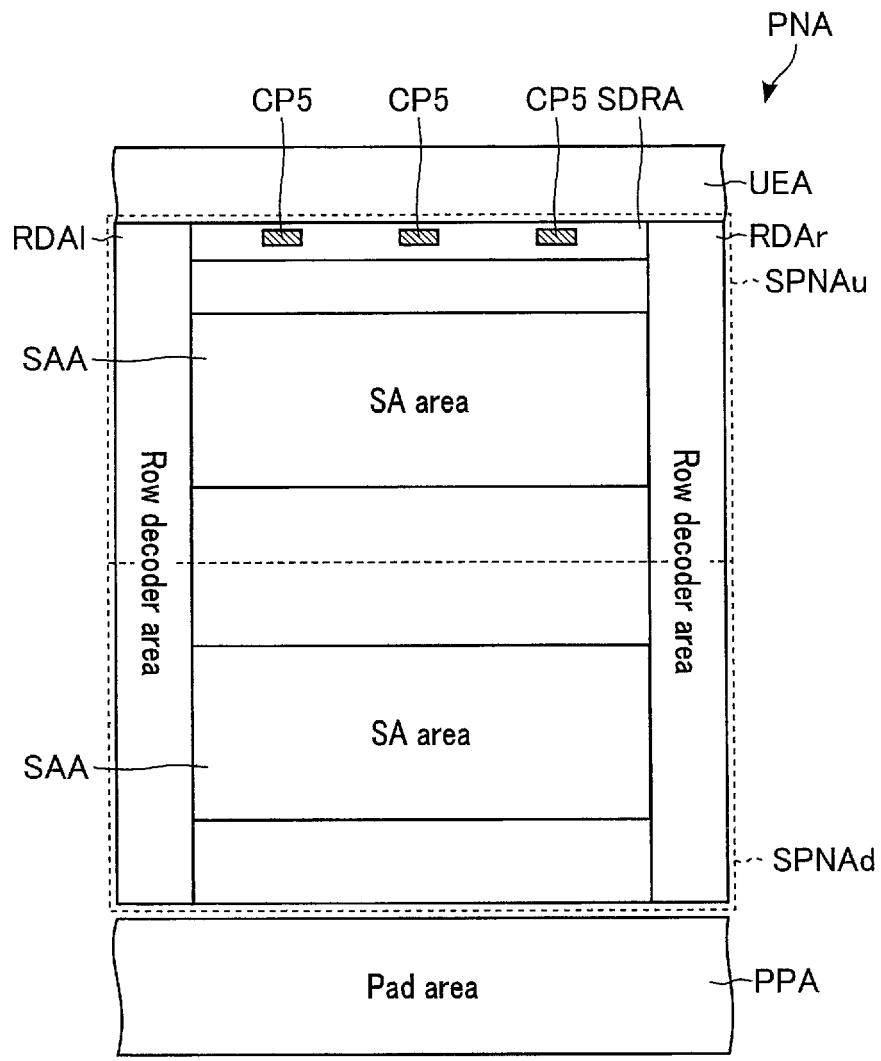

FIG. 32 illustrates a layout of a part of, and some components of, a memory device of a sixth modification of the first embodiment.

FIG. 33 illustrates a cross-sectional structure of the memory device of the sixth modification of the first embodiment.

Each of FIG. 34 to FIG. 39 illustrates an example of signals transmitted and received between a memory device of a second embodiment and a memory controller.

Figure 40:
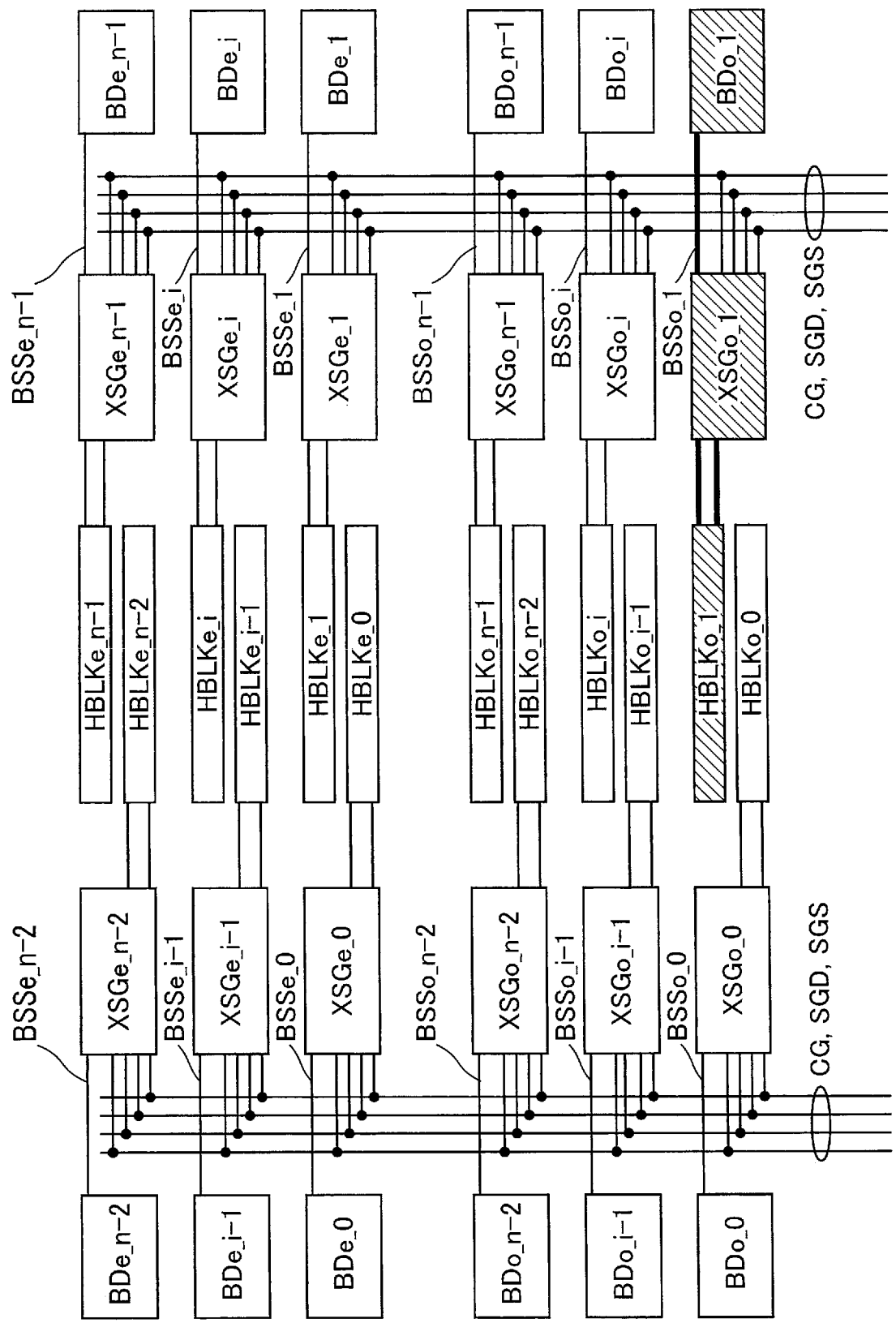

FIG. 40 illustrates one state during an operation in the memory device of the second embodiment.

FIG. 41 illustrates one state during the operation in the memory device of the second embodiment.

Figure 42:
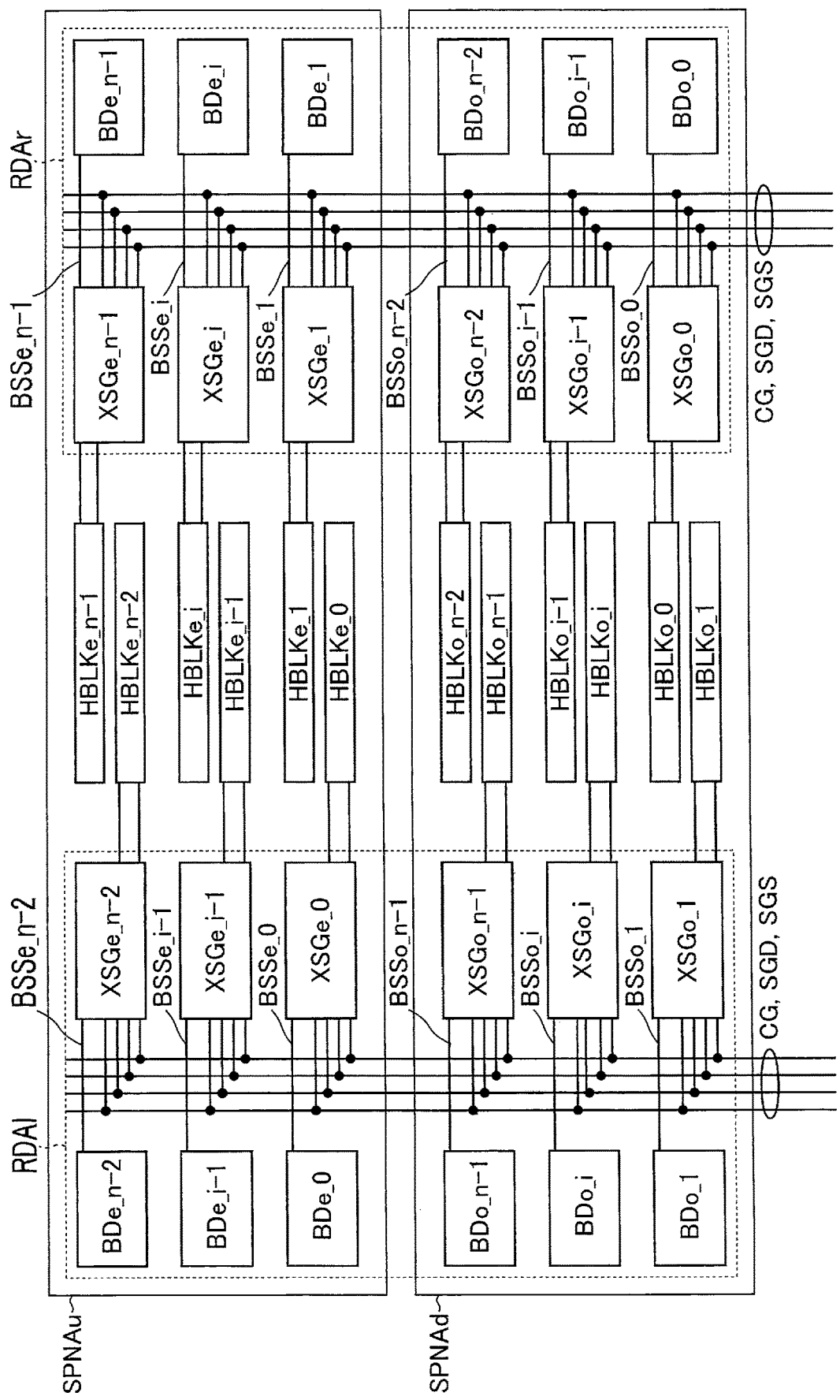

FIG. 42 illustrates components of a row decoder of a memory device of a third embodiment, and a coupling of the components.

FIG. 43 illustrates components of a driver of the memory device of the third embodiment, and a coupling of the components.

Figure 44:
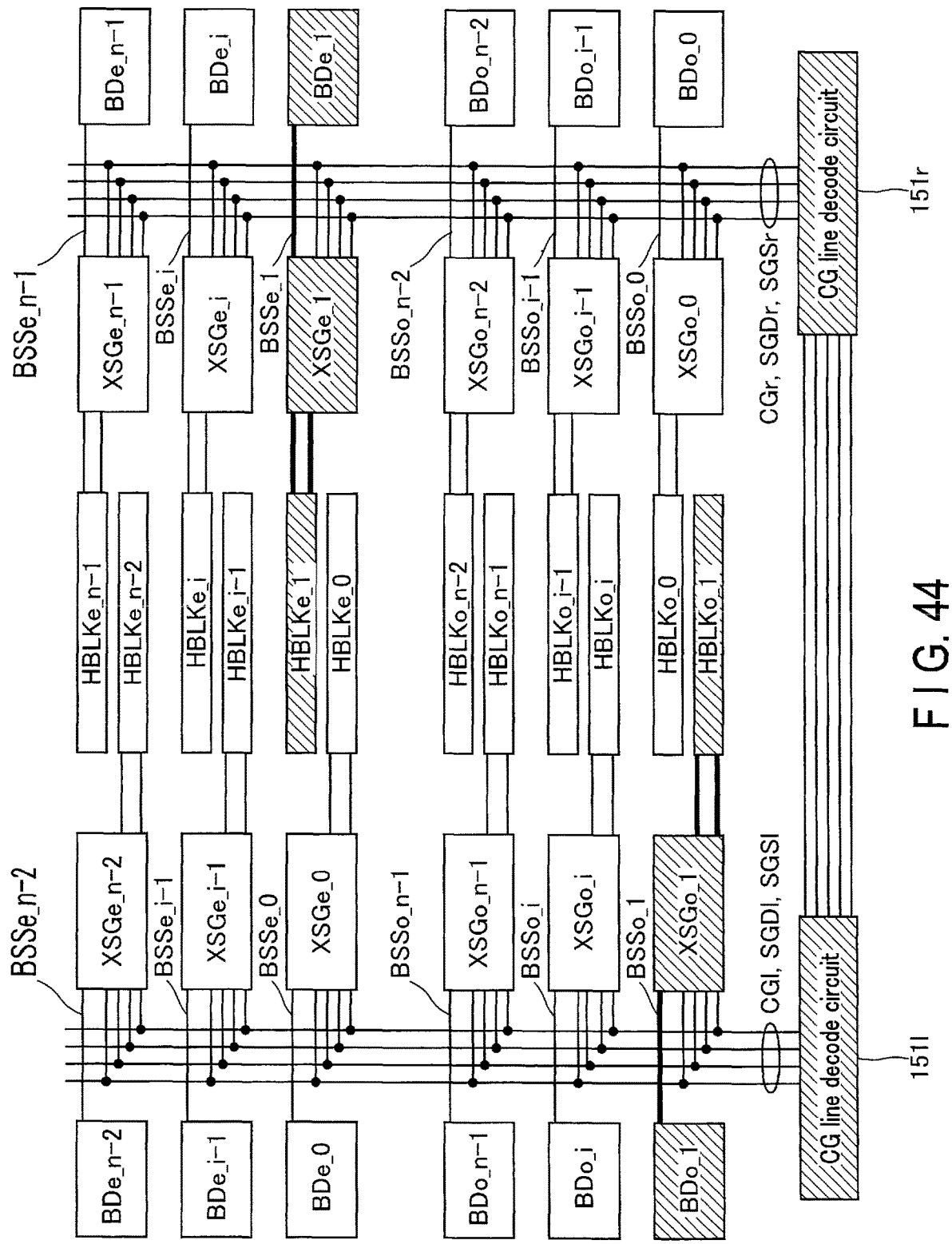

FIG. 44 illustrates one state during an operation in the memory device of the third embodiment.

Figure 45:
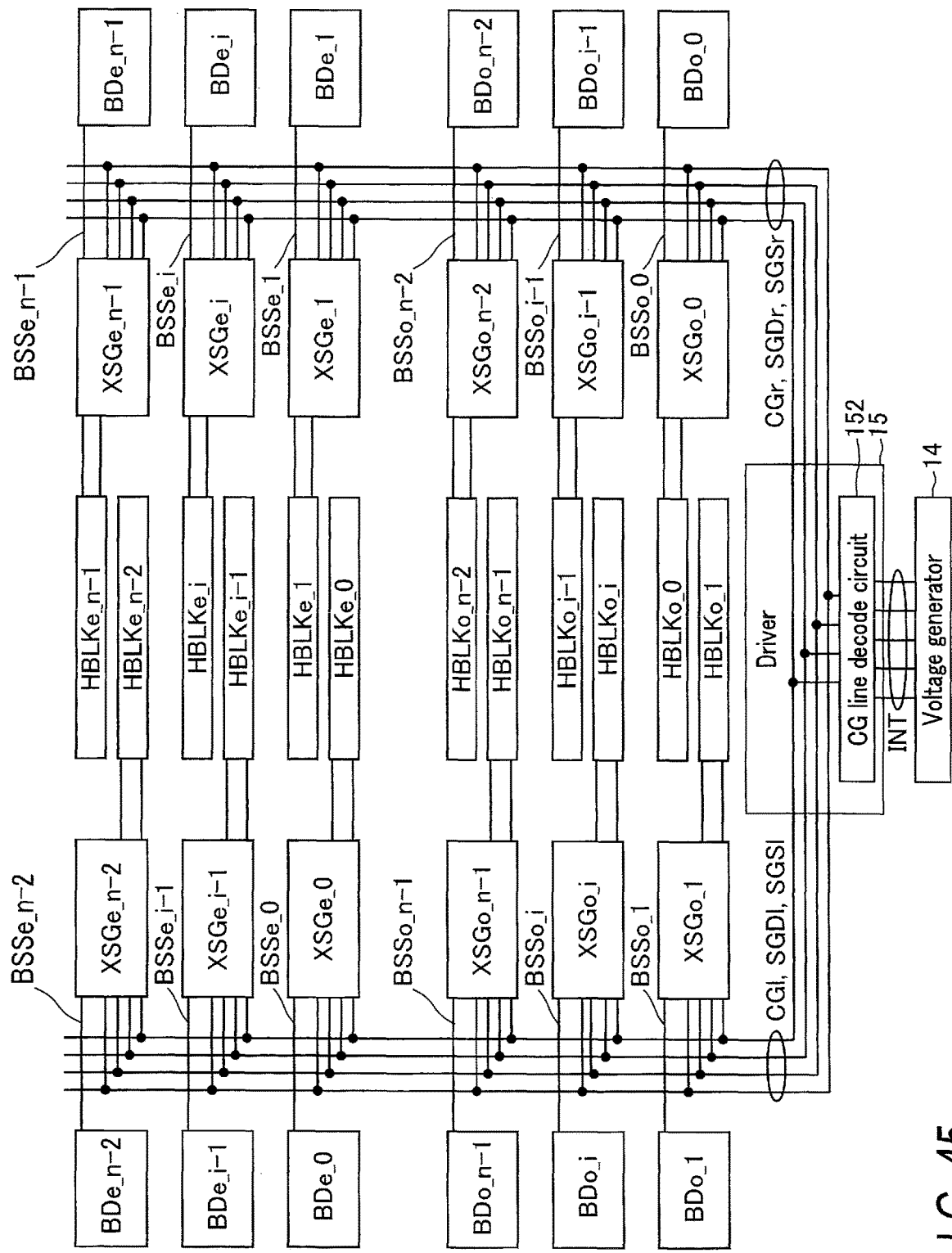

FIG. 45 illustrates components of a driver of a memory device of a fourth embodiment, and a coupling of the components.

Figure 46:
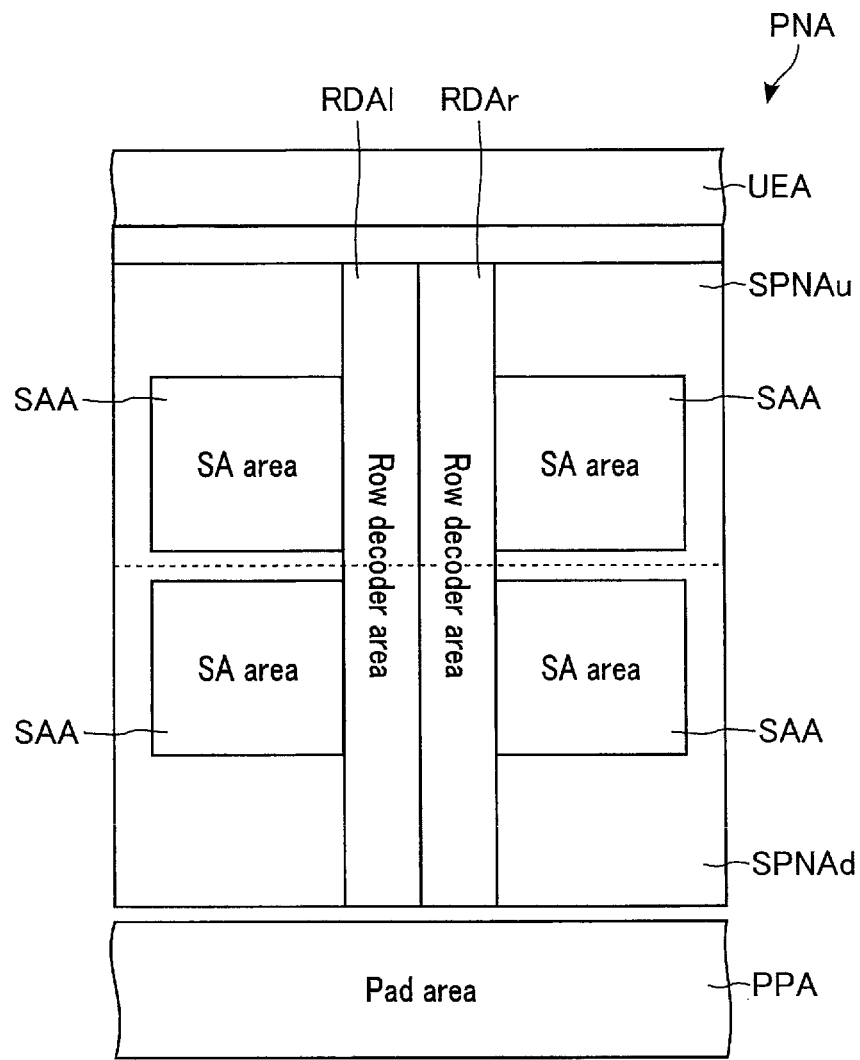
Figure 46:
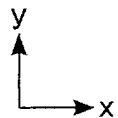
Figure 47:
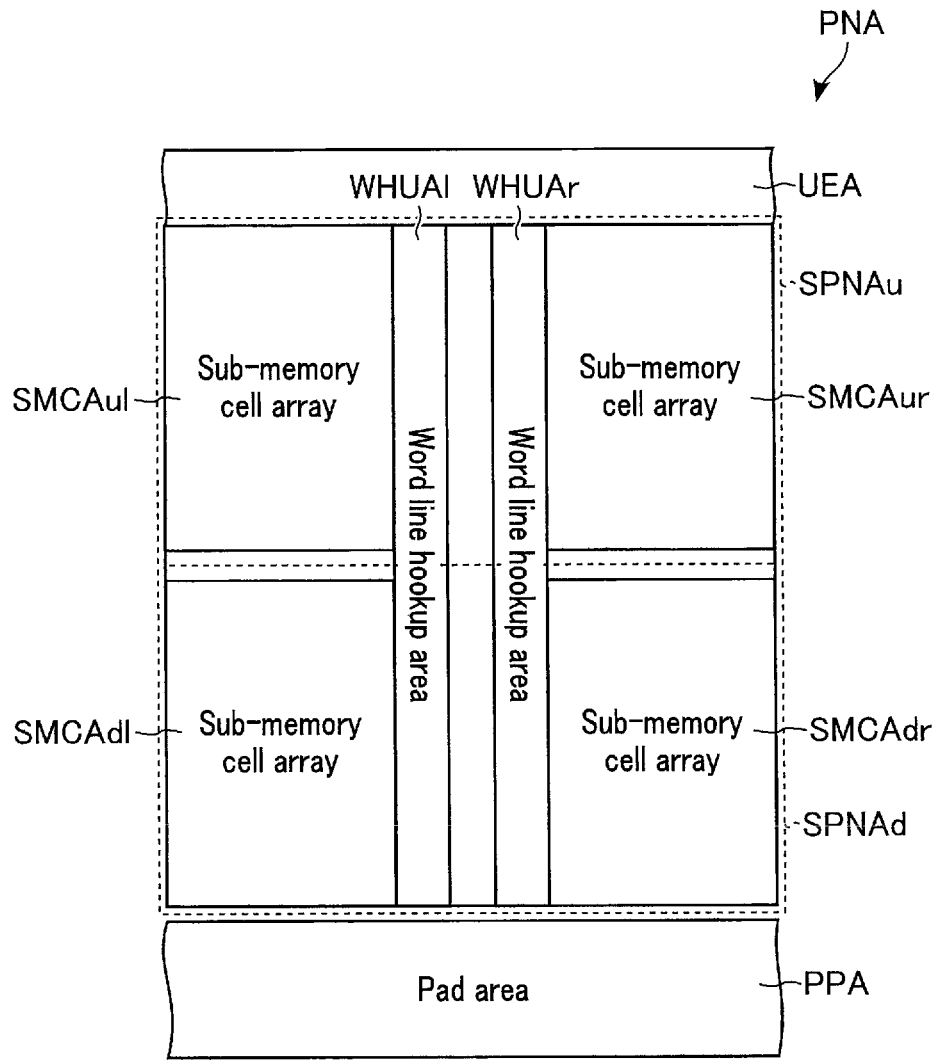

Each of FIGS. 46 and 47 illustrates a layout of a part of, and some components of, a memory device of a fifth embodiment.

Figure 48:
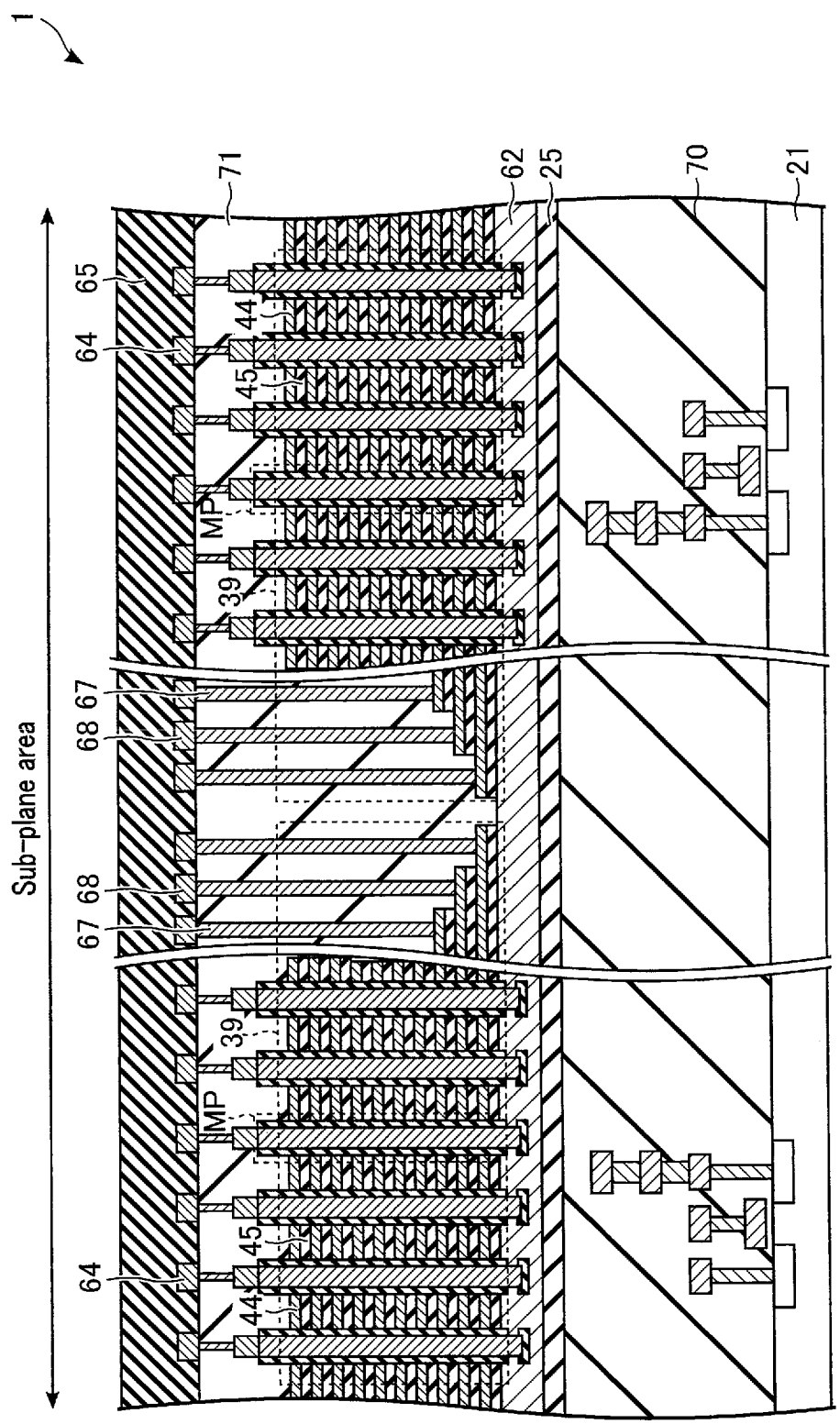

FIG. 48 illustrates a cross-sectional structure of a part of the memory device of the fifth embodiment.

Figure 49:
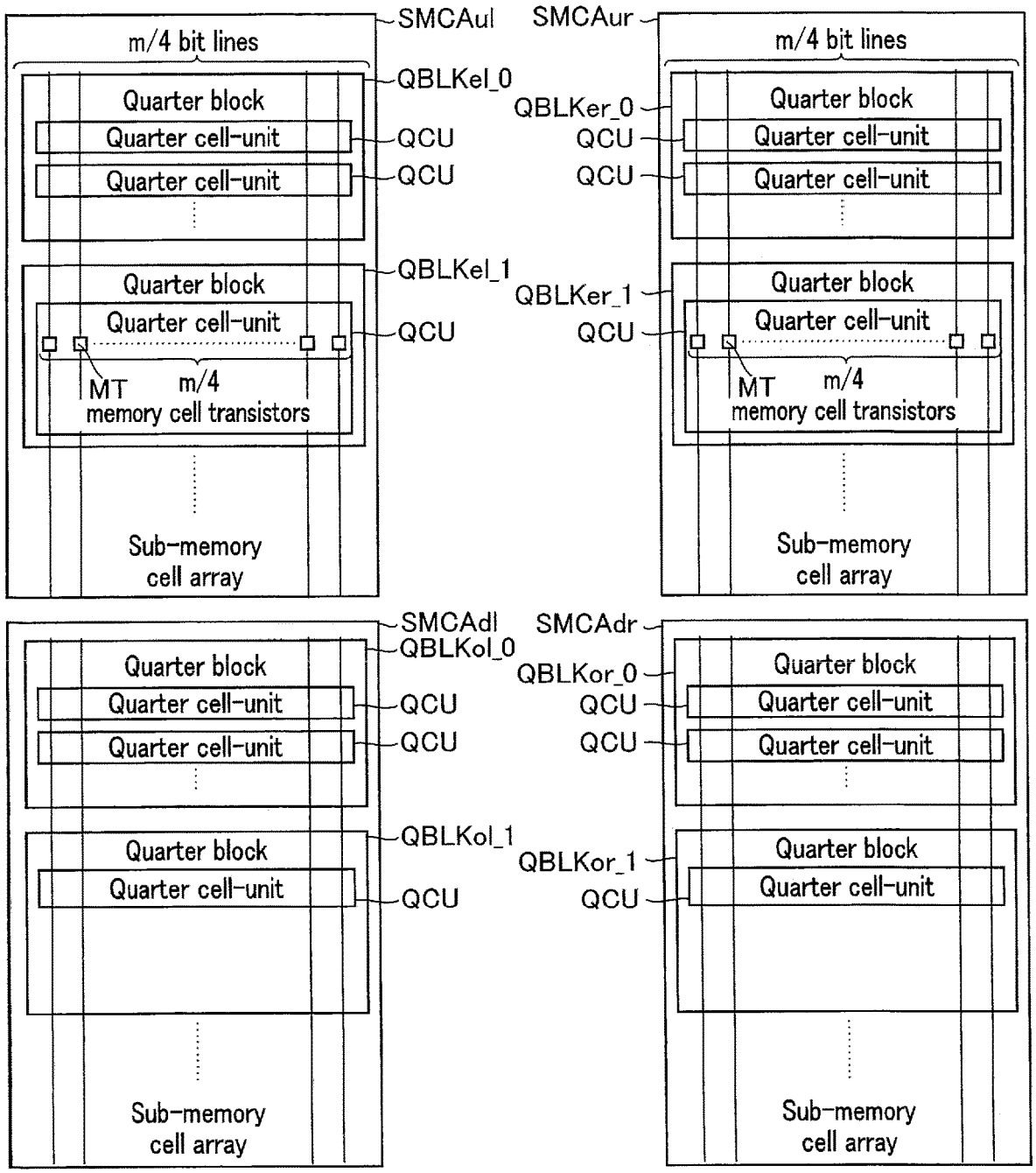

FIG. 49 illustrates an example of components in a memory cell array of the memory device of the fifth embodiment, and allocation of addresses to the components.

FIG. 50 illustrates components of a row decoder of the memory device of the fifth embodiment, and a coupling of the components.

Each of FIG. 51 to FIG. 52 illustrates an example of signals transmitted and received between the memory device of the fifth embodiment and the memory controller.

Figure 53:
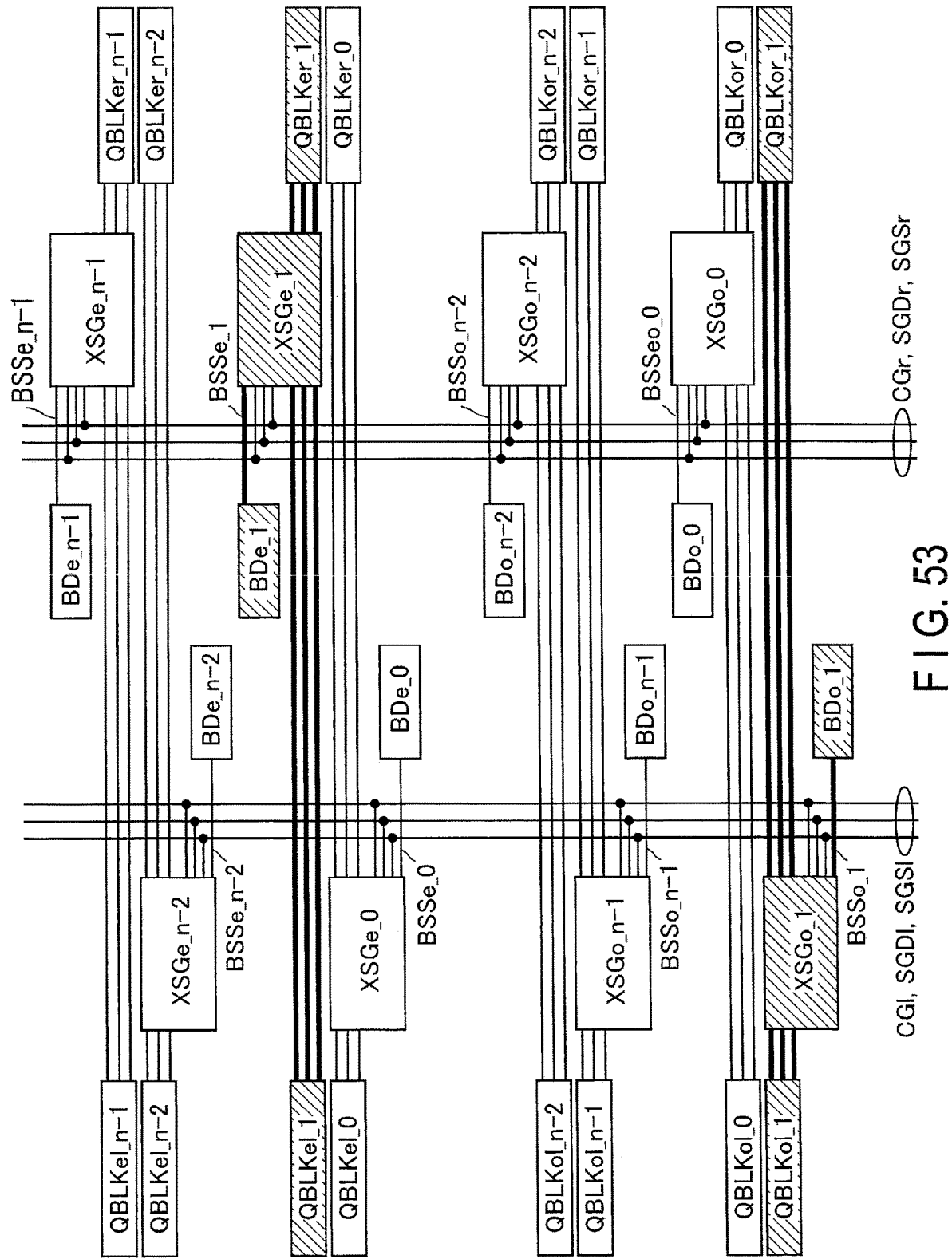

FIG. 53 illustrates one state during an operation in the memory device of the fifth embodiment.

DETAILED DESCRIPTION

In general, according to one embodiment, a memory device includes a first conductor, a first memory pillar, a second conductor, a third conductor, a second memory pillar, a fourth conductor, and a fifth conductor.

The first conductor extends along a first axis and a second axis. The first memory pillar is provided in an inside of the first conductor and includes a first semiconductor and a charge accumulation layer around the first semiconductor. The second conductor extends along the second axis and is in contact with the first memory pillar. The third conductor extends along the first axis and the second axis and is arranged with a distance from the first conductor along the second axis. The second memory pillar is provided in an inside of the third conductor and includes a second semiconductor and a charge accumulation layer around the second semiconductor. The fourth conductor extends along the second axis and is in contact with the second memory pillar. The fifth conductor extends along the second axis and is coupled to the first memory pillar and the second memory pillar.

In the following description, in an embodiment following an embodiment that is already described, different points from the already described embodiment are mainly described. The entire description of a certain embodiment also applies to another embodiment unless the description is explicitly or obviously excluded. Thus, a description of a certain embodiment, in principle, does not include the same content as the description of a preceding embodiment, unless where necessary. In some cases, a plurality of components having substantially the same function and configuration in a certain embodiment or over different embodiments are denoted by reference signs with suffix numerals or characters for the purpose of distinction.

The drawings are schematic, and the relation between a thickness and a planar dimension, the ratio of thicknesses of layers, and the like, may differ from actual ones. Moreover, the drawings may include parts which differ in relation or ratio of dimensions therebetween.

In the present specification and the claims, an expression that a first element is "coupled" to a second element includes a meaning that the first element is coupled to the second element directly or via an element that is constantly electrically conductive or temporarily becomes electrically conductive.

Hereinafter, embodiments are described by using an xyz orthogonal coordinate system. In some cases, a plus direction of a vertical axis in a drawing is referred to as an upper side, and a minus direction of the vertical axis is referred to as a lower side. In some cases, a plus direction of a horizontal axis in a drawing is referred to as a right side, and a minus direction of the horizontal axis is referred to as a left side.

1. First Embodiment 1.1. Configuration (Structure)
1.1.1. Memory Device

Figure 1:
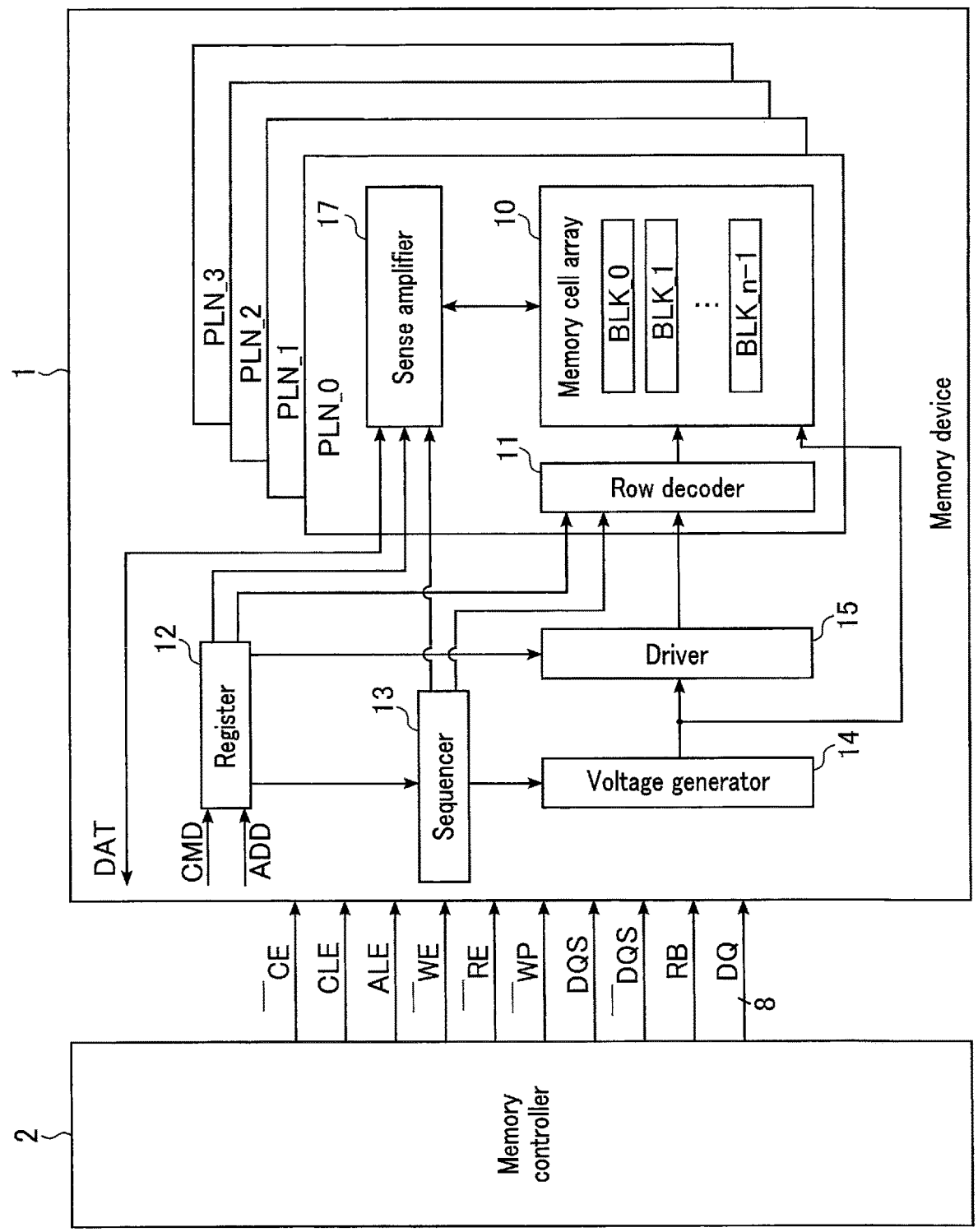
FIG. 1 illustrates an example of components of a memory device of a first embodiment, and a coupling of the components.

FIG. 1 illustrates an example of components of a memory device 1 of a first embodiment, and a coupling of the components. FIG. 1 also illustrates a memory controller 2 that controls the memory device 1.

The memory device 1 is coupled to the memory controller 2 by interconnects based on a NAND interface. The interconnects based on the NAND interface transmit a plurality of control signals, and an input/output signal DQ of an 8-bit width. The control signals include signals ⁻CE, CLE, ALE, ⁻WE, ⁻RE, ⁻WP, DQS, and ⁻DQS, and a ready/busy signal RB. Sign "⁻" indicates an inversion logic. The memory device 1 receives the input/output signal DQ and transmits the input/output signal DQ. The input/output signal DQ includes a command (CMD), data (DAT) and address information (ADD).

The signal ⁻CE enables the memory device 1. The signal CLE notifies the memory device 1 of the transmission of the command by the input/output signal DQ. The signal ALE notifies the memory device 1 of the transmission of the address information by the input/output signal DQ. The signal ⁻WE instructs the memory device 1 to take in the input/output signal DQ. The signal ⁻RE instructs the memory device 1 to output the input/output signal DQ. The ready/busy signal RB indicates whether the memory device 1 is in a ready state or in a busy state, and indicates a busy state by a low level. When the memory device 1 is in the ready state, the memory device 1 accepts the command. When the memory device 1 is in the busy state, the memory device 1 does not accept the command.

The memory device 1 is configured, for example, as a single chip. The memory device 1 includes components such as a plurality of planes PLN, for example, four planes PLN_0, PLN_1, PLN_2 and PLN_3, a register 12, a sequencer 13, a voltage generator 14, and a driver 15.

Each plane PLN is a set of a plurality of components. The plane PLN is a unit (memory area) of a target of data write and data read. The planes PLN_0 to PLN_3 can operate independently from each other. The planes PLN_0 to PLN_3 can also operate in parallel. In other words, the memory device 1 includes a plurality of memory areas that can be controlled independently from each other. Each plane PLN includes the same set of components, and includes a memory cell array 10, a row decoder 11 and a sense amplifier 17.

The register 12 is a circuit that holds the command CMD and address information ADD, which are received by the memory device 1. The command CMD instructs the memory device 1 to execute various operations including data read, data write and data erase. The address information ADD designates a target of data read, data write and data erase. The address information ADD includes, for example, a plane address, a block address, a page address, and a column address. The plane address designates one plane PLN. The block address designates one block BLK (to be described later). The page address designates one string unit SU (to be described later), one word line WL (to be described later), and one page (to be described later). The page address designates, in different parts, the string unit SU, word line WL and page. That part of the page address, which designates the word line WL, is called "word line address". The column address designates one bit line BL (to be described later).

The sequencer 13 is a circuit that controls an operation of the entirety of the memory device 1. Based on the command CMD received from the register 12, the sequencer 13 controls the voltage generator 14, row decoder 11 and sense amplifier 17, and executes various operations including data read, data write and data erase.

The voltage generator 14 is a circuit that generates a plurality of voltages with different magnitudes. The voltage generator 14 receives a power supply voltage from an outside of the memory device 1, and generates a plurality of voltages from the power supply voltage. The generated voltages are supplied to components such as the memory cell array 10 and the driver 15.

The driver 15 is a circuit that applies various voltages, which are necessary for the operation of the memory device 1, to some components. The driver 15 receives voltages from the voltage generator 14, and supplies a selected one of the voltages to one or more row decoders 11.

The memory cell array 10 of each plane PLN is a set of arrayed memory cells. The memory cell array 10 includes an n-number of blocks BLK, i.e. BLK_0, BLK_1, . . . , BLK_n−1. Each block BLK includes a plurality of memory cell transistors MT (not shown). In the memory cell array 10, word lines WL (not shown) and bit lines BL (not shown) are also located.

The row decoder 11 is a circuit for selecting the block BLK. The row decoder 11 of each plane PLN functions for the operation in the plane PLN in which this row decoder 11 is included. Based on the block address received from the register 12, the row decoder 11 transfers the voltage, which is supplied from the driver 15, to one selected block BLK.

The sense amplifier 17 is a circuit that outputs a signal that is based on data stored in the memory cell transistor MT. The sense amplifier 17 of each plane PLN functions for the operation in the plane PLN in which this memory cell array 10 is included. The sense amplifier 17 senses the state of the memory cell transistor MT, and the sense amplifier 17 generates read data, based on the sensed state, or transfers write data to the memory cell transistor MT.

1.1.2. Memory Cell Array

FIG. 2 illustrates components of one block BLK_0 of the first embodiment, and a coupling of the components. A plurality of blocks BLK, for example, all blocks BLK, include the components and the coupling illustrated in FIG. 2.

One block BLK includes a plurality of string units SU, for example, four string units SU_0 to SU_3.

Each of an m-number of bit lines BL_0 to BL_m−1 is coupled, in each block BLK, to one NAND string NS from each of string units SU_0 to SU_3. Here, m is a positive integer number, and is, for example, 16 kB, i.e. 16×1024×8. The description below is based on this example.

Each NAND string NS includes one select gate transistor ST, a plurality of memory cell transistors MT, for example, eight memory cell transistors MT0 to MT7, and one select gate transistor DT. The memory cell transistor MT is an element that includes a control gate electrode and a charge accumulation layer insulated from the surrounding, and that stores data nonvolatilely, based on a quantity of charge in the charge accumulation layer. The transistors ST, MT and DT are coupled in series in the named order between a source line SL and one bit line BL.

A plurality of different bit lines BL and a plurality of NAND strings NS coupled thereto constitute one string unit SU. In each string unit SU, the control gate electrodes of the memory cell transistors MT0 to MT7 are coupled to the word lines WL0 to WL7, respectively. A set of memory cell transistors MT, which share the word line WL in one string unit SU, is called "cell unit CU". Each cell unit CU stores data of one page or a plurality of pages. When each memory cell transistor MT of a certain cell unit CU stores data of one bit, the cell unit CU stores data of one page. Similarly, when each memory cell transistor MT of a certain cell unit CU stores data of p bits, the cell unit CU stores data of p pages. Here, p is an integer of 2 or more. In order to facilitate understanding, the description below is based on an example in which each memory cell transistor MT stores data of one bit. Thus, only one page address is allocated to one cell unit CU.

Based on the example in which the number m of bit lines is 16 kB, the size of one page is 16 kB.

In each block BLK, the memory cell transistors MT0 to MT7 of each of the string units SU are coupled to the word lines WL0 to WL7, respectively.

The select gate transistors DT0 to DT3 belong to the string units SU_0 to SU_3, respectively. In FIG. 2, DT2 and DT3 are not illustrated. The gate of the select gate transistor DT0 of each of the NAND strings NS of the string unit SU_0 is coupled to a select gate line SGDL0. Similarly, the gates of the select gate transistors DT1, DT2 and DT3 of the respective NAND strings NS of the string units SU_1, SU_2 and SU_3 are coupled to select gate lines SGDL1, SGDL2 and SGDL3.

The gate of the select gate transistor ST is coupled to a select gate line SGSL.

1.1.3. Driver

Figure 3:
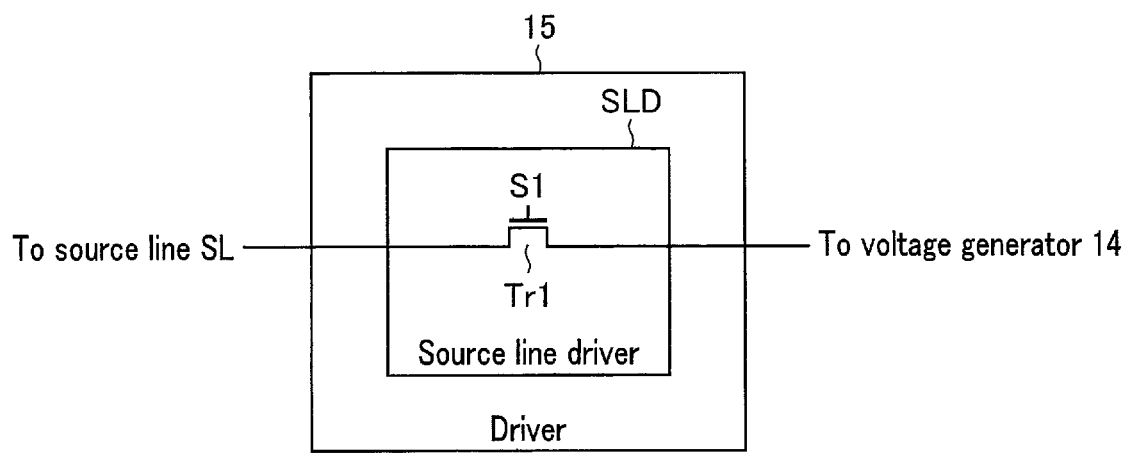
FIG. 3 illustrates components of a driver of the memory device of the first embodiment.

FIG. 3 illustrates components of the driver 15 of the memory device 1 of the first embodiment. As illustrated in FIG. 3, the driver 15 includes a source line driver SLD. The source line driver SLD includes an n-type MOSFET Tr1. The transistor Tr1 is coupled at one end to the voltage generator 14. The transistor Tr1 is coupled at the other end to the source line SL, i.e. a conductor functioning as a part of the source line SL. The transistor Tr1 receives a control signal S1 by the gate thereof. The transistor Tr1 receives the control signal S1 from, for example, the sequencer 13 or a component other than the source line driver SLD in the driver 15.

1.1.4. Sense Amplifier

Figure 4:
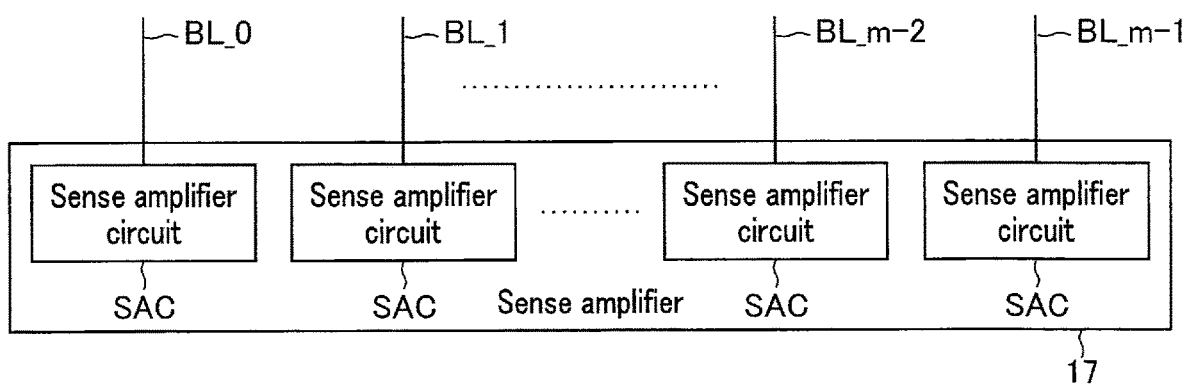
FIG. 4 illustrates components of a sense amplifier of the memory device of the first embodiment, and a coupling of the components.

FIG. 4 illustrates components of the sense amplifier of the memory device 1 of the first embodiment, and a coupling of the components. As illustrated in FIG. 4, the sense amplifier 17 includes a plurality of sense amplifier circuits SAC. The sense amplifier 17 includes an m-number of sense amplifier circuits SAC, i.e. the same number of sense amplifier circuits SAC as the number of bit lines BL. Each sense amplifier circuit SAC is coupled to one but line BL. In other words, one sense amplifier circuit SAC is coupled to each bit line BL.

The sense amplifier circuit SAC is a circuit that outputs a signal based on the voltage of the bit line BL to which the sense amplifier circuit SAC is coupled. During data read, the memory cell transistor MT of the target of data read is coupled to the bit line BL, and a voltage based on the data stored in the memory cell transistor MT, to which the bit line BL is coupled, occurs in the bit line BL. The sense amplifier circuit SAC outputs a signal based on the voltage on the bit line BL. The output signal represents the data stored in the memory cell transistor MT that is the target of data read.

1.1.5. Layout of the Memory Device

Figure 5:
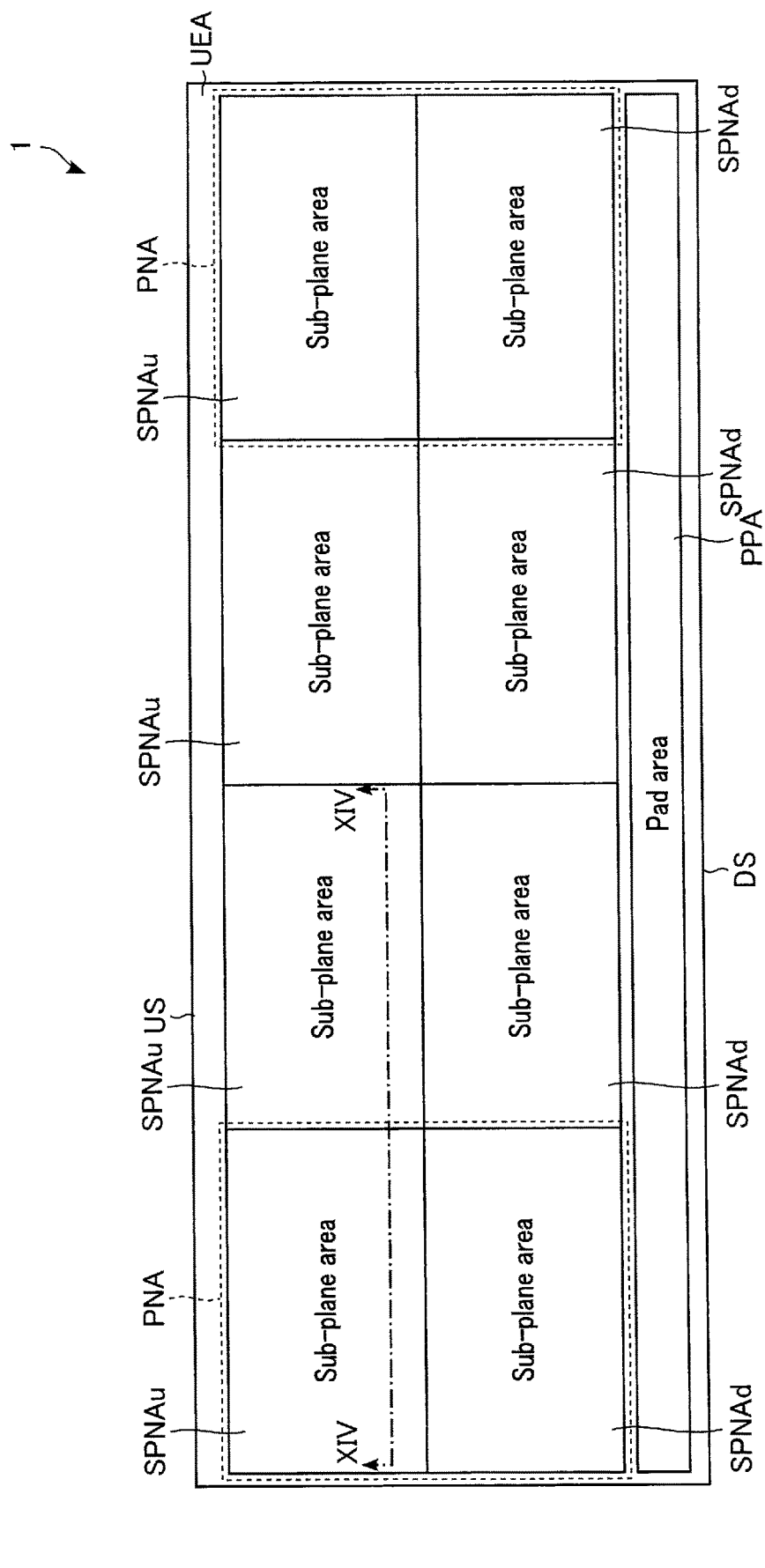
FIG. 5 illustrates a layout of the memory device of the first embodiment.

FIG. 5 illustrates a layout of the memory device of the first embodiment. As will be described later, the memory device 1 includes a plurality of layers arranged along the z axis. The layouts of some of these layers to be described later are based on areas described with reference to FIG. 5.

As illustrated in FIG. 5, the memory device 1 extends in an xy plane. The memory device 1 has a tetragonal shape along the xy plane. The memory device 1 has two sides that are opposed along the y axis, and has two sides that are arranged along the x axis. A lower one of the two sides that are opposed along the y axis is referred to as "lower side DS", and an upper one of these two sides is referred to as "upper side US".

The memory device 1 includes a pad area PPA along the lower side DS. The pad area PPA is an area including a pad EPD (to be described later) in a layer located at a certain coordinate on the z axis.

The memory device 1 includes a plurality of plane areas PNA, for example, four plane areas PNA, between the pad area PPA and the upper side US. The plane areas PNA are arranged along the x axis. The plane areas PNA have substantially identical dimensions. In the present specification and the claims, the expression "substantially identical" or "substantially the same" is intended to mean "identical" or "the same", but means that some error due to an unavoidable reason is allowed.

Each plane area PNA is composed of two sub-plane areas SPNA. In each plane area PNA, the two sub-plane areas SPNA are arranged along the y axis. In some cases, of two sub-plane areas SPNA arranged along the y axis, the sub-plane areas located on the upper side and lower side along the y axis are referred to as "sub-plane area SPNAu" and "sub-plane area SPNAd", respectively.

An upper-end area UEA is located between the upper side US of the memory device 1 and the upper end of the set of the plane areas PNA.

In each plane area PNA, the components of one plane PLN of the planes PLN_0 to PLN_3 are formed, or, in other words, the memory cell array 10, row decoder 11 and sense amplifier 17 are formed. In some cases, the memory cell array 10, the row decoder 11 and the sense amplifier 17 formed in a certain plane area PNA are referred to as "memory cell array 10 corresponding to the plane area PNA", "row decoder 11 corresponding to the plane area PNA", and "sense amplifier 17 corresponding to the plane area PNA", respectively.

Figure 6:
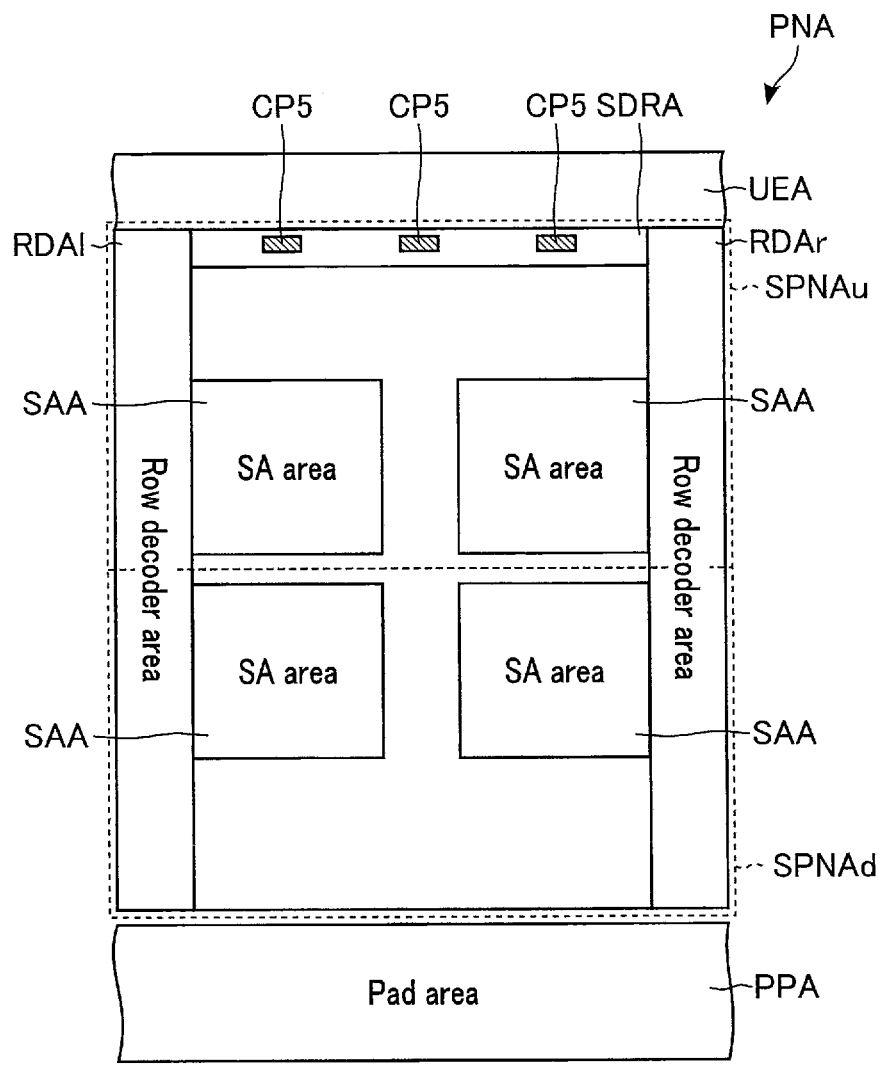
Figure 7:
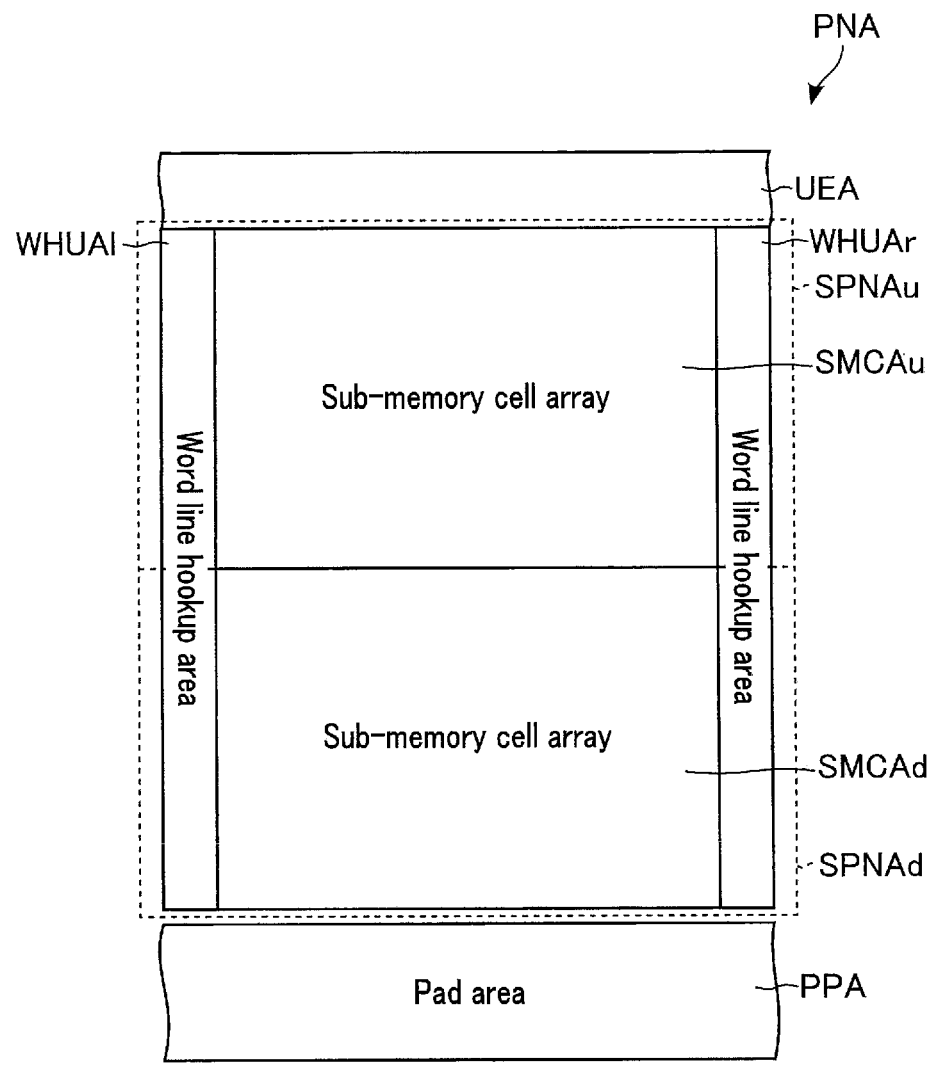
Figure 8:
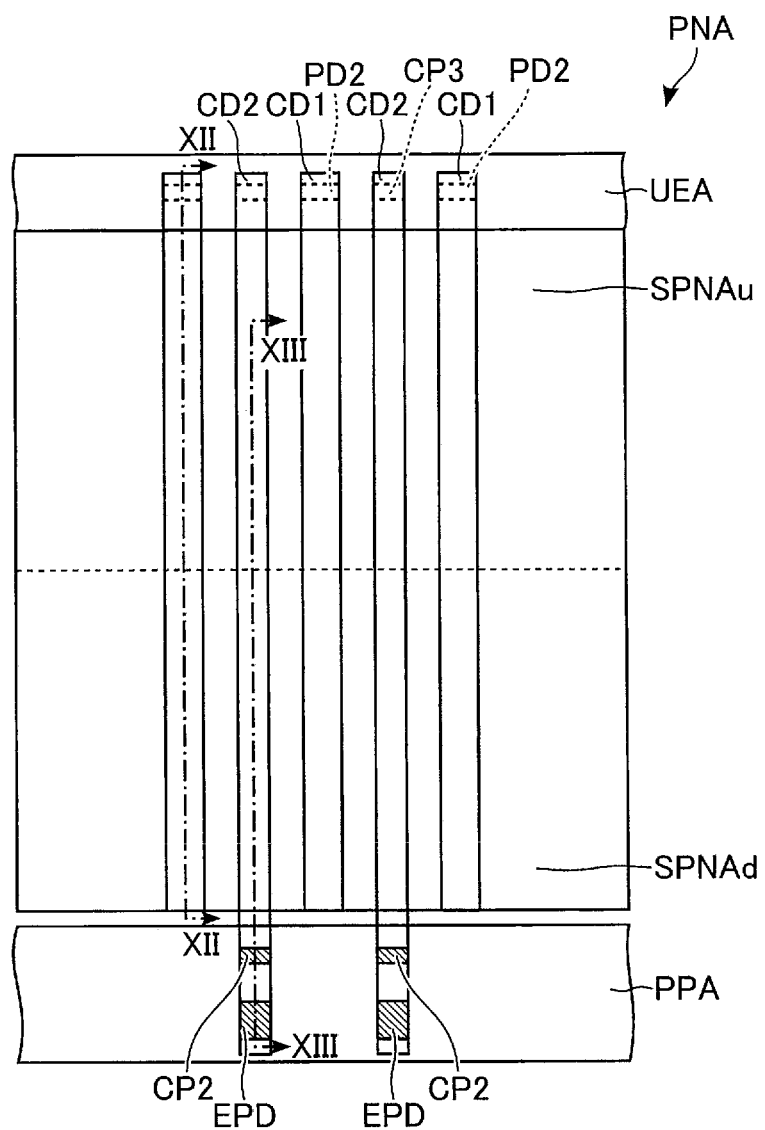
Figure 9:
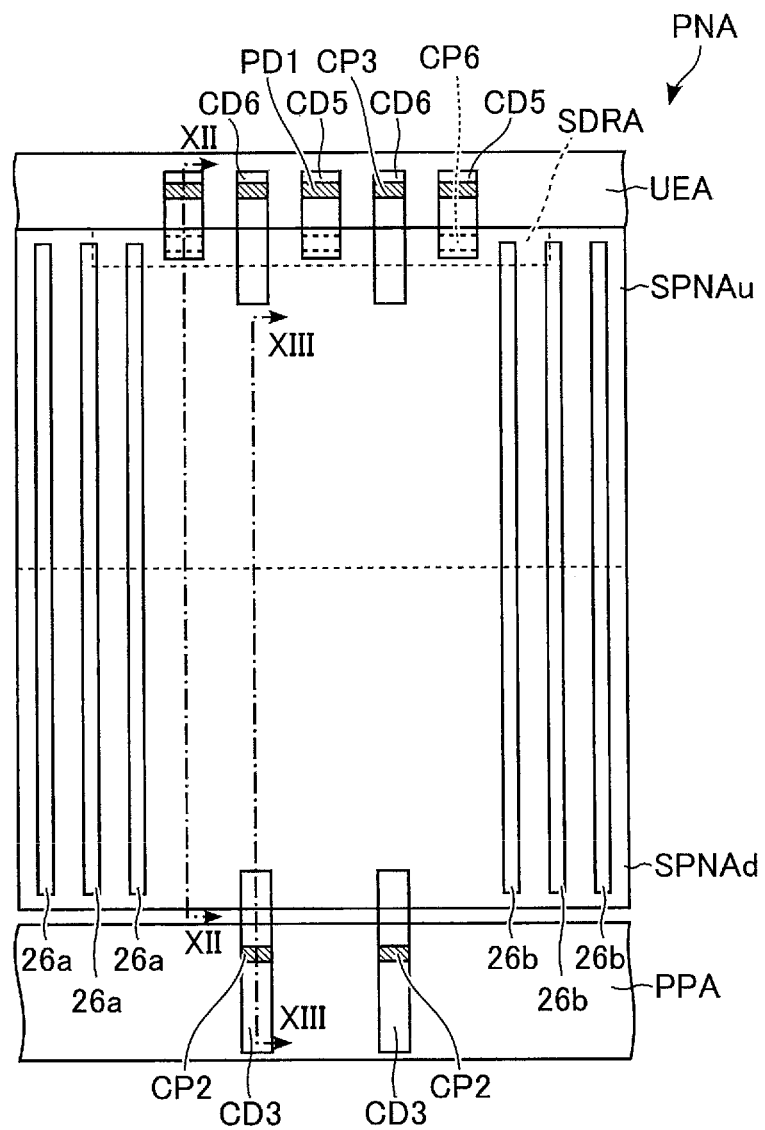
Figure 10:
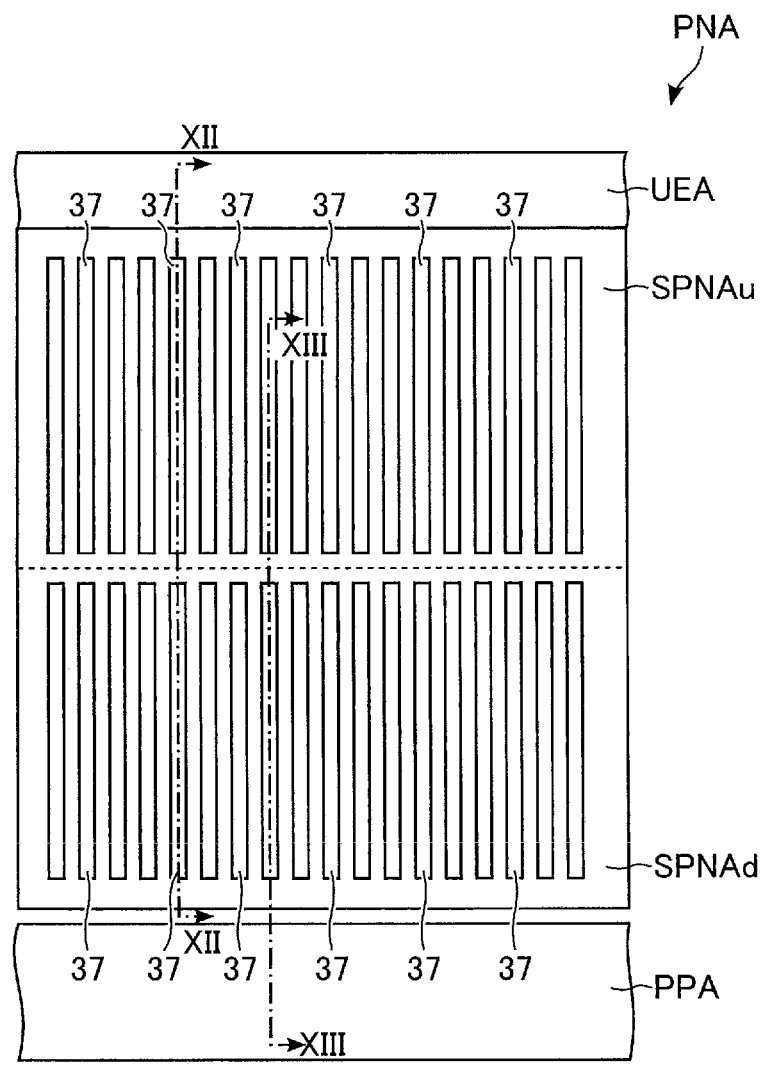

Each of FIG. 6 to FIG. 10 illustrates a layout of a part of, and some components of, the memory device of the first embodiment. Each of FIG. 6 to FIG. 10 illustrates one plane area PNA. The four plane areas PNA have an identical configuration. FIG. 6 to FIG. 10 illustrate areas of different coordinates on the z axis. In some cases, each of FIG. 6 to FIG. 10 illustrates, by using broken lines, components that are located in areas of different coordinates on the z axis from the area illustrated in the Figure. FIG. 6 illustrates a lowermost area along the z axis among the areas illustrated in FIG. 6 to FIG. 10, and illustrates an area including a surface of a semiconductor substrate (to be described later). FIG. 7 illustrates an area above the area illustrated in FIG. 6 on the z axis. FIG. 8 illustrates an area above the area illustrated in FIG. 7 on the z axis. FIG. 9 illustrates an area above the area illustrated in FIG. 6 on the z axis and below the area illustrated in FIG. 7 on the z axis. FIG. 10 illustrates an area above the area illustrated in FIG. 9 on the z axis and below the area illustrated in FIG. 7 on the z axis.

As illustrated in FIG. 6, the plane area PNA includes row decoder areas RDA in a portion including a left end and in a portion including a right end. In some cases, a left-side row decoder area RDA and a right-side row decoder area RDA are referred to as "row decoder area RDAl" and "row decoder area RDAr", respectively. The row decoder area RDA is an area where the row decoder 11 is formed.

The plane area PNA includes sense amplifier areas SAA. The sense amplifier area SAA includes components of the sense amplifier 17 corresponding to the plane area PNA to which the sense amplifier area SAA belongs. For example, the sense amplifier SAA faces a boundary of two sub-plane areas SPNA in one plane area PNA.

The sub-plane area SPNAu includes a source line driver area SDRA. The source line driver area SDRA extends along the upper end of the sub-plane area SPNAu, and extends along the x axis. The source line driver area SDRA is provided with the source line driver SLD. The source line driver area SDRA is provided with contact plugs CP5. The contact plugs CP5 are coupled, at lower surfaces thereof, to the source line driver SLD via conductors.

As illustrated in FIG. 7, each sub-plane area SPNA includes a sub-memory cell array SMCA. In some cases, the sub-memory cell arrays SMCA included in the sub-plane areas SPNAu and SPNAd are referred to as "sub-memory cell array SMCAu" and "sub-memory cell array SMCAd", respectively. The sub-memory cell arrays SMCA in the two sub-plane areas SPNA constituting one plane area PNA are provided with components of the memory cell array 10 corresponding to this plane area PNA.

The plane area PNA includes word line hookup areas WHUA in a portion including a left end and in a portion including a right end. In some cases, the left and right word line hookup areas WHUA are referred to as "word line hookup area WHUAl" and "word line hookup area WHUAr", respectively. The word line hookup areas WHUA are areas where conductors 44 (to be described later) functioning as word lines WL are in contact with contact plugs. The word line hookup areas WHUAl and WHUAr extend along the y axis. For example, the width (a dimension along the x axis) of each of the word line hookup areas WHUAl and WHUAr is less than the width (a dimension along the x axis) of each of the row decoder areas RDAl and RDAr.

As illustrated in FIG. 8, in the sub-plane areas SPNAu and SPNAd, a plurality of conductors CD1 and CD2 are provided. The conductors CD1 and CD2 extend along the y axis. The conductors CD1 and CD2 are alternately arranged one by one along the x axis.

The conductor CD1 is continuous over the sub-plane areas SPNAu and SPNAd. The conductor CD1 functions as a part of the source line SL. One end of the conductor CD1 is located in the upper-end area UEA. In the upper-end area UEA, the conductor CD1 is coupled to an electrically conductive bonding pad PD2 via a conductor.

One end of the conductor CD2 is located in the pad area PPA. A part of the portion of the conductor CD2 which is located in the pad area PPA functions as a pad EPD. The EPD functions as one of external coupling terminals of the memory device 1. The conductor CD2 overlaps a contact plug CP2 in the pad area PPA. The other end of the conductor CD2 is located in the upper-end area UEA. In the upper-end area UEA, the conductor CD2 is coupled to a contact plug CP3.

As illustrated in FIG. 9, in the sub-plane area SPNAd, a plurality of conductors CD3 are provided. The conductors CD3 extend along the y axis. One end of the conductor CD3 is located in the pad area PPA. In the pad area PPA, the conductor CD3 overlaps the contact plug CP2. In the pad area PPA, the conductor CD3 is coupled to the contact plug CP2 via a conductor.

In the sub-plane area SPNAu, a plurality of conductors CD5 and CD6 are provided. The conductors CD5 and CD6 extend along the y axis. The conductors CD5 and CD6 are alternately arranged one by one along the x axis.

One end of the conductor CD5 is located in the upper-end area UEA. In the upper-end area UEA, the conductor CD5 overlaps the conductor CD1 illustrated in FIG. 8. In the upper-end area UEA, the conductor CD5 overlaps a bonding pad PD1. The other end of the conductor CD5 is located in the source line driver area SDRA. In the source line driver area SDRA, the conductor CD5 overlaps a contact plug CP6.

One end of the conductor CD6 is located in the upper-end area UEA. In the upper-end area UEA, the conductor CD6 overlaps the conductor CD2 illustrated in FIG. 8. In the upper-end area UEA, the conductor CD6 overlaps the contact plug CP3.

In the sub-plane areas SPNAu and SPNAd, a plurality of conductors 26a and 26b are provided. The conductors 26a and 26b extend along the y axis and extend over both the sub-plane areas SPNAu and SPNAd. The conductors 26a are located in an area including left ends of the sub-plane areas SPNAu and SPNAd. The conductors 26a are arranged along the x axis. The conductors 26b are located in an area including right ends of the sub-plane areas SPNAu and SPNAd. The conductors 26B are arranged along the x axis.

As illustrated in FIG. 10, a plurality of conductors 37 are provided in each of the sub-plane areas SPNAu and SPNAd. The conductors 37 extend along the y axis and are arranged along the x axis. Each of the conductors 37 in the sub-plane area SPNAu is in contact of none of the conductors 37 in the sub-plane area SPNAd. For example, a certain conductor 37 in the sub-plane area SPNAu is located on an extension line of one conductor 37 in the sub-plane area SPNAd.

FIG. 11 illustrates an example of a planar layout of a part of the memory cell array 10 of the memory device 1 of the first embodiment. FIG. 11 illustrates an area including end portions of conductors functioning as the select gate line SGSL, word lines WL0 to WL7, and select gate line SGDL. FIG. 11 illustrates an area of one block BLK.

As illustrated in FIG. 11, the memory cell array 10 includes a memory area MA and a word line hookup area WHUA. The word line hookup area WHUA and memory area MA are arranged along the x axis. The memory cell array 10 is provided with a plurality of conductors 44, and a plurality of members SLT and SHE. Each conductor 44 functions as a select gate line SGSL, one of word lines WL0 to WL7, or a select gate line SGDL.

The memory area MA is an area including a plurality of NAND strings NS, and is an area where sub-memory cell arrays SMCA are formed. In the memory area MA, a plurality of memory pillars MP are provided. As will be described later, the memory pillar MP is a structure functioning as a part of the memory cell transistor MT.

The members SLT extend along the x axis and are arranged along the y axis. Each member SLT is located at a boundary between mutually neighboring blocks BLK. Each member SLT has, for example, such a structure that an insulator SP and/or a plate-like contact LI is buried. FIG. 11 illustrates an example in which the member SLT includes both the insulator SP and the plate-shaped contact LI. The insulator SP covers a side surface of the contact LI. Each member SLT divides the conductors 44.

The members SHE extend along the x axis and are arranged along the y axis. A plurality of members SHE are located between two mutually neighboring members SLT. FIG. 11 illustrates an example of four members SHE. Both ends of each member SHE are located in the word line hookup areas WHUA. Each member SHE includes, for example, an insulator. Each member SHE divides at least one conductor 44 among the conductors 44. Each area divided by the members SLT and SHE is an area where one string unit SU is formed.

The lengths along the x axis of the select gate line SGSL, word lines WL0 to WL7 and select gate line SGDL are different. Accordingly, in the word line hookup area WHUA, the ends of the select gate line SGSL, word lines WL0 to WL7 and select gate line SGDL are located at different coordinates on the x axis. Thus, each of the select gate line SGSL, word lines WL0 to WL7 and select gate line SGDL includes a portion that overlaps none of the select gate line SGSL, word lines WL0 to WL7 and select gate line SGDL. That portion of each of the select gate line SGSL, word lines WL0 to WL7 and select gate line SGDL, which overlaps none of the select gate line SGSL, word lines WL0 to WL7 and select gate line SGDL, is called "terrace portion". Each of the select gate line SGSL, word lines WL0 to WL7 and select gate line SGDL is put in contact with a contact plug (not illustrated) at the terrace portion.

1.1.6. Cross-Sectional Structure of the Memory Device

FIG. 12 illustrates a cross-sectional structure of a part of the memory device 1 of the first embodiment. Specifically, FIG. 12 illustrates a cross section along line XII-XII in FIG. 8 to FIG. 11.

As illustrated in FIG. 12, the memory device 1 includes a first structure 100, a second structure 200 and a third structure 300, which are arranged along the z axis. The first structure 100 and second structure 200 are separately fabricated and bonded to each other, thereby constituting the structure illustrated in FIG. 12. Specifically, a structure inverted with respect to the xy plane of the second structure 200 is formed on a semiconductor substrate (not illustrated), the formed structure is inverted with respect to the xy plane, and the first structure 100 and the second structure 200 are bonded. Then, the substrate used for the formation of the second structure 200 is removed, and the third structure 300 is further formed.

The first structure 100 includes a substrate 21 of a semiconductor such as silicon, MOSFETs Tr1 and Tr2, conductor sets 22 and 23, a conductor CD5, a contact plug CP5, an insulator 25, and electrically conductive bonding pads PD1 and 27.

In the source line driver area SDRA, the transistor Tr1 is located in a region including an upper surface of the substrate 21 and on the upper surface. The conductor set 22 includes a plurality of conductors. The conductors in the conductor set 22, which neighbor each other along the z axis, are in contact with each other. The conductor set 22 is coupled to the transistor Tr1 and a lower surface of the conductor CD5. The conductor set 22 includes a contact plug CP6. The conductor CD5 is coupled to the bonding pad PD1 via the contact plug CP5.

In the sense amplifier area SAA, the transistor Tr2 is located in a region including an upper surface of the substrate 21 and on the upper surface. The transistor Tr2 functions as a transistor that is included in the sense amplifier 17.

The conductor set 23 includes a plurality of conductors. The conductors in the conductor set 23, which neighbor each other along the z axis, are in contact with each other. The conductor set 23 is in contact with one transistor Tr2 and the bonding pad 27, and electrically couples the transistor Tr2 and the bonding pad 27. The bonding pad 27 is located in the same layer as the bonding pad PD1.

The insulator 25 is located in the layer in which the bonding pads PD1 and 27 are located, and extends along the xy plane.

In a region of the first structure 100, where the above-described components are not provided, an insulator 70, for example, is provided.

The second structure includes an insulator 31, electrically conductive bonding pads PD2 and 32, conductor sets 34 and 35, conductors 37, stacked structures 39, memory pillars MP, a semiconductor 40, conductors 41 and 42, members SLT, conductors 44, and insulators 45.

The insulator 31 is located on an upper surface of the insulator 25, and extends along the xy plane.

The bonding pad PD2 is located in the layer of the insulator 31. A lower surface of the bonding pad PD2 is in contact with an upper surface of the bonding pad PD1.

The conductor set 34 includes a plurality of conductors. The conductors in the conductor set 34, which neighbor each other along the z axis, are in contact with each other. A lower surface of the conductor set 34 is coupled to an upper surface of one bonding pad PD2. An upper surface of the conductor set 34 is located at a height of a lower surface of the semiconductor 40.

The bonding pad 32 is located in the layer of the insulator 31. A lower surface of the bonding pad 32 is in contact with an upper surface of the bonding pad 27.

Each conductor set 35 includes a plurality of conductors. The conductors in the conductor set 35, which neighbor each other along the z axis, are in contact with each other. The conductor set 35 is in contact with an upper surface of one bonding pad 32 and a lower surface of one conductor 37.

Each conductor 37 extends along the y axis, and extends from a position near one end of the sub-plane area SPNA to a position near the other end of the sub-plane area SPNA. Two conductors 37 are located in the yz plane illustrated in FIG. 12. The two conductors 37 face each other at a boundary of the sub-plane areas SPNA, with a distance being provided therebetween. Each conductor 37 functions as one bit line BL. The conductors 37 are also provided in a yz plane different from the yz plane illustrated in FIG. 12. Thus, as described above with reference to FIG. 10, the conductors 37 are arranged along the x axis with distances therebetween.

Each stacked structure 39 is located above the conductor 37 in one sub-plane area SPNA. The stacked structure 39 includes a plurality of conductors 44 and a plurality of insulators 45. The conductors 44 and insulators 45 are alternately provided one by one along the z axis. The conductors 44 and insulators 45 which are arranged along the z axis are in contact with each other. Each stacked structure 39 extends in the xy plane in one sub-plane area SPNA. Two stacked structures 39 face each other at a boundary of the sub-plane areas SPNA, with a distance being provided therebetween. Specifically, the conductors 44 which are located in the same layer in the two stacked structures 39 face each other at the boundary of the sub-plane areas SPNA, with a distance being provided therebetween. Similarly, the insulators 45, which are located in the same layer in the two stacked structures 39, face each other at the boundary of the sub-plane areas SPNA, with a distance being provided therebetween. The distance between the two stacked structures 39 is, for example, greater than the distance between the two conductors 37. Each conductor 44 functions as a word line WL, a select gate line SGDL, or a select gate line SGSL.

The memory pillars MP are located in the stacked structure 39. Each memory pillar MP functions as a part of one NAND string NS. The memory pillar MP, for example, extends along the z axis, and has a columnar shape. The memory pillar MP penetrates or passes through the stacked structure 39, and is located in the stacked structure 39. The memory pillar MP includes a semiconductor, a conductor and an insulator. An upper end of the memory pillar MP is located in the semiconductor 40. A part of the surface of the memory pillar MP is open in the semiconductor 40. In the opening, the semiconductor of the memory pillar MP is in contact with the semiconductor 40. The structure of the memory pillar MP will be described later in greater detail. A lower surface of each memory pillar MP is in contact with the conductor 41.

The member SLT is located in the stacked structure 39. The member SLT, for example, extends along the z axis, and has a plate-like shape extending along the x axis. The member SLT penetrates or passes through the stacked structure 39. An upper end of the member SLT is located in the semiconductor 40. The contact LI of the member SLT is in contact with the semiconductor 40.

The semiconductor 40 is, for example, silicon, includes impurities, and has electrical conductivity. The semiconductor 40 extends in the xy plane, and extends over the two sub-plane areas SPNA. A part of a lower surface of the semiconductor 40 is in contact with an upper surface of each of the two stacked structures 39. The semiconductor 40 functions as a part of the source line SL.

The conductors 42 have columnar shapes. A lower surface of each conductor 42 is in contact with an upper surface of the conductor 41. The conductor 41 has a columnar shape. A lower surface of the conductor 41 is in contact with an upper surface of the conductor 37.

In a region of the second structure 200, where the above-described components are not provided, an insulator 71, for example, is provided.

The third structure 300 includes insulators 51 and 52, a conductor CD1, and a contact plug CP1.

The insulator 51 is located on an upper surface of the semiconductor 40. The insulator 51 is partly open. The openings reach the upper surface of the semiconductor 40.

The conductor CD1 extends along the y axis. The conductor CD1 is partly located on an upper surface of the insulator 51, and is partly located in the openings of the insulator 51. The conductor CD1 comes in contact with the semiconductor 40 in the openings of the insulator 51. In an outside region of the sub-plane area SPNA, the conductor CD1 partly penetrates the semiconductor 40 and comes in contact with an upper surface of the conductor set 34. The part of the conductor CD1 which penetrates the semiconductor 40 and comes in contact with the conductor set 34 functions as the contact plug CP1.

The insulator 52 covers an upper surface of the conductor CD1.

FIG. 13 illustrates a cross-sectional structure of a part of the memory device 1 of the first embodiment. Specifically, FIG. 13 illustrates a cross section along line XIII-XIII in FIG. 8 to FIG. 10.

The first structure 100 further includes a contact plug 24, and a bonding pad 28 of a conductor. A conductor CD4 and the contact plug 24 are located above the substrate 21 in the pad area PPA. The contact plug 24 is located on an upper surface of a conductor CD3. The bonding pad 28 is located on an upper surface of the contact plug 24. The bonding pad 28 is located in the layer in which the insulator 25 is located.

The second structure 200 further includes an electrically conductive bonding pad 33 and a conductor set 36.

The bonding pad 33 is located in the layer in which the insulator 31 is located. A lower surface of the bonding pad 33 is in contact with an upper surface of the bonding pad 28.

Each conductor set 36 includes a plurality of conductors. The conductors in the conductor set 36, which neighbor each other along the z axis, are in contact with each other. A lower surface of the conductor set 36 is in contact with an upper surface of one bonding pad 33.

The third structure 300 further includes a conductor CD2 and a contact plug CP2. The conductor CD2 extends along the y axis. The conductor CD2 is partly located on an upper surface of the insulator 51, and is partly located in the openings of the insulator 51. In the pad area PPA, the conductor CD2 penetrates the semiconductor 40 and comes in contact with an upper surface of the conductor set 36. That part of the conductor CD2 which penetrates the semiconductor 40 and comes in contact with the conductor set 36 functions as the contact plug CP2.

In the pad area PAA, the insulator 52 is partly open. The opening reaches an upper surface of the conductor CD2. That part of the conductor CD2, which is open in the insulator 52, functions as the pad EPD.

FIG. 14 illustrates a cross-sectional structure of a part of the memory device 1 of the first embodiment. Specifically, FIG. 14 illustrates a cross section along line XIV-XIV in FIG. 5.

The stacked structures 39 of the sub-plane areas SPNA arranged along the x axis are independent from each other. Specifically, each of the conductors 44 and insulators 45 of each sub-plane area SPNA is independent from each of the conductors 44 and insulators 45 of a neighboring sub-plane area SPNA along the x axis.

One conductor 44 and one insulator 45, which are arranged along the z axis, constitute one pair. Hereinafter, in some cases, this pair is referred to as "conductor-insulator pair". In each sub-plane area SPNA, left ends of the conductors 44 and insulators 45 have stepped shapes. Specifically, a left end of each conductor-insulator pair located in a certain first layer is located more to the left side than a left end of a conductor-insulator pair located in a second layer that is immediately below the first layer. Similarly, in each sub-plane area SPNA, right ends of the conductors 44 and insulators 45 have stepped shapes. Specifically, a right end of each conductor-insulator pair located in a certain first layer is located more to the right side than a right end of a conductor-insulator pair located in a second layer that is immediately below the first layer. As a result, each conductor 44 includes, at an end thereof, a terrace that is not covered by the conductor-insulator pair. Each conductor 44 is in contact with an upper surface of a contact plug 55 in the terrace portion. A lower surface of each contact plug 55 is in contact with an upper surface of one conductor 56. A region where the terrace portions and the contact plugs 55 are located is the word line hookup area WHUA.

The conductors 26a and 26b are located in a region above the transistors Tr2 and below the insulator 25. The conductors 26a and 26b function as parts of interconnects CG, which will be described later with reference to FIG. 19.

FIG. 15 illustrates an example of a detailed cross-sectional structure of a part of the memory device 1 of the first embodiment. Specifically, FIG. 15 illustrates the bonding pads PD1 and PD2 and a periphery thereof. The bonding pads 27 and 32 have the features as described below, and the description of the bonding pads PD1 and PD2 also applies to the bonding pads 27 and 32.

As illustrated in FIG. 15, the bonding pads PD1 and PD2 have different shapes. Specifically, the bonding pad PD1 has an inverse taper shape, and the bonding pad PD2 has a taper shape. In other words, the radius of the upper surface of the bonding pad PD1 and/or the area along the xy plane thereof are greater than the radius of the lower surface of the bonding pad PD1 and/or the area along the xy plane thereof. On the other hand, the radius of the upper surface of the bonding pad PD2 and/or the area along the xy plane thereof are less than the radius of the lower surface of the bonding pad PD2 and/or the area along the xy plane thereof.

The difference in shape between the bonding pads PD1 and PD2 occurs due to the difference in direction of etching at a time of forming the bonding pads PD1 and PD2. Specifically, while the second structure 200 is formed on the substrate, the second structure 200 has such a structure that the structure illustrated in FIG. 12 is inverted with respect to the xy plane. Thus, a hole for forming the bonding pad PD2 has an inverse taper shape. However, when the second structure 200 and the substrate thereof are bonded to the first structure 100, the second structure 200 and the substrate thereof are inverted with respect to the xy plane, and thus the bonding pad PD2 has a taper shape.

The bonding pads PD1 and PD2 may be displaced in position along the xy plane, based on a misalignment at a time when the first structure 100 is bonded to the set of the second structure 200 and the substrate that is the base of the second structure 200. Thus, the upper surface of the bonding pad PD1 and the lower surface of the bonding pad PD2 may have a step at the interface thereof.

The bonding pads PD1 and PD2 may be formed separately or may be formed as one piece. The bonding pad PD1 may be directly coupled to the conductor CD5, without the contact plug CP5 being interposed. The bonding pad PD1 and the conductor CD5 may be coupled by a plurality of contact plugs CP5. The bonding pad PD2 may be coupled to a conductor 341 of the conductor set 34, without a contact plug 342 of the conductor set 34 being interposed. The bonding pad PD2 and the conductor 341 may be coupled by a plurality of contact plugs 342.

FIG. 16 illustrates a cross-sectional structure of the memory cell array 10 of the memory device 1 of the first embodiment.

As illustrated in FIG. 16, the insulators 45 and the conductors 44 are alternately located one by one on the upper surface of the insulator 71. In the example of FIG. 16, the conductors 44 function as the select gate line SGSL, word lines WL7, WL6, WL5, WL4, WL3, WL2, WL1 and WL0, and select gate line SGDL in the order from the side close to the semiconductor 40. Two or more conductors 44 may function as the select gate line SGSL or SGDL.

The memory pillar MP includes a core 101, a semiconductor 102, a tunnel insulator 103, a charge accumulation layer 104, a block insulator 105 and a conductor 106.

The core 101 extends along the z axis and has a columnar shape.

The semiconductor 102 functions as channel regions of the memory cell transistors MT and select gate transistors DT and ST. The semiconductor 102 covers a side surface of the core 101.

The tunnel insulator 103 covers a surface of the semiconductor 102. The charge accumulation layer 104 covers a surface of the tunnel insulator 103.

The block insulator 105 covers a surface of the charge accumulation layer 104. A side surface of the block insulator 105 is in contact with the conductors 44 and insulators 45. A part of the set of the semiconductor 102, tunnel insulator 103, charge accumulation layer 104 and block insulator 105 which faces the conductor 44 functions as the memory cell transistor MT, select gate transistor DT, or select gate transistor St.

The tunnel insulator 103, charge accumulation layer 104 and block insulator 105 are open in a semiconductor 40B, and the semiconductor 40B is partly located in the opening. In the opening, the semiconductor 40B and the semiconductor 102 are in contact with each other.

The conductor 106 is located on an upper surface of the conductor 42. The core 101 and semiconductor 102 are located on an upper surface of the conductor 106.

The semiconductor 40 includes, for example, semiconductors 40A, 40B and 40C. The semiconductor 40C is located on an upper surface of the uppermost insulator 45. The semiconductor 40B is located on an upper surface of the semiconductor 40C. The semiconductor 40A is located on an upper surface of the semiconductor 40B.

1.1.7. Sub-Memory Cell Array

FIG. 17 illustrates an example of components of the memory device of the first embodiment, and allocation of addresses to the components. As described in detail with reference to FIG. 5, components of one plane PLN are formed in two sub-plane areas SPNA in each plane area PNA. Thus, an identical plane address PLNA is allocated to the two sub-memory cell arrays SMCAu and SMCAd in which the components of one plane PLN are formed.

FIG. 18 illustrates an example of components in the memory cell array of the memory device 1 of the first embodiment, and allocation of addresses to the components. FIG. 18 illustrates one plane PLN. As illustrated in FIG. 18, each of the sub-memory cell arrays SMCAu and SMCAd is formed of a set of half blocks HBLK. The half block HBLK is formed of a half of the block BLK. In some cases, the half blocks HBLK of the sub-memory cell arrays SMCAu and SMCAd are referred to as "half block HBLKe" and "half block HBLKo", respectively.

The half block HBLKe of the sub-memory cell array SMCAu is formed of a first half of each of the blocks BLK_0 to BLK_n−1. The half block HBLKo of the sub-memory cell array SMCAd is formed of a second half of each of the blocks BLK_0 to BLK_n−1.

Each half block HBLK is formed of a plurality of half cell-units HCU. The half cell-units HCU is formed of memory cell transistors MT, the number of which is half the number of memory cell transistors MT that constitute the cell unit CU. Thus, when each memory cell transistor MT stores one-bit data, the half cell-unit HCU stores data of half the size of one page, i.e. data of a half page. When each memory cell transistor MT stores p-bit data, the half cell-unit HCU stores a p-number of half page data.

A set of common page addresses PGA are allocated to the set of half cell-units HCU of the half block HBLKe and the set of half cell-units HCU of the half block HBLKo. In other words, page addresses PGA0 to PGAt (t is a positive integer) are allocated to the half cell-units HCU of each half block HBLKe, and the page addresses PGA0 to PGAt are also allocated to the half cell-units HCU of each half block HBLKo.

An m/2 number of bit lines BL are located in each sub-memory cell array SMCA. The bit lines BL extend over all half blocks HBLK in each sub-memory cell array SMCA. As described with reference to FIG. 2, m is the number of bit lines BL included in one block BLK, and is the number of memory cell transistors MT that constitute one cell unit CU, and is, for example, 16 kB. Accordingly, in each half block HBLK, m/2 memory cell transistors MT, for example, 8 kB memory cell transistors MT, are arranged in the direction in which the bit lines BL are arranged. The memory cell transistors MT of the half block HBLKe are coupled to, for example, bit lines BL of successive addresses, and are coupled to, for example, bit lines BL_0 to BL_m/2−1. The memory cell transistors MT of the half block HBLKo are coupled to, for example, bit lines BL of successive addresses, and are coupled to, for example, bit lines BL_m/2 to BL_m−1.

By the above configuration, as illustrated in FIG. 19, the sub-memory cell array SMCAu includes the half blocks HBLKe_0 to HBLKe_n−1, and the sub-memory cell array SMCAd includes the half blocks HBLKo_0 to HBLKo_n−1. Here, n is an integer of 2 or more. The half block HBLKe_0 and the half block HBLKo_0 are selected by a block address BA_0 of the block BLK_0. Similarly, in all cases in which $\alpha$ is 0 to n−1, a half block HBLKe_$\alpha$ and a half block HBLKo_$\alpha$ are selected by a block address BA_$\alpha$ of a block BLK_$\alpha$.

On the other hand, the two sub-memory cell arrays SMCA include a set of bit lines BL having mutually independent bit line addresses. The bit line addresses are designated by column addresses. For example, the sub-memory cell array SMCA includes bit lines BL_0 to BL_m/2. The sub-memory cell array SMCA includes bit lines BL_m/2+1 to BL_m−1.

By the above allocation of addresses, the half cell-unit HCU of each of the two sub-memory cell arrays SMCA can be selected by the designation of one plane address PLNA, one block address BA and one page address PGA. FIG. 19 illustrates an example in which a block address BA_0 and a page address PGA_1 are designated. By this designation of addresses, a half cell-unit HCU_1 of the half block HBLKe_0 and a half cell-unit HCU_1 of the half block HBLKo_0 are selected.

Thus, in the case of data read, by designating one plane address PLNA, one block address BA and one page address PGA, data of a half page size can be read from each of the two selected half cell-units HCU, that is, data of one-page size in total can be read.

In the case of data write, by designating one plane address PLNA, one block address BA and one page address PGA, data of one-page size in total can be written to two half cell-units HCU.

In the case of data erase, by designating one plane address PLNA and one block address BA, data of two half blocks HBLK, i.e. data of one block BLK, can be erased.

1.1.8. Row Decoder

FIG. 20 illustrates components of the row decoder of the memory device 1 of the first embodiment, and a coupling of the components. FIG. 20 also illustrates blocks BLK. As illustrated in FIG. 20, the row decoder 11 includes an n-number of block decoders BD_0 to BD_n−1, and an n-number of transfer switch sets XSG_0 to XSG_n−1. As described above, n is the number of blocks BLK included in one plane PLN.

The block decoder BD is a circuit that decodes the block address BA and outputs a block select signal BSS, based on the decoded result. Each block decoder BD is associated with one block BLK. Each block decoder BD executes control to set the associated block BLK in a selected state. The block decoder BD_0 supplies the block select signal BSS_0 to the transfer switch set XSG_0. Similarly, in each of cases in which $\alpha$ is 1 to n−1, a block decoder BD_$\alpha$ supplies a block select signal BSS_$\alpha$ to a transfer switch circuit XSG_$\alpha$. When the block address BA designates the block BLK with which the block decoder BD is associated, the block decoder BD outputs a block select signal BSS that is asserted.

The transfer switch set XSG is a set of transfer switches XS. Each transfer switch set XSG is associated with one block BLK. Based on the block select signal BSS, each transfer switch set XSG sets the block BLK with which the transfer switch set XSG is associated in a selected state.

Each transfer switch set XSG includes a plurality of transfer switches XSD, a plurality of transfer switches XSW, and one transfer switch XSS. The transfer switches XSD, XSW and XSS are, for example, n-type MOSFETs. Each transfer switch XSD is coupled between the select gate line SGDL and an interconnect SGD. Each transfer switch XSW is coupled between one word line WL and one interconnect CG. The transfer switch XSS is coupled between the select gate line SGSL and an interconnect SGS. The transfer switches XSD, XSW and XSS receive the block select signal BSS by the gates thereof.

The interconnects SGD, CG and SGS receive voltages from the driver 15.

By a certain block select signal BSS being asserted, the transfer switches XSD, XSW and XSS that receive this block select signal BSS are turned on. Thereby, the voltages of the interconnects SGD, CG and SGS are transferred to the select gate lines SGDL, word lines WL and select gate lines SGSL of the selected block BLK.

FIG. 21 illustrates in greater detail the components of the row decoder of the memory device 1 of the first embodiment, and the coupling of the components. FIG. 21 illustrates a configuration of each block BLK, and representatively illustrates the block BLK0. The other blocks BLK have the configuration illustrated in FIG. 21.

Based on the fact that the block BLK is divided into two half blocks HBLK, each half block HBLK is provided with the set of the block decoder BD and the transfer switch set XSG. Specific details are as follows.

The block decoder BD_0 includes block decoders BDe_0 and BDo_0. The block decoders BDe_0 and BDo_0 have the same configuration as each block decoder BD described with reference to FIG. 20. When a received block address BA designates the block BLK_0 with which each of the block decoders BDe_0 and BDo_0 is associated, the block decoders BDe_0 and BDo_0 output block select signals BSSe_0 and BSSo_0 that are asserted, respectively.

The transfer switch set XSG includes transfer switch sets XSGe_0 and XSGo_0. The transfer switch sets XSGe_0 and XSGo_0 have the same configuration as each transfer switch set XSG described with reference to FIG. 20.

The transfer switches XSD, XSW and XSS of the transfer switch set XSGe_0 are coupled to the select gate line SGDL, word lines WL and select gate line SGSL of the half block HBLKe_0. The transfer switches XSD, XSW and XSS of the transfer switch set XSGe_0 receive the block select signal BSSe_0 by the gates thereof.

The transfer switches XSD, XSW and XSS of the transfer switch set XSGo_0 are coupled to the select gate line SGDL, word lines WL and select gate line SGSL of the half block HBLKo_0. The transfer switches XSD, XSW and XSS of the transfer switch set XSGo_0 receive the block select signal BSSo_0 by the gates thereof.

FIG. 22 illustrates the components of the row decoder of the memory device 1 of the first embodiment, and the coupling of the components. FIG. 22 illustrates two sub-plane areas SPNAu and SPNAd in which the components of one plane PLN are formed.

A portion of the row decoder area RDAl which is included in the sub-plane area SPNAu includes n/2 block decoders BDe. The n/2 block decoders BDe are block decoders BDe_0, BDe_2, BDe_4, . . . , BDe_n−2 for even-numbered block addresses BA, i.e. block addresses BA_0, BA_2, BA_4, . . . , BA_n−2.

A portion of the row decoder area RDAl which is included in the sub-plane area SPNAu includes n/2 transfer switch sets XSGe. The n/2 transfer switch sets XSGe are transfer switch sets XSGe_0, XSGe_2, XSGe_4, . . . , XSGe_n−2 for even-numbered block addresses BA, i.e. block addresses BA_0, BA_2, BA_4, . . . , BA_n−2.

A portion of the row decoder area RDAr which is included in the sub-plane area SPNAu includes n/2 block decoders BDe. The n/2 block decoders BDe are block decoders BDe_1, BDe_3, BDe_5, . . . , BDe_n−1 for odd-numbered block addresses BA, i.e. block addresses BA_1, BA_3, BA_5, . . . , BA_n−1.

A portion of the row decoder area RDAr which is included in the sub-plane area SPNAu includes n/2 transfer switch sets XSGe. The n/2 transfer switch sets XSGe are transfer switch sets XSGe_1, XSGe_3, XSGe_5, . . . , XSGe_n−1 for odd-numbered block addresses BA, i.e. block addresses BA_1, BA_3, BA_5, . . . , BA_n−1.

A portion of the row decoder area RDAl which is included in the sub-plane area SPNAd includes n/2 block decoders BDo. The n/2 block decoders BDo are block decoders BDo_0, BDo_2, BDo_4, . . . , BDo_n−2 for even-numbered block addresses BA, i.e. block addresses BA_0, BA_2, BA_4, . . . , BA_n−2.

A portion of the row decoder area RDAl which is included in the sub-plane area SPNAd includes n/2 transfer switch sets XSGo. The n/2 transfer switch sets XSGo are transfer switch sets XSGo_0, XSGo_2, XSGo_4, . . . , XSGo_n−2 for even-numbered block addresses BA, i.e. block addresses BA_0, BA_2, BA_4, . . . , BA_n−2.

A portion of the row decoder area RDAr which is included in the sub-plane area SPNAd includes n/2 block decoders BDo. The n/2 block decoders BDo are block decoders BDo_1, BDo_3, BDo_5, . . . , BDo_n−1 for odd-numbered block addresses BA, i.e. block addresses BA_1, BA_3, BA_5, . . . , BA_n−1.

A portion of the row decoder area RDAr which is included in the sub-plane area SPNAd includes n/2 transfer switch sets XSGo. The n/2 transfer switch sets XSGo are transfer switch sets XSGo_1, XSGo_3, XSGo_5, . . . , XSGo_n−1 for odd-numbered block addresses BA, i.e. block addresses BA_1, BA_3, BA_5, . . . , BA_n−1.

1.2. Operation

FIG. 23 illustrates one state during an operation in the memory device of the first embodiment. FIG. 23 illustrates two sub-plane areas SPNA in which the components of one plane PLN are formed. FIG. 23 illustrates a state in which one block BLK is selected. FIG. 23 illustrates a state in which a block address BA_1 is designated.

As illustrated in FIG. 23, by the receipt of the block address BA_1, the block decoders BDe_1 and BDo_1 are activated. By the activation, the block decoder BDe_1 asserts a block select signal BSSe_1, and the block decoder BDo_1 asserts a block select signal BSSo_1. The other block select signals BSS are negated. As a result, a transition occurs to the state in which a half block HBLKo_1 and a half block HBLKe_1 are selected. In other words, a transition occurs to the state in which voltages of the interconnects CG, SGD and SGS are transferred to the half block HBLKo_1 and half block HBLKe_1.

Voltages based on the operation of the memory device 1 and the address information ADD are applied to the interconnects CG, SGD and SGS by the driver 15. For example, a voltage of a magnitude based on the operation is applied to a word line WL coupled to a cell unit CU of a read and write target of data of data read and data write, i.e. a selected cell unit CU. In addition, a voltage for selection is applied to the select gate line SGDL of the string unit SU including the selected cell unit CU. Furthermore, various voltages are applied to the word lines WL other than the word line WL coupled to the selected cell unit CU. The driver 15 applies voltages of various patterns to the interconnects CG, SGD and SGS, such that voltages determined based on the operation and the address of the selected word line WL are applied to the select gate line SGDL and word lines WL. The voltages of the interconnects CG, SGD and SGS, to which voltages of patterns based on the operation and address information ADD are applied, are transferred by the transfer switch sets XSG to the word lines WL of the selected half blocks HBLK and the select gate lines SGDL and SGSL.

1.3. Advantages (Advantageous Effects)

According to the first embodiment, a memory device that reads data at high speed can be provided, as described below.

A memory device that reads one-page data of a size of 16 kB from a memory cell array in response to the receipt of one command set may include the following configuration. Specifically, 16 kB memory cell transistors of read targets, which store data of a size of one page, are coupled to one word line. In addition, a voltage is applied to each word line via one switch. The length in the X direction of the word line depends on the size of one page. Thus, if the size of one page is large, the length of the word line is large, and a long time is required to charge the word line.

In the memory cell array 10 of the memory device 1 of the first embodiment, memory cell transistors of half the read targets, which store data of a half page size, are coupled to one word line in each string unit SU. When one-page data is read, two word lines WL are driven. The size of a half page is 8 kB, based on an example in which the one-page size is 16 kB. Thus, in each string unit SU functioning as a unit of each data read, the memory cell transistors MT of the half cell-unit HCU that is the read target, i.e. 8 kB memory cell transistors MT of the read target, are arranged along each word line WL in the direction in which the bit lines BL are arranged. The length in the X direction of each word line WL is shorter than in the case where the 16 kB memory cell transistors of the read target, which store data of a one-page size, are coupled to one word line. The word lines WL are not electrically coupled to each other, and are not in contact with each other. Thus, the time necessary for charging based on the capacitance of the word line WL, and, by extension, the resistance (R) and capacitance (C) of the word line WL (or the delay (RC delay) of charging based on the resistance (R) and capacitance (C)) is shorter than the time necessary for charging the word line in the case where the 16 kB memory cell transistors of the read target are coupled to one word line. This enables the memory device 1 to read data in a short time.

Two sub-memory cell arrays SMCA, in which components of one plane PLN are formed, have an identical plane address PLNA, an identical set of block addresses BA, and an identical set of page addresses PGA. Thus, by designating one plane address PLNA, one block address BA and one page address PGA, the half cell-unit HCU of each of the two sub-memory cell arrays SMCA can be selected. Therefore, by using the same commands as in the conventional art, it is possible to read one-page data, to write data to one page, and to erase data of one block BLK.

One conductor 37 and the other conductor 37 of the two sub-plane areas SPNA in which the components of one plane PLN are formed are not in contact with each other. Thus, the conductor 37 in one sub-plane area SPNA and the conductor 37 in the other sub-plane area SPNA can function as different bit lines BL. By making use of this, in the sub-plane area SPNA, even if only the memory cell transistors MT of the half cell-unit HCU are arranged in the direction in which the bit lines BL are arranged, two different half cell-units HCU are formed by two sub-plane areas SPNA, and one cell unit CU is formed by the two half cell-units HCU.

The memory device 1 includes the conductor CD1 that is continuous over two sub-plane areas SPNA in which the components of one plane PLN are formed. The conductor CD1 functions as a part of the source line SL. Specifically, the source line SL is shared by the sub-memory cell arrays SMCA in the sub-plane areas SPNA in which the components of one plane PLN are formed. Thus, the source line driver SLD can be shared by the two sub-memory cell arrays SMCA. This means that two source line drivers SLD are not needed to drive the source lines SL of the two sub-memory cell arrays SMCA, and one source line driver SLD is sufficient. Thus, the source line driver SLD for the two sub-memory cell arrays SMCA can be provided not in the lower-side sub-plane area SPNAd, in which many components are crowded, but in the upper-side sub-plane area SPNAu of the two sub-plane areas SPNA, in which the components of one plane PLN are formed. Therefore, the arrangement of the components of the memory device 1 is easy.

1.4. Modifications

The cross-sectional structure of the memory device 1 is not limited to the cross-sectional structure illustrated in FIG. 12 and FIG. 14, and other structures may be adopted.

1.4.1 First Modification

FIG. 24 illustrates a cross-sectional structure of a memory device 1 of a first modification of the first embodiment. Like FIG. 12, FIG. 24 illustrates a cross section along the yz plane. As illustrated in FIG. 24, a slit SLT is provided between the two stacked structures 39 of the two sub-plane areas SPNA. The two stacked structures 39 are electrically isolated by the slit SLT. In the first modification, for example, the distance between the two stacked structures 39 is less than the distance between the two stacked structures 39 in the structure illustrated in FIG. 12. In addition, for example, in the first modification, like the structure illustrated in FIG. 12, the distance between the two stacked structures 39 sandwiching the slit SLT is greater than, for example, the distance between the two conductors 37.

1.4.2. Second Modification

FIG. 25 illustrates a cross-sectional structure of a memory device 1 of a second modification of the first embodiment. Like FIG. 12, FIG. 25 illustrates a cross section along the yz plane. The memory device 1 of the second modification does not include the third structure 300. On the other hand, the second structure 200 of the memory device 1 of the second modification further includes a substrate 80 of a semiconductor such as silicon. For example, as described with reference to FIG. 12, the substrate 80 is a substrate functioning as a base on which the structure excluding the substrate 80 of the second structure 200 is formed. In the second modification, unlike the basic mode of the first embodiment, the substrate 80 is not removed even after the second structure 200 and the first structure 100 are bonded. The semiconductor 40 is implemented as a well formed in the substrate 80.

1.4.3. Third Modification

FIG. 26 and FIG. 27 illustrate cross-sectional structures of a memory device 1 of a third modification of the first embodiment. Like FIG. 12, FIG. 26 illustrates a cross section along the yz plane. Like FIG. 14, FIG. 27 illustrates a cross section along the xz plane.

As illustrated in FIG. 26, an upper surface of the conductor set 23 is coupled to a lower surface of a conductor 61. The conductor 61 extends along the y axis, and extends from a position near one end of the sub-plane area SPNA to a position near the other end of the sub-plane area SPNA. Like the conductors 37, two conductors 61 face each other at a boundary of the sub-plane areas SPNA, with a distance being provided therebetween. Each conductor 61 functions as a part of the bit line BL. The conductors 61 are also provided in a yz plane different from the yz plane illustrated in FIG. 26, and thus the conductors 16 are arranged along the x axis with distances therebetween.

In a region outside the stacked structure 39, the upper surface of the conductor 61 is coupled to a lower surface of a contact plug 63.

A semiconductor 62 is provided on an upper surface of the insulator 25. The semiconductor 62 corresponds to the semiconductor 40 of FIG. 12, and, like the semiconductor 40, extends along the xy plane and extends over the two sub-plane areas SPNA. The semiconductor 62 includes impurities, and has electrical conductivity.

The set of the stacked structure 39, memory pillar MP, member SLT, conductor 41 and conductor 42 has such a structure that the set of the stacked structure 39, memory pillar MP, member SLT, conductor 41 and conductor 42 illustrated in FIG. 12 is inverted with respect to the xy plane. Specific details are as follows. A lower end of the memory pillar MP is located in the semiconductor 62. A part of the surface of the memory pillar MP is open in the semiconductor 62. In the opening, the semiconductor of the memory pillar MP is in contact with the semiconductor 62. A lower end of the member SLT is located in the semiconductor 62. The conductor of the member SLT is in contact with the semiconductor 62. The conductor 42, at an upper surface thereof, is in contact with a lower surface of the conductor 41. An upper surface of the conductor 41 is in contact with a lower surface of a conductor 64.

Each conductor 64 extends along the y axis, and extends from a position near one end of the sub-plane area SPNA to a position near the other end of the sub-plane area SPNA. Like the conductors 61, two conductors 64 face each other at a boundary of the sub-plane areas SPNA, with a distance being provided therebetween. Each conductor 64 functions as the bit line BL. The conductors 64 are also provided in a yz plane different from the yz plane illustrated in FIG. 26. Thus, the conductors 64 are arranged along the x axis with distances therebetween, like the conductors 37 described with reference to FIG. 10 in the basic mode of the first embodiment.

Each conductor 64, at a lower surface thereof, is in contact with the upper surface of the conductor 41. The lower surface of the conductor 41 is in contact with the conductor 42. The lower surface of the conductor 42 is in contact with an upper surface of the contact plug 63.

As illustrated in FIG. 27, in each sub-plane area SPNA, right ends and left ends of the conductors 44 and insulators 45 have stepped shapes. However, the stepped shapes are different from the stepped shapes illustrated in FIG. 14, since the stacked structure 39 has a vertically inverted structure, compared to the stacked structure 39 illustrated in FIG. 12. Specific details are as follows. A left end of each conductor-insulator pair located in a certain first layer is located more to the left side than a left end of a conductor-insulator pair located in a second layer that is immediately above the first layer. Similarly, a right end of each conductor-insulator pair located in a certain first layer is located more to the right side than a right end of a conductor-insulator pair located in a second layer that is immediately above the first layer. As a result, each conductor 44 includes, at an end thereof, a terrace portion that is not covered by the conductor-insulator pair. Each conductor 44 is in contact with a lower surface of a contact plug 67 in the terrace portion. An upper surface of each contact plug 67 is in contact with a lower surface of one conductor 68.

1.4.4. Fourth Modification

A fourth modification is based on the third modification.

FIG. 28 illustrates a layout of a part of, and some components of, a memory device 1 of the fourth modification of the first embodiment. FIG. 28 illustrates the same area as the area illustrated in FIG. 6 with respect to the position on the z axis. As illustrated in FIG. 28, each of the sub-plane areas SPNAu and SPNAd includes a sense amplifier area SAA. The sense amplifier area SAA of the sub-plane area SPNAu faces a boundary between the sub-plane areas SPNAu and SPNAd. The sense amplifier area SAA of the sub-plane area SPNAd faces the boundary between the sub-plane areas SPNAu and SPNAd.

FIG. 29 illustrates a cross-sectional structure of the memory device 1 of the fourth modification of the first embodiment. Like FIG. 12, FIG. 29 illustrates a cross section along the yz plane. As illustrated in FIG. 29, unlike the third modification (FIG. 26), each set of the conductors 41 and 42 and contact plug 63 is located in a region immediately above the sense amplifier area SAA. For example, each set of the conductors 41 and 42 and contact plug 63 is located immediately-above the conductor set 23 along the z axis. Based on this, the conductor 61 does not extend along the x axis. In addition, the semiconductor 62 is provided for each sub-plane area SPNA. Two semiconductors 62 of two sub-plane areas SPNA are arranged with a distance at the boundary of the sub-plane areas SPNA. Since the two semiconductors 62 of the two sub-plane areas SPNA function as parts of the source line SL of one plane PLN, the two semiconductors 62 have the same potential. Thus, the semiconductors 62 are coupled to each other via a conductor in a region not illustrated in FIG. 29. For example, a conductor is provided above the conductor 64, and this conductor is coupled to both of the two semiconductors 62 via a contact plug and/or a conductor set.

The contact plug 63 is located in a region between the semiconductors 62.

1.4.5. Fifth Modification

A fifth modification is based on the third modification.

FIG. 30 illustrates a layout of a part of, and some components of, a memory device 1 of the fifth modification of the first embodiment. FIG. 30 illustrates the same area as the area illustrated in FIG. 6 with respect to the position on the z axis. As illustrated in FIG. 30, each of the sub-plane areas SPNAu and SPNAd includes a sense amplifier area SAA. The sense amplifier area SAA of the sub-plane area SPNAu faces, or is in contact with, the source line driver area SDRA. The sense amplifier area SAA of the sub-plane area SPNAd is located in a region including a lower end of the sub-plane area SPNAd.

FIG. 31 illustrates a cross-sectional structure of the memory device 1 of the fifth modification of the first embodiment. Like FIG. 12, FIG. 31 illustrates a cross section along the yz plane. As illustrated in FIG. 31, the sense amplifier area SAA is located in a region under the set of the conductors 41 and 42 and contact plug 63. Specifically, unlike the third modification (FIG. 26), the transistor Tr2 is located under the set of the conductors 41 and 42 and contact plug 63.

1.4.6. Sixth Modification

A sixth modification is based on the third modification.

FIG. 32 illustrates a layout of a part of, and some components of, a memory device 1 of the sixth modification of the first embodiment. FIG. 32 illustrates the same area as the area illustrated in FIG. 6 with respect to the position on the z axis. As illustrated in FIG. 32, each of the sub-plane areas SPNAu and SPNAd includes a sense amplifier area SAA. The sense amplifier area SAA of the sub-plane area SPNAu is located in a region including the center of the sub-plane area SPNAu on the y axis. The sense amplifier area SAA of the sub-plane area SPNAd is located in a region including the center of the sub-plane area SPNAd on the y axis.

FIG. 33 illustrates a cross-sectional structure of the memory device 1 of the sixth modification of the first embodiment. Like FIG. 12, FIG. 33 illustrates a cross section along the yz plane. As illustrated in FIG. 33, in each sub-plane area SPNA, the stacked structure 39 is composed of two parts. The two parts of the stacked structure 39 are not coupled, with a distance being provided therebetween. Similarly, in each sub-plane area SPNA, the semiconductor 62 is composed of two parts. The two parts of the semiconductor 62 are not coupled, with a distance being provided therebetween. The two parts of the semiconductor 62 are located under the two parts of the stacked structure 39, respectively. Since the two parts of the semiconductor 62 in each sub-plane area SPNA function as parts of the source line SL of one plane PLN, the two semiconductors 62 have the same potential. Thus, the two parts of the semiconductor 62 in each sub-plane area SPNA are coupled to each other via a conductor in a region not illustrated in FIG. 33. For example, a conductor is provided above the conductor 64, and this conductor is coupled to both of the two parts of the semiconductor 62 via a contact plug and/or a conductor set.

The sense amplifier SAA is located in a region under a region between the two parts of the stacked structure 39 and under a region between the two parts of the semiconductor 62. In addition, each set of the conductors 41 and 42 and contact plug 63 is located in the region between the two parts of the stacked structure 39 and in the region between the two parts of the semiconductor 62.

2. Second Embodiment

A second embodiment relates to the details of the operation of the memory device 1 of the first embodiment.

The memory device 1 of the second embodiment has the same configuration as the memory device 1 of the first embodiment. However, some components of the memory device 1 of the second embodiment and the memory controller 2 are configured to be capable of executing operations described below.

FIG. 34 illustrates an example of signals transmitted and received between the memory device 1 of the second embodiment and the memory controller 2. Specifically, FIG. 34 illustrates a write command set of a first type and a ready/busy signal. The write command set of the first type is supplied from the memory controller 2 to the memory device 1.

The write command set of the first type includes a write address input command WWh of a first type, address information ADD and a write start command AAh. Write data Din is transmitted between the address information ADD and the write start command AAh. The write command set of the first type instructs write of data to one cell unit CU, that is, write of data of a one-page size, i.e. data of a 16 kB size, to 16 kB memory cell transistors MT.

The write address input command WWh of the first type instructs write of data of a 16 kB size, and notifies that the address information ADD follows.

The address information ADD designates a cell unit CU that is a destination of data write. The address information ADD extends over, for example, five cycles. In a first cycle and a subsequent second cycle, column addresses C1 and C2 are transmitted. In the remaining third cycle, fourth cycle and fifth cycle, row addresses R1, R2 and R3 are transmitted. The row addresses include a plane address PLNA, a block address BA and a page address PGA. The page address includes a word line address and a string unit address.

The write data Din of a 16 kB size is transmitted over several-ten cycles.

The write start command AAh instructs execution of data write.

Upon receiving the write start command AAh, the memory device 1 executes write of 16 kB data to a designated cell unit CU. During the data write, the memory device 1 outputs a ready/busy signal RB of a low level indicative of "busy". The "busy" signal is output, for example, over a period TP1.

As described in the first embodiment, by the received row addresses, two half blocks HBLK having the designated block address BA are selected. Further, in the designated two half blocks HBLK, half cell-units HCU designated by the page address PGA are selected. Then, the write data Din is written over the designated two half cell-units HCU.

FIG. 35 illustrates an example of signals transmitted and received between the memory device 1 of the second embodiment and the memory controller 2. Specifically, FIG. 35 illustrates a write command set of a second type and a ready/busy signal. The write command set of the second type is supplied from the memory controller 2 to the memory device 1.

The write command set of the second type includes a write address input command XXh of a second type, address information ADD and a write start command AAh. Write data Din is transmitted between the address information ADD and the write start command AAh. The write command set of the second type instructs write of data to a half cell-unit HCU, that is, write of data of a half page size, i.e. data of an 8 kB size, to 8 kB memory cell transistors MT.

The write address input command XXh of the second type instructs write of data of an 8 kB size, and notifies that the address information ADD follows.

The address information ADD designates a half cell-unit HCU that is a destination of data write. The row addresses include a plane address PLNA, a block address BA, and a page address PGA. The row addresses further include a sub-plane address SPLNA. The sub-plane address SPLNA designates one of the sub-memory cell arrays SMCAu and SMCAd. The sub-plane address SPLNA has, for example, a length of one bit. The sub-plane address SPLNA designates the sub-memory cell array SMCAu by, for example, a value "0", and designates the sub-memory cell array SMCAd by, for example, a value "1".

As described above with reference to FIG. 18, the two sub-memory cell arrays SMCA in which the components of one plane PLN are formed have an identical plane address PLNA, a set of identical block addresses BA, and a set of identical page addresses PGA. Thus, the two half cell-units HCU in total of the two sub-memory cell arrays SMCA are designated by the plane address PLNA, block addresses BA and page addresses PGA in the address information ADD. However, the write command set of the second type includes the sub-plane address SPLNA, and the sub-plane address SPLNA designates the sub-memory cell array SMCA. Thus, by the sub-plane address SPLNA, only one half cell HCU of two half cell-units HCU in the sub-memory cell array SMCA, which is designated by the sub-plane address SPLNA, is designated.

The write data Din of an 8 kB size is transmitted over several-ten cycles.

Upon receiving the write start command AAh, the memory device 1 executes write of 8 kB data, i.e., data of a size smaller than that in the case where the write command set of the first type is received, to the designated half cell-unit HCU. During the data write, the memory device 1 outputs a ready/busy signal RB of a low level indicative of "busy". The "busy" signal is output, for example, over a period TP2. The period TP2 is shorter than the period TP1 of "busy" at a time when the write command set of the first type is received.

FIG. 36 illustrates an example of signals transmitted and received between the memory device 1 of the second embodiment and the memory controller 2. Specifically, FIG. 36 illustrates a read command set of a first type and a ready/busy signal. The read command set of the first type is supplied from the memory controller 2 to the memory device 1.

The read command set of the first type includes a read address input command YYh of a first type, address information ADD and a read start command BBh. The read command set of the first type instructs read of data from one cell unit CU, that is, read of data of a one-page size, i.e. data of a 16 kB size, from 16 kB memory cell transistors MT.

The read address input command YYh of the first type instructs read of data of a 16 kB size, and notifies that the address information ADD follows.

The address information ADD designates a cell unit CU that is a source of data read. The row addresses include a plane address PLNA, a block address BA and a page address PGA.

The read start command BBh instructs execution of data read.

Upon receiving the read start command BBh, the memory device 1 reads data of the 16 kB size from the designated cell unit CU. During the data read, the memory device 1 outputs a ready/busy signal RB of a low level indicative of "busy". The "busy" signal is output, for example, over a period TR1.

As described in the first embodiment, by the received row addresses, two half blocks HBLK having the designated block address BA are selected. Further, in the designated two half blocks HBLK, half cell-units HCU designated by the page address PGA are selected. Then, the data of a one-page size in total is read from the designated two half cell-units HCU.

Upon completion of data read, the memory controller 2 supplies a repeatedly asserted signal RE to the memory device 1. Based on the receipt of the signal RE, the memory device 1 outputs the read data Dout of the 16 kB size to the memory controller 2.

Figure 37:
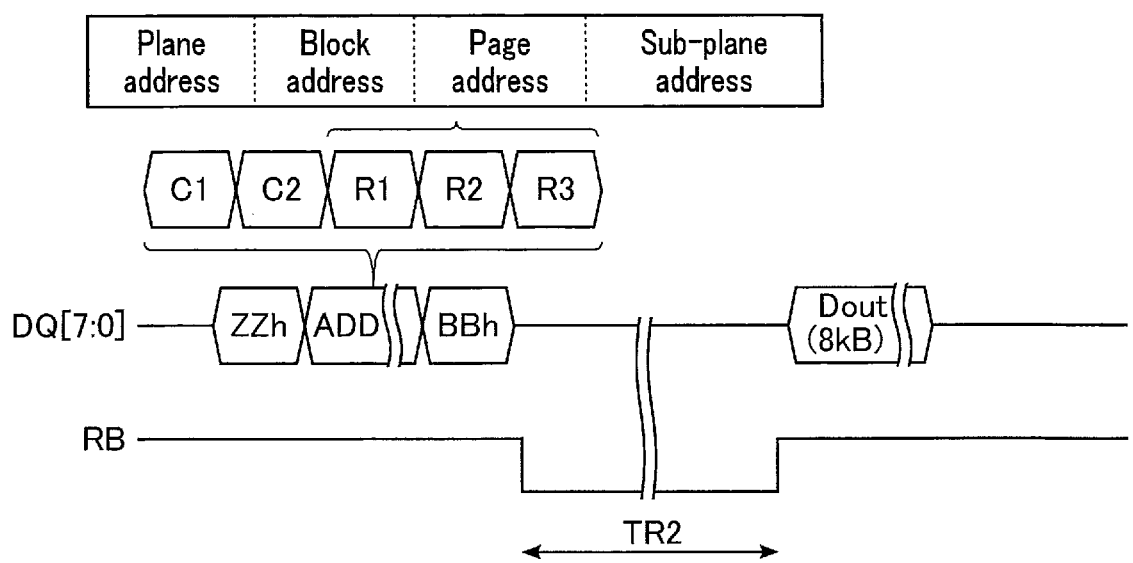

FIG. 37 illustrates an example of signals transmitted and received between the memory device 1 of the second embodiment and the memory controller 2. Specifically, FIG. 37 illustrates a read command set of a second type and a ready/busy signal. The read command set of the second type is supplied from the memory controller 2 to the memory device 1.

The read command set of the second type includes a read address input command ZZh of a second type, address information ADD and a read start command BBh. The read command set of the second type instructs read of data from a half cell-unit HCU, that is, read of data of a half page size, i.e. data of an 8 kB size, from 8 kB memory cell transistors MT.

The read address input command ZZh of the second type instructs read of data of the 8 kB size, and notifies that the address information ADD follows.

The address information ADD designates a half cell-unit HCU that is a source of data read. The row addresses include a plane address PLNA, a block address BA, and a page address PGA. The row addresses further include a sub-plane address SPLNA.

As described above with reference to FIG. 34, by the plane address PLNA, block address BA, page address PGA and sub-plane address SPLNA, only one half cell HCU of two half cell-units HCU in the sub-memory cell array SMCA, which is designated by the sub-plane address SPLNA, is designated.

Upon receiving the read start command BBh, the memory device 1 reads data of the 8 kB size from the designated half cell-unit HCU. During the data read, the memory device 1 outputs a ready/busy signal RB of a low level indicative of "busy". The "busy" signal is output, for example, over a period TR2. The period TR2 is shorter than the period TR1 of "busy" at a time when the read command set of the first type is received.

As described above with reference to FIG. 34, by the received row addresses, one half cell-unit HCU is selected. Then, data of a half page size, i.e., data of a size smaller than that in the case where the read command set of the first type is received, is read from the designated half cell-unit HCU.

Upon completion of data read, the memory controller 2 supplies a repeatedly asserted signal RE to the memory device 1. Based on the receipt of the signal RE, the memory device 1 outputs the read data Dout of the 8 kB size to the memory controller 2.

FIG. 38 illustrates an example of signals transmitted and received between the memory device 1 of the second embodiment and the memory controller 2. Specifically, FIG. 38 illustrates an erase command set of a first type and a ready/busy signal. The erase command set of the first type is supplied from the memory controller 2 to the memory device 1.

The erase command set of the first type includes an erase address input command UUh of a first type, address information ADD and an erase start command CCh. The erase command set of the first type instructs erase of data of one block BLK.

The erase address input command UUh of the first type instructs erase of data of one block BLK, and notifies that the address information ADD follows.

The address information ADD extends over, for example, three cycles. By the three cycles, row addresses R1, R2 and R3 are transmitted. The row addresses include a plane address PLNA and a block address BA.

The erase start command CCh instructs execution of data erase.

Upon receiving the erase start command CCh, the memory device 1 executes erase of data of the designated block BLK. During the data erase, the memory device 1 outputs a ready/busy signal RB of a low level indicative of "busy". The "busy" signal is output, for example, over a period TE1.

FIG. 39 illustrates an example of signals transmitted and received between the memory device 1 of the second embodiment and the memory controller 2. Specifically, FIG. 39 illustrates an erase command set of a second type and a ready/busy signal. The erase command set of the second type is supplied from the memory controller 2 to the memory device 1.

The erase command set of the second type includes an erase address input command VVh of a second type, address information ADD and an erase start command CCh. The erase command set of the second type instructs erase of data of a half block BLK.

The erase address input command VVh of the second type instructs erase of data of a half block HBLK, and notifies that the address information ADD follows.

The row addresses of the address information ADD include a plane address PLNA and a block address BA. The row addresses further include a sub-plane address SPLNA.

Upon receiving the erase start command CCh, the memory device 1 executes erase of data of the designated block BLK. During the data erase, the memory device 1 does not erase data of a half block HBLK that is not designated by the sub-plane address SPLNA in the block BLK designated by the plane address PLNA and the block address BA. During the data erase, the memory device 1 outputs a ready/busy signal RB of a low level indicative of "busy". The "busy" signal is output, for example, over a period TE2. The period TE2 is shorter than the period TE1 of "busy" at a time when the erase command set of the first type is received.

The state during the operation described with reference to FIG. 34, FIG. 36 and FIG. 38 is illustrated in FIG. 23. For example, when the block address BA designates the block BLK_1, the block decoder BDe_1 and block decoder BDo_1 are activated by the receipt of the block address BA, as illustrated in FIG. 23. By the activation, the block decoder BDe_1 asserts the block select signal BSSe_1, and the block decoder BDo_1 asserts the block select signal BSSo_1. The other block select signals BSS are negated. As a result, a transition occurs to the state in which the half block HBLKo_1 and half block HBLKe_1 are selected. In other words, the voltages of the interconnects SGD, CG and SGS are transferred to the half block HBLKo_1 and half block HBLKe_1.

FIG. 40 illustrates one state during the operation of a part of the memory device of the second embodiment. Specifically, FIG. 40 illustrates one state of the row decoder 11, which occurs in response to the receipt of the command instructing data write to the cell unit CU, data read from the cell unit CU, or erase of data in the block BLK. Specifically, FIG. 40 illustrates one state during the operation described with reference to FIG. 35, FIG. 37 and FIG. 39. Like FIG. 23, FIG. 40 illustrates an example in which the block address BA designates the block BLK_1. In addition, FIG. 40 illustrates an example in which the sub-plane address SPLNA designates the sub-memory cell array SMCAd.

As illustrated in FIG. 40, like FIG. 23, the block address BA_1 instructs activation of the block decoders BDe_1 and BDo_1. However, based on the fact that the sub-plane address SPLNA designates the sub-memory cell array SMCAd, the block decoder BDo_1 of the block decoders BDe_1 and BDo_1 is activated, and the block decoder BDe_1 is not activated. Thus, only the block decoder BDo_1 asserts the block select signal BSSo_1, and the other block select signals BSS are negated. As a result, a transition occurs to the state in which the half block HBLKo_1 is selected. Specifically, the voltages of the interconnects SGD, CG and SGS are transferred to the half block HBLKo_1.

On the other hand, with respect to the non-selected half block HBLKe_1, none of the transfer switches XS of the transfer switch set XSGe_1 is on. Thus, the word line WLs and the select gate lines SGDL and SGSL of the unselected half block HBLKe_1 are electrically floating.

In this state, the voltages of patterns based on data read, data write or data erase are applied to the interconnects SGD, CG and SGS, and thereby the data read, data write or data erase is executed. During the data read, for example, a read voltage Vvgr is applied to the interconnect CG that is coupled to the word line WL coupled to the half cell-unit HCU of the read target, and a read pass voltage Vread is applied to the other interconnects CG. The read voltage Vcgr has a variable positive magnitude corresponding to the memory cell transistor MT of the read target. The read pass voltage Vread has a positive magnitude that turns on the memory cell transistor MT, regardless of the data stored in the memory cell transistor MT, and is higher than the read voltage Vcgr.

During the data write, for example, a program voltage Vpgm is applied to the interconnect CG that is coupled to the word line WL coupled to the half cell-unit HCU of the write target, and a program pass voltage Vpass is applied to the other interconnects CC. The program voltage Vpgm has a positive magnitude capable of injecting electrons from the semiconductor 102 into the charge accumulation layer 104 of the memory cell transistor MT of the write target. The program pass voltage Vpass has a positive magnitude that suppresses data write to the memory cell transistor MT that receives this voltage, and is lower than the program voltage Vpgm.

During the data erase, for example, Vss (e.g. 0 V) is applied to the interconnect CG. In addition, an erase voltage Vera is applied to the bit line BL and source line SL. The erase voltage Vera has a positive magnitude that can draw electrons in the charge accumulation layer 104 of the memory cell transistor MT of the target of data erase into the semiconductor 102.

2.2. Advantages

The memory device 1 of the second embodiment supports the command sets of the two types. Specifically, the memory device 1 can recognize the command sets of the two types, and can execute the instructions by the command sets. The command set of the first type instructs the data write to the cell unit CU, the data read from the cell unit CU, or the data erase of one block BLK. The command set of the second type instructs the data write to the half cell-unit HCU, the data read from the half cell-unit HCU, or the data erase of the half block HBLK. Specifically, the half block HBLK is the target of the command set of the second type, whereas one block BLK is the target of the command set of the first type. The consumption current in the operation whose target is the half block HBLK is less than the consumption current in the operation whose target is one block BLK. Thus, the consumption current in the case of the operation whose target is only the half block HBLK is less than the consumption current in the case where the target of the operation in the memory device, which supports only the command set whose target is one block, is only the half block. The consumption current is, for example, an operation current ICC of the memory device 1.

In addition, according to the second embodiment, since the target of the operation can be designated in units of a half block HBLK, the management can be performed in units of a half block HBLK. In the case of the management in units of one block BLK, if a local defect occurs in one certain block BLK, the entirety of this block BLK needs to be replaced with a reserve block that is prepared in advance. Thus, even though the defect is a local one, the reserve block of the size of one block BLK is needed. This is inefficient because a normal part of a replaced block including a defect is not utilized and many reserve blocks are necessary.

According to the second embodiment, as described below, a range, which requires replacement as being unusable when a certain local defect occurs, is the half block HBLK including this defect. FIG. 41 illustrates an example of one state during the operation in the memory device 1 of the second embodiment. FIG. 41 illustrates an example in which the half block HBLKo_1 includes a defective part and is, in other words, a bad half block, and the half block HBLKo_1 is replaced with a certain reserved redundant half block HBLKo_R3 by a circuit that controls the replacement in the row decoder 11. In this state, like FIG. 23 of the first embodiment, it is assumed that the block BLK_1 is designated. In this case, the block decoder BDe_1 that controls the normal half block HBLKe_1 is activated by the designation of the block BLK_1. On the other hand, the block decoder BDo_1 that controls the defective half block HBLKo_1 is not activated. Instead, a block decoder BDo_R3 that controls a half block HBLKo_R3 is activated by the designation of the block BLK_1. As a result, a block select signal BSSo_R3 is asserted, and the transfer switches XSD, XSW and XSS in a transfer switch set XSGo_R3 are turned on. Thus, a transition occurs to the state in which the half block HBLKo_R3 is selected. The unit that needs to be replaced is limited to the half block HBLK. Therefore, the replacement can efficiently be performed. In other words, the area that is no longer used by the replacement can be small, and a larger auxiliary area can be prepared.

3. Third Embodiment

The third embodiment differs from the first embodiment with respect to the details of the row decoder.

FIG. 42 illustrates components of the row decoder of the memory device 1 of the third embodiment, and a coupling of the components. FIG. 42 illustrates two sub-plane areas SPNAu and SPNAd in which the components of one plane PLN are formed.

As illustrated in FIG. 42, the third embodiment differs from the first embodiment with respect to the components included in the sub-plane area SPNAd included in each of the row decoder areas RDAl and RDAr.

A part of the row decoder area RDAl which is included in the sub-plane area SPNAd includes n/2 block decoders BDo. The n/2 block decoders BDo are block decoders BDo_1, BDo_3, BDo_5, ... , BDo_n−1 for odd-numbered block addresses, i.e. block addresses BA_1, BA_3, BA_5, ... , BA_n−1.

A part of the row decoder area RDAl which is included in the sub-plane area SPNAd includes n/2 transfer switch sets XSGo. The n/2 transfer switch sets XSGo are transfer switch sets XSGo_1, XSGo_3, XSGo_5, ... , XSGo_n−1 for odd-numbered block addresses BA, i.e. block addresses BA_1, BA_3, BA_5, ... , BA_n−1.

A part of the row decoder area RDAr which is included in the sub-plane area SPNAd includes n/2 block decoders BDo. The n/2 block decoders BDo are block decoders BDo_0, BDo_2, BDo_4, ... , BDo_n−2 for even-numbered block addresses, i.e. block addresses BA_0, BA_2, BA_4, ... , BA_n−2.

A part of the row decoder area RDAr which is included in the sub-plane area SPNAd includes n/2 transfer switch sets XSGo. The n/2 transfer switch sets XSGo are transfer switch sets XSGo_0, XSGo_2, XSGo_4, ... , XSGo_n−2 for even-numbered block addresses BA, i.e. block addresses BA_0, BA_2, BA_4, ... , BA_n−2.

By the above arrangement, each transfer switch set XSGe and each block decoder BDe for one of the two half blocks HBLKe and HBLKo constituting each block BLK are arranged in one of the row decoder areas RDAl and RDAr, and each transfer switch set XSGo and each block decoder BDo for the other of the two half blocks HBLKe and HBLKo are arranged in the other of the row decoder areas RDAl and RDAr.

Specifically, in regard to each block BLK, the set of the block decoder BDe and transfer switch set XSGe for the block BLK and the set of the block decoder BDo and transfer switch set XSGo for the block BLK are located in mutually different ones of the row decoder areas RDAl and RDAr. On the other hand, in the first embodiment (see FIG. 22), in regard to each block BLK, the set of the block decoder BDe and transfer switch set XSGe for the block BLK and the set of the block decoder BDo and transfer switch set XSGo for the block BLK are located in an identical one of the row decoder areas RDAl and RDAr.

FIG. 43 illustrates components of a driver of the third embodiment, and a coupling of the components. FIG. 43 also illustrates the components of the row decoder illustrated in FIG. 42.

Hereinafter, in some cases, the interconnects CG, SGD and SGS which are coupled to the transfer switch sets XSGo_1, XSGo_3, XSGo_5, ... , XSGo_n−1 are referred to as "interconnects CGl, SGDl and SGSl", respectively. In some cases, the interconnects CG, SGD and SGS which are coupled to the transfer switch sets XSGo_0, XSGo_2, XSGo_4, ... , XSGo_n−2 are referred to as "interconnects CGlr, SGDr and SGSr", respectively.

As illustrated in FIG. 43, the voltage generator 14 outputs voltages on a plurality of interconnects INT. FIG. 43 and the following Figures illustrate an example of five interconnects INT.

The driver 15 includes CG line decode circuits 151l and 151r. The CG line decode circuits 151l and 151r are circuits that decode the address information ADD and output voltages based on the decoded result among the voltages from the voltage generator 14. The CG line decode circuits 151l and 151r include the same components and have the same coupling of the components. Specifically, voltages of common patterns need to be applied to the set of the interconnects CGl, SGDl and SGSl and the set of the interconnects CGr, SGDr and SGSr. For this purpose, the identical CG line decode circuits 151l and 151r are provided.

The CG line decode circuit 151l is coupled to the interconnects INT, and receives voltages from the voltage generator 14 via the interconnects INT. Based on the decoded result, the CG line decode circuit 151l applies the voltages from the voltage generator 14 to the set of the interconnects CGl, SGDl and SGSl.

The set of the interconnects CGl, SGDl and SGSl and the set of the interconnects CGr, SGDr and SGSr receive the voltages of substantially the same (identical) pattern.

The CG line decode circuit 151r is coupled to the interconnects INT, and receives voltages from the voltage generator 14 via the interconnects INT. Based on the decoded result, the CG line decode circuit 151r applies the voltages from the voltage generator 14 to the set of the interconnects CGr, SGDr and SGSr.

FIG. 44 illustrates one state during an operation in the memory device of the third embodiment. FIG. 44 illustrates two sub-plane areas SPNA in which the components of one plane PLN are formed. FIG. 44 illustrates a state in which one block BLK is selected. FIG. 44 illustrates a state in which a block address BA_1 is designated.

As illustrated in FIG. 44, by the receipt of the block address BA_1, the block decoders BDe_1 and BDo_1 are activated. As described above with reference to FIG. 42, the transfer switch set XSGe and block decoder BDe for one of the two half blocks HBLKe and HBLKo constituting each block BLK are arranged in one of the row decoder areas RDAl and RDAr, and the transfer switch set XSGo and block decoder BDo for the other of the two half blocks HBLKe and HBLKo are arranged in the other of the row decoder areas RDAl and RDAr. Thus, by the selection of one block BLK, in each of the row decoder areas RDAl and RDAr, the transfer switch set XSG and block decoder BD are activated.

By the activation, the block decoder BDe_1 asserts a block select signal BSSe_1, and the block decoder BDo_1 asserts a block select signal BSSo_1. The other block select signals BSS are negated. As a result, a transition occurs to the state in which half blocks HBLKe_1 and HBLKo_1 are selected. In other words, a transition occurs to the state in which voltages of the interconnects CGr, SGDr and SGSr are transferred to the half block HBLKe_1, and voltages of the interconnects CGl, SGDl and SGSl are transferred to the half block HBLKo_1.

The transfer switch set XSGe receives voltages from the interconnects CGr, SGDr and SGSr, and the transfer switch set XSGo receives voltages from the interconnects CGl, SGDl and SGSl. Thus, in order to apply voltages to the interconnects CGl, SGDl, SGSl, CGr, SGDr and SGSr, both of the CG line decode circuits 151*l* and 151*r* are activated.

By the above operation, the voltages of substantially the same pattern are transferred to both of the half blocks HBLKe_1 and HBLKo_1.

According to the third embodiment, the transfer switch set XSGe and block decoder BDe for one of the two half blocks HBLKe and HBLKo constituting each block BLK are arranged in one of the row decoder areas RDAl and RDAr, and the transfer switch set XSGo and block decoder BDo for the other of the two half blocks HBLKe and HBLKo are arranged in the other of the row decoder areas RDAl and RDAr. Thereby, in order to select one certain block BLK, the transfer of voltages to the two half blocks HBLK constituting the selected block BLK can be executed from different sets of the interconnects CG, SGD and SGS. Thus, only the electric current necessary for charging the word lines WL of the half block HBLK and the select gate lines SGDL and SGSL flows in each of the set of the interconnects CGl, SGDl and SGSl and the set of the interconnects CGr, SGDr and SGSr. The magnitude of this current is less than the magnitude of the current that flows in the interconnects CG, SGD and SGS when the CG line decode circuit 151*l* or 151*r* charges the word lines WL of one block BLK and the select gate lines SGDL and SGSL. Accordingly, the voltage drop occurring in the set of the interconnects CGl, SGDl and SGSl and the voltage drop occurring in the set of the interconnects CGr, SGDr and SGSr are less than the voltage drop occurring in the interconnects CG, SGD and SGS when the CG line decode circuit 151*l* or 151*r* charges the word lines WL of one block BLK and the select gate lines SGDL and SGSL. Therefore, the time necessary for charging the word lines WL of one block BLK and the select gate lines SGDL and SGSL via the two sets of interconnects CG, SGD and SGS by the third embodiment is shorter than the time necessary for charging the word lines WL of one block BLK and the select gate lines SGDL and SGSL via only one set of interconnects CG, SGD and SGS.

4. Fourth Embodiment

A fourth embodiment differs from the third embodiment with respect to the components of the driver 15.

FIG. 45 illustrates components of a driver of the fourth embodiment, and a coupling of the components. FIG. 45 also illustrates the components of the row decoder illustrated in FIG. 42 of the third embodiment.

The driver 15 includes a CG line decode circuit 152. The CG line decode circuit 152 is the same as the CG line decode circuits 151*l* and 151*r* of the third embodiment. The CG line decode circuit 152 is coupled to a plurality of interconnects INT, and receives voltages from the voltage generator 14 via the interconnects INT. The CG line decode circuit 152 is coupled to both of the set of the interconnects CGl, SGDl and SGSl and the set of the interconnects CGr, SGDr and SGSr. Based on the decoded result, the CG line decode circuit 152 applies the voltages from the voltage generator 14 to both of the set of the interconnects CGl, SGDl and SGSl and the set of the interconnects CGr, SGDr and SGSr.

According to the fourth embodiment, like the third embodiment, only the electric current necessary for charging the word lines WL of the half block HBLK and the select gate lines SGDL and SGSL flows in each of the set of the interconnects CGl, SGDl and SGSl and the set of the interconnects CGr, SGDr and SGSr. Therefore, the same advantages as in the third embodiment can be obtained.

5. Fifth Embodiment

A fifth embodiment differs from the first embodiment with respect to the layout of components in each plane area PNA.

Each of FIGS. 46 and 47 illustrates a layout of a part of, and some components of, a memory device of the fifth embodiment. Each of FIGS. 46 and 47 illustrates one plane area PNA. The four plane areas PNA have the same configuration. FIG. 46 and FIG. 47 illustrate areas of different coordinates on the z axis. FIG. 46 illustrates the same area as the area illustrated in FIG. 6 of the first embodiment with respect to the position on the z axis. FIG. 47 illustrates the same area as the area illustrated in FIG. 7 of the first embodiment with respect to the position on the z axis.

As illustrated in FIG. 46, row decoder areas RDAl and RDAr are located at the center of the plane area PNA. The row decoder areas RDAl and RDAr are arranged along the x axis and neighbor each other.

One sense amplifier area SAA in the sub-plane area SPNAu is located on the left side of the row decoder area RDAl. The other sense amplifier area SAA in the sub-plane area SPNAu is located on the right side of the row decoder area RDAr.

One sense amplifier area SAA in the sub-plane area SPNAd is located on the left side of the row decoder area RDAl. The other sense amplifier area SAA in the sub-plane area SPNAd is located on the right side of the row decoder area RDAr.

As illustrated in FIG. 47, each sub-plane area SPNA includes two sub-memory cell arrays SMCA, and includes the two sub-memory cell arrays SMCA corresponding to such a shape that the sub-memory cell array SMCA of the first embodiment is divided. To be more specific, the sub-plane area SPNAu includes sub-memory cell arrays SMCAul and SMCAur. The sub-memory cell array SMCAul is located in a left-end area of the sub-plane area SPNAu. The sub-memory cell array SMCAur is located in a right-end area of the sub-plane area SPNAu. The components included in the sub-memory cell array SMCAu of the first embodiment are provided over the set of the sub-memory cell arrays SMCAul and SMCAur.

The sub-plane area SPNAd includes sub-memory cell arrays SMCAdl and SMCAdr. The sub-memory cell array SMCAdl is located in a left-end area of the sub-plane area SPNAd. The sub-memory cell array SMCAdr is located in a right-end area of the sub-plane area SPNAd. The components included in the sub-memory cell array SMCAd of the first embodiment are provided over the set of the sub-memory cell arrays SMCAdl and SMCAdr.

The word line hookup areas WHUAl and WHUAr extend over an area between the sub-memory cell arrays SMCAul and SMCAur and an area between the sub-memory cell arrays SMCAdl and SMCAdr.

A boundary between the sub-memory cell array SMCAur of a certain sub-plane area SPNA and the sub-memory cell array SMCAul of a neighboring plane area PNA may be partitioned by an insulator such as an oxide extending along the yz plane. Alternatively, a boundary between the sub-memory cell array SMCAur of a certain plane area PNA and the sub-memory cell array SMCAul of a neighboring plane area PNA may be partitioned by a layer stack which extends along the yz plane and in which silicon oxide layers and silicon nitride layers are alternately arranged one by one.

Similarly, a boundary between the sub-memory cell array SMCAdr of a certain plane area PNA and the sub-memory cell array SMCAdl of a neighboring plane area PNA may be partitioned by an insulator such as an oxide extending along the yz plane. Alternatively, a boundary between the sub-memory cell array SMCAdr of a certain plane area PNA and the sub-memory cell array SMCAdl of a neighboring plane area PNA may be partitioned by a layer stack which extends along the yz plane and in which silicon oxide layers and silicon nitride layers are alternately arranged one by one.

FIG. 48 illustrates a cross-sectional structure of a part of the memory device 1 of the fifth embodiment. Specifically, FIG. 48 illustrates a cross section along an xz plane of the structure illustrated in FIG. 47.

The structure of FIG. 48 is similar to the structure of FIG. 27. As illustrated in FIG. 48, in the sub-plane area SPNA, two stacked structures 39 are provided. In each stacked structure 39, memory pillars MP are provided. A part including a right end of the left-side stacked structure 39 is included in the word line hookup area WHUAl. Each conductor 44 of the left-side stacked structure 39 includes, in the word line hookup area WHUAl, a terrace portion, i.e. a portion that does not overlap another conductor 44. Each conductor 44 is in contact with the contact plug 67 in the terrace portion.

A part including a left end of the right-side stacked structure 39 is included in the word line hookup area WHUAr. Each conductor 44 of the right-side stacked structure 39 includes, in the word line hookup area WHUAr, a terrace portion, i.e. a portion that does not overlap another conductor 44. Each conductor 44 is in contact with the contact plug 67 in the terrace portion.

FIG. 49 illustrates an example of components in a memory cell array of the fifth embodiment, and allocation of addresses to the components. FIG. 49 illustrates one plane PLN. In the fifth embodiment, each half block HBLK is dividedly provided on both sides of the two row decoder areas RDAl and RDAr that are interposed. Specifically, as illustrated in FIG. 49, the sub-memory cell array SMCA is composed of quarter blocks QBLK. To be more specific, the sub-memory cell array SMCAul is composed of quarter blocks QBLKel. The sub-memory cell array SMCAur is composed of quarter blocks QBLKer. The sub-memory cell array SMCAdl is composed of quarter blocks QBLKol. The sub-memory cell array SMCAdr is composed of quarter blocks QBLKor. The quarter block QBLK is composed of a quarter of the block BLK, and is composed of a half of the half block HBLK.

The quarter blocks QBLKel and QBLKer constitute the half block HBLKe. The quarter blocks QBLKol and QBLKor constitute the half block HBLKo.

Each quarter block QBLK is composed of a plurality of quarter cell-units QCU. The quarter cell-unit QCU is composed of memory cell transistors MT, the number of which is a quarter of the number of memory cell transistors MT that constitute the cell unit CU. Thus, when each memory cell transistor MT stores data of one bit, the quarter cell-unit QCU stores data of a quarter of one page, i.e. data of a quarter page. Similarly, when each memory cell transistor MT stores data of p bits, the quarter cell-unit QCU stores data of p quarter pages.

A set of common page addresses is allocated to the set of quarter cell-units QCU of four quarter blocks QBLK. In other words, page addresses PGA0 to PGAt are allocated to each of the quarter blocks QBLK.

In each sub-memory cell array SMCA, m/4 bit lines BL are located. The bit lines BL extend over the quarter blocks QBLK in each sub-memory cell array SMCA. Based on the example in which m is 16 kB, in each quarter block QBLK, m/4 memory cell transistors MT, for example, 4 kB memory cell transistors MT, are arranged along the direction in which the bit lines BL are arranged. The memory cell transistors MT of the quarter block QBLKel are coupled to, for example, bit lines BL_0 to BL_m/4−1. The memory cell transistors MT of the quarter block QBLKer are coupled to, for example, bit lines BL_m/4 to BL_m/2−1. The memory cell transistors MT of the quarter block QBLKol are coupled to, for example, bit lines BL_m/2 to BL_3m/4−1. The memory cell transistors MT of the quarter block QBLKor are coupled to, for example, bit lines BL_3m/4 to BL_m−1.

The selection of the quarter cell-unit QCU, which is based on certain address information ADD, is the same as in the first embodiment. Specifically, the fifth embodiment differs from the first embodiment in that the half block HBLK of the first embodiment is arranged over two independent areas. This difference is the difference in arrangement and layout of components, and the first embodiment and the fifth embodiment are the same with respect to the coupling of components, i.e. with respect to circuitry. Accordingly, the state in the first embodiment, in which a certain half cell-unit HCU is selected, corresponds to the state in the fifth embodiment, in which two quarter cell-units QCU corresponding to the half cell-unit HCU are selected. Therefore, in the fifth embodiment, the quarter cell-unit QCU of each of the four sub-memory cell arrays SMCA can be selected by the designation of one plane address PLNA, one block address BA and one page address PGA.

FIG. 50 illustrates components of a row decoder of the memory device of the fifth embodiment, and a coupling of the components. FIG. 50 illustrates two sub-plane areas SPNAu and SPNAd in which the components of one plane PLN are formed.

The components included in the row decoder areas RDAl and RDAr are the same as in the first embodiment.

As illustrated in FIG. 50, each transfer switch set XSG is coupled to two quarter blocks QBLK, and a pattern of voltages of interconnects CG, SGD and SGS is transferred to both of the two coupled quarter blocks QBLK. Specifically, in all cases where α is 0 to n−1, each transfer switch set XSGe_α transfers voltages to one quarter block QBLKel_α and one quarter block QBLKer_α. In all cases where α is 0 to n−1, each transfer switch set XSGo_α transfers voltages to one quarter block QBLKol_α and one quarter block QBLKor_α.

FIG. 51 illustrates an example of signals transmitted and received between the memory device 1 of the fifth embodiment and the memory controller 2. Specifically, FIG. 51 illustrates a write command set of a third type and a ready/busy signal. The write command set of the third type is supplied from the memory controller 2 to the memory device 1.

The write command set of the third type includes a write address input command SSh of a third type, address information ADD and a write start command AAh. Write data Din is transmitted between the address information ADD and the write start command AAh. The write command set of the third type instructs write of data to the quarter cell-unit QCU, that is, write of data of a quarter page size, i.e. data of a 4 kB size, to 4 kB memory cell transistors MT.

The write address input command SSh of the third type instructs write of data of a 4 kB size, and notifies that the address information ADD follows.

The address information ADD designates a quarter cell-unit QCU that is a destination of data write. The row addresses include a plane address PLNA, a block address BA, a page address PGA and a sub-plane address SPLNA. The sub-plane address SPLNA designates one of the sub-memory cell arrays SMCAul, SMCAur, SMCAdl and SMCAdr. The sub-plane address SPLNA has, for example, a length of two bits. The sub-plane address SPLNA, for example, designates the sub-memory cell array SMCAul by a value "00", designates the sub-memory cell array SMCAur by a value "01", designates the sub-memory cell array SMCAdl by a value "10", and designates the sub-memory cell array SMCAdr by a value "11".

As described above with reference to FIG. 18, the two sub-memory cell arrays SMCA, in which the components of one plane PLN are formed, have an identical plane address PLNA, a set of identical block addresses BA, and a set of identical page addresses PGA. Thus, the four quarter cell-units QCU in total of the four sub-memory cell arrays SMCA are designated by the plane address PLNA, block addresses BA and page addresses PGA in the address information ADD. However, the write command set of the third type includes the sub-plane address SPLNA, and the sub-plane address SPLNA designates the sub-memory cell array SMCA. Thus, by the sub-plane address SPLNA, only one quarter cell-unit QCU of four quarter cell-units QCU in the sub-memory cell array SMCA which is designated by the sub-plane address SPLNA is designated.

The write data Din of a 4 kB size is transmitted over several-ten cycles.

Upon receiving the write start command AAh, the memory device 1 executes write of 4 kB data, i.e., data of a size smaller than that in the case where the write command set of the second type is received, to the designated quarter cell-unit QCU. During the data write, the memory device 1 outputs a ready/busy signal RB of a low level indicative of "busy". The "busy" signal is output, for example, over a period TP3. The period TP3 is shorter than the period TP2 of "busy" at a time when the write command set of the second type is received. The difference between the period TP3 and period TP2 is less than the difference between the period TP2 and the "busy" period TP1 at the time when the write command set of the first type is received.

FIG. 52 illustrates an example of signals transmitted and received between the memory device 1 of the fifth embodiment and the memory controller 2. Specifically, FIG. 52 illustrates a read command set of a third type and a ready/busy signal. The read command set of the third type is supplied from the memory controller 2 to the memory device 1.

The read command set of the third type includes a read address input command TTh of a third type, address information ADD and a read start command BBh. The read command set of the first type instructs read of data from a quarter cell-unit QCU, that is, read of data of a quarter page size, i.e. data of a 4 kB size, from 4 kB memory cell transistors MT.

The read address input command TTh of the third type instructs read of data of a 4 kB size, and notifies that the address information ADD follows.

The address information ADD designates a quarter cell-unit QCU that is a source of data read. The row addresses include a plane address PLNA, a block address BA and a page address PGA. The row addresses further include a sub-plane address SPLNA.

By the plane address PLNA, block address BA, page address PGA and sub-plane address SPLNA, only one quarter cell-unit QCU of four quarter cell-units QCU in the sub-memory cell array SMCA, which is designated by the sub-plane address SPLNA, is designated.

Upon receiving the read start command BBh, the memory device 1 reads data of the 4 kB size from the designated quarter cell-unit QCU. During the data read, the memory device 1 outputs a ready/busy signal RB of a low level indicative of "busy". The "busy" signal is output, for example, during a period TR2. The period TR3 is shorter than the period TR2 of "busy" at a time when the read command set of the second type is received. The difference between the period TR3 and period TR2 is less than the difference between the period TR2 and the "busy" period TR1 at the time when the read command set of the first type is received.

By the received row addresses, one quarter cell-unit QCU is selected. Then, the data of a quarter page size, i.e., data of a size smaller than that in the case where the read command set of the second type is received, is read from the designated quarter cell-unit QCU.

Upon completion of data read, the memory controller 2 supplies a repeatedly asserted signal RE to the memory device 1. Based on the receipt of the signal RE, the memory device 1 outputs the read data Dout of the 4 kB size to the memory controller 2.

FIG. 53 illustrates one state during an operation in the memory device of the fifth embodiment. FIG. 53 illustrates two sub-plane areas SPNA in which the components of one plane PLN are formed. FIG. 53 illustrates a state in which one block BLK is selected. FIG. 53 illustrates a state in which a block address BA_1 is designated.

As illustrated in FIG. 53, by the receipt of the block address BA_1, the block decoders BDe_1 and BDo_1 are activated. Like the third embodiment, each transfer switch set XSGe and each block decoder BDe for one of the two half blocks HBLKe and HBLKo constituting each block BLK are arranged in one of the row decoder areas RDAl and RDAr, and each transfer switch set XSGo and each block decoder BDo for the other of the two half blocks HBLKe and HBLKo are arranged in the other of the row decoder areas RDAl and RDAr. Thus, by the selection of one block BLK, in each of the row decoder areas RDAl and RDAr, the set of the transfer switch set XSG and block decoder BD is activated.

By the activation, the block decoder BDe_1 asserts a block select signal BSSe_1, and the block decoder BDo_1 asserts a block select signal BSSo_1. The other block select signals BSS are negated. As a result, a transition occurs to the state in which quarter blocks QBLKel_1, QBLKer_1, QBLKol_1, and QBLKor_1 are selected. In other words, a transition occurs to the state in which voltages of the interconnects CGl, SGDl and SGSl are transferred to the quarter blocks QBLKol_1 and QBLKor_1, and voltages of the interconnects CGr, SGDr and SGSr are transferred to the quarter blocks QBLKel_1 and QBLKer_1. Thus, the voltages of substantially the same pattern are transferred to all of the quarter blocks QBLKel_1, QBLKer_1, QBLKol_1 and QBLKor_1.

According to the fifth embodiment, based on the fact that the row decoder areas RDAl and RDAr are located at the center of the plane area PNA, the sub-memory cell array SMCA is constituted by independent parts located on both sides of the row decoder areas RDAl and RDAr. However, each transfer switch set XSG is coupled to both of the two quarter blocks QBLK, and the pattern of voltages of the interconnects CG, SGD and SGS can be transferred to both of the two coupled quarter blocks QBLK. Thus, by selecting one block BLK, the voltages of substantially the same pattern can be transferred to all of the four quarter blocks QBLK. Therefore, even when the row decoder areas RDAl and RDAr are located at the center of the plane area PNA, the same advantages as in the first embodiment can be obtained.

6. Modifications and Others

The above description relates to the example in which the memory cell transistor MT stores one-bit data, and thus one page address PGA is allocated to one cell unit. The case in which a plurality of page addresses are allocated to one cell unit CU is the same as the case in which one page address is allocated to one cell unit CU. Specifically, it is assumed that, like FIG. 19, the block address BA_0 is designated, and furthermore a page address PGA_1 is designated. By this designation, the half cell-unit HCU coupled to the word line WL of the same word line address WLA is selected in both of the half blocks HBLKe_1 and HBLKo_1. In addition, one page based on the page address PGA_1, among pages provided by the selected half-sell unit HCU, is designated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a first conductor extending along a first axis and a second axis;
a first memory pillar provided in an inside of the first conductor and including a first semiconductor and a charge accumulation layer around the first semiconductor;
a second conductor extending along the second axis and being in contact with the first memory pillar;
a third conductor extending along the first axis and the second axis and being arranged with a distance from the first conductor along the second axis;
a second memory pillar provided in an inside of the third conductor and including a second semiconductor and a charge accumulation layer around the second semiconductor;
a fourth conductor extending along the second axis and being in contact with the second memory pillar;
a fifth conductor extending along the second axis and coupled to the first memory pillar and the second memory pillar,
a first pad; and
a first transistor coupled to the fifth conductor, wherein the second conductor is coupled to a first sense amplifier circuit,
the fourth conductor is coupled to a second sense amplifier circuit, and
the first pad, the third conductor, the first conductor and the first transistor are arranged in a named order along the second axis.

2. The memory device of claim 1, further comprising a third semiconductor that
is in contact with the first semiconductor and the second semiconductor,
is in contact with the fifth conductor, and
includes impurities.

3. The memory device of claim 1, wherein the first sense amplifier circuit and the second sense amplifier circuit are located below the first conductor and the third conductor along a third axis crossing the first axis and the second axis.

4. A memory device comprising:
a first conductor extending along a first axis and a second axis;
a first memory pillar provided in an inside of the first conductor and including a first semiconductor and a charge accumulation layer around the first semiconductor;
a second conductor extending along the second axis and being in contact with the first memory pillar;
a third conductor extending along the first axis and the second axis and being arranged with a distance from the first conductor along the second axis;
a second memory pillar provided in an inside of the third conductor and including a second semiconductor and a charge accumulation layer around the second semiconductor;
a fourth conductor extending along the second axis and being in contact with the second memory pillar;
a fifth conductor extending along the second axis and coupled to the first memory pillar and the second memory pillar,
a substrate;
a second transistor on the substrate;
a sixth conductor coupled to the second transistor and having an inverse taper shape; and
a seventh conductor provided on the sixth conductor and having a taper shape, wherein
the second conductor is coupled to a first sense amplifier circuit, and
the fourth conductor is coupled to a second sense amplifier circuit.

5. The memory device of claim 1, further comprising:
a substrate;
a second transistor provided on the substrate and located between the substrate and the first conductor;

an eighth conductor located above the first memory pillar along a third axis and coupled to the first memory pillar, the third axis crossing the first axis and the second axis; and a ninth conductor extending along the third axis coupled to the second transistor and the eighth conductor.

6. A memory device comprising:
a first conductor extending along a first axis and a second axis;
a first memory pillar provided in an inside of the first conductor and including a first semiconductor and a charge accumulation layer around the first semiconductor;
a second conductor extending along the second axis and being in contact with the first memory pillar;
a third conductor extending along the first axis and the second axis and being arranged with a distance from the first conductor along the second axis;
a second memory pillar provided in an inside of the third conductor and including a second semiconductor and a charge accumulation layer around the second semiconductor;
a fourth conductor extending along the second axis and being in contact with the second memory pillar;
a fifth conductor extending along the second axis and coupled to the first memory pillar and the second memory pillar;
a tenth conductor extending along the second axis and including a portion exposed to an outside from the memory device, the tenth conductor and the fifth conductor being arranged along the first axis; and
a first insulator located between the first conductor and the third conductor above a region where the second conductor and the fourth conductor are opposed to each other.

7. The memory device of claim 1, further comprising:
an eleventh conductor extending along the first axis and the second axis, the eleventh conductor and the first conductor being arranged along the first axis and;
a third memory pillar provided in an inside of the eleventh conductor and including a third semiconductor and a charge accumulation layer around the third semiconductor, the third memory pillar being coupled to the fifth conductor;
a twelfth conductor located above the first conductor along a third axis crossing the first axis and the second axis, and coupled to the first conductor, the twelfth conductor extending along the third axis; and
a thirteenth conductor located above the eleventh conductor along the third axis, and coupled to the eleventh conductor, the thirteenth conductor extending along the third axis.

8. The memory device of claim 7, further comprising:
a first switch including a first end coupled to the first conductor and a second end coupled to a first interconnect;
a first decoder coupled to a control terminal of the first switch via a second interconnect;
a second switch including a third end coupled to the third conductor and a fourth end coupled to the first interconnect; and
a second decoder coupled to a control terminal of the second switch via a third interconnect, wherein
a first voltage is applied to the third conductor while a signal on the second interconnect is negated and a signal on the third interconnect is asserted.

9. The memory device of claim 1, further comprising a first insulator located between the first conductor and the third conductor above a region where the second conductor and the fourth conductor are opposed to each other.

10. The memory device of claim 9, further comprising a fourth semiconductor coupled to the first memory pillar and the second memory pillar and including impurities, wherein the first insulator is partly located in the fourth semiconductor.

11. The memory device of claim 1, further comprising:
a first switch including a first end coupled to the first conductor and a second end coupled to a first interconnect;
a first decoder coupled to a control terminal of the first switch via a second interconnect;
a second switch including a third end coupled to the third conductor and a fourth end coupled to the first interconnect; and
a second decoder coupled to a control terminal of the second switch via a third interconnect.

12. The memory device of claim 11, wherein a signal on the third interconnect is asserted while a signal on the second interconnect is asserted.

13. The memory device of claim 11, wherein
based on receipt of a first command, a signal on the third interconnect is asserted while a signal on the second interconnect is asserted, and
based on receipt of a second command, the signal on the third interconnect is asserted over a period over which the signal on the second interconnect is negated.

14. The memory device of claim 11, further comprising:
a thirteenth conductor extending along the first axis and the second axis;
a fourth memory pillar provided in an inside of the thirteenth conductor and including a fourth semiconductor and a charge accumulation layer around the fourth semiconductor;
a third switch including a fifth end coupled to the thirteenth conductor and a sixth end coupled to the first interconnect; and
a third decoder coupled to a control terminal of the third switch via a fourth interconnect, wherein
based on receipt of a first command instructing assertion of a signal on the second interconnect and a signal on the third interconnect, the signal on the second interconnect and a signal on the fourth interconnect are asserted.

15. The memory device of claim 1, further comprising:
a first switch including a first end coupled to the first conductor and a second end coupled to a fourth decoder; and
a second switch including a third end coupled to the third conductor and a fourth end coupled to a fifth decoder.

16. The memory device of claim 1, further comprising:
a first switch including a first end coupled to the first conductor and a second end coupled to a sixth decoder; and
a second switch including a third end coupled to the third conductor and a fourth end coupled to the sixth decoder.

17. The memory device of claim 1, further comprising a controller configured to read, when a third command is received by the memory device, data based on a charge in the charge accumulation layer of the first memory pillar, without reading data based on a charge in the charge accumulation layer of the second memory pillar.

18. The memory device of claim 1, further comprising a controller configured to erase, when a fourth command is received by the memory device, data based on a charge in the charge accumulation layer of the first memory pillar without erasing data based on a charge in the charge accumulation layer of the second memory pillar.

* * * * *